(12) United States Patent
Zhao et al.

(10) Patent No.: US 11,624,126 B2
(45) Date of Patent: Apr. 11, 2023

(54) DEPOSITION OF SINGLE PHASE BETA-(ALXGA1-X)2O3 THIN FILMS WITH 0.28< =X<=0.7 ON BETA GA2O3(100) OR (−201) SUBSTRATES BY CHEMICAL VAPOR DEPOSITION

(71) Applicant: Ohio State Innovation Foundation, Columbus, OH (US)

(72) Inventors: Hongping Zhao, Columbus, OH (US); A F M Anhar Uddin Bhuiyan, Columbus, OH (US); Zixuan Feng, Columbus, OH (US)

(73) Assignee: Ohio State Innovation Foundation, Columbus, OH (US)

( * ) Notice: Subject to any disclaimer, the term of this patent is extended or adjusted under 35 U.S.C. 154(b) by 0 days.

(21) Appl. No.: 17/231,382

(22) Filed: Apr. 15, 2021

(65) Prior Publication Data

US 2021/0388526 A1  Dec. 16, 2021

Related U.S. Application Data

(60) Provisional application No. 63/039,830, filed on Jun. 16, 2020.

(51) Int. Cl.
 *C30B 25/18* (2006.01)
 *C30B 29/22* (2006.01)
 (Continued)

(52) U.S. Cl.
 CPC ............ *C30B 29/22* (2013.01); *C30B 25/165* (2013.01); *C30B 25/183* (2013.01);
 (Continued)

(58) Field of Classification Search
 CPC ......... C30B 25/00; C30B 25/02; C30B 25/16; C30B 25/165; C30B 25/18; C30B 25/183;
 (Continued)

(56) References Cited

U.S. PATENT DOCUMENTS 5,256,897 A   10/1993   Hasegawa et al.
6,993,055 B2   1/2006   Wang et al.
(Continued)

FOREIGN PATENT DOCUMENTS

AU   4020189   5/1990
CN   1283217   2/2001
(Continued)

OTHER PUBLICATIONS

Miller, et al. publication entitled "Epitaxial Beta-Ga2O3 and Beta-(AlxGa1-x)2O3/Beta-Ga2O3 heterostructures growth for power electronics," IEEE Trans. on Semicond. Mfg., vol. 31, No. 4, pp. 467-473 (2018). (Year: 2018).*

(Continued)

*Primary Examiner* — Kenneth A Bratland, Jr.
(74) *Attorney, Agent, or Firm* — Meunier Carlin & Curfman LLC

(57) ABSTRACT

Disclosed herein methods of forming an Al—Ga containing film comprising: a) exposing a substrate comprising a $\beta$-$Ga_2O_3$, wherein the substrate has a (100) or (−201) orientation, to a vapor phase comprising an aluminum precursor and a gallium precursor; and b) forming a $\beta$-$(Al_xGa_{1-x})_2O_3$ thin film by a chemical vapor deposition at predetermined conditions and wherein x is $0.01 \leq x \leq 0.7$. Also disclosed herein are devices comprising the inventive films.

21 Claims, 24 Drawing Sheets

(51) Int. Cl.
*C30B 29/68* (2006.01)
*C30B 25/16* (2006.01)
*C30B 31/00* (2006.01)

(52) U.S. Cl.
CPC ............ *C30B 25/186* (2013.01); *C30B 29/68* (2013.01); *C30B 31/00* (2013.01)

(58) Field of Classification Search
CPC ....... C30B 25/186; C30B 29/00; C30B 29/10; C30B 29/16; C30B 29/20; C30B 29/22; C30B 29/68; C30B 31/00; C23C 16/02; C23C 16/30; C23C 16/40; C23C 16/403
USPC .... 117/84, 88, 101, 104–105, 937, 945, 950
See application file for complete search history.

(56) References Cited

U.S. PATENT DOCUMENTS

| | | |
|---|---|---|
| 8,313,962 B2 | 11/2012 | Lott et al. |
| 8,436,342 B2 | 5/2013 | Park et al. |
| 8,525,215 B2 | 9/2013 | Choi et al. |
| 9,685,765 B2 | 6/2017 | Sinclair et al. |
| 9,875,910 B2 | 1/2018 | Kurata et al. |
| 10,393,933 B2 | 8/2019 | Sinclair et al. |
| 2013/0122617 A1 | 5/2013 | Lott et al. |
| 2017/0063039 A1 | 3/2017 | Sinclair et al. |
| 2017/0276848 A1 | 9/2017 | Sinclair et al. |
| 2018/0108525 A1* | 4/2018 | Zhao ............... H01L 31/047 |
| 2019/0341452 A1 | 11/2019 | Miao et al. |
| 2020/0006485 A1 | 1/2020 | Miao et al. |

FOREIGN PATENT DOCUMENTS

| | | |
|---|---|---|
| CN | 1171973 | 10/2004 |
| CN | 2005235961 | 9/2005 |
| CN | 106887470 | 6/2017 |
| EP | 0371462 | 6/1990 |
| EP | 2405497 | 1/2012 |
| EP | 3151285 | 4/2017 |
| EP | 2765610 | 12/2018 |
| JP | 2008305816 | 12/2008 |
| JP | 4507169 | 7/2010 |
| JP | 2011102235 | 5/2011 |
| JP | 2019043831 | 3/2019 |
| JP | 2019057717 | 4/2020 |
| KR | 101689164 | 12/2016 |
| RU | 2013140469 | 3/2015 |
| RU | 2666431 | 9/2018 |

OTHER PUBLICATIONS

Alema, Fidadu, et al. "Low temperature electron mobility exceeding 104 cm2/V s in MOCVD grown β-Ga2O3." APL Materials 7.12 (2019): 121110.

Anhar Uddin Bhuiyan, A. F. M., et al. "MOCVD Epitaxy of Ultrawide Bandgap β-(Al x Ga1-x) 2O3 with High-Al Composition on (100) β-Ga2O3 Substrates." Crystal Growth & Design 20.10 (2020): 6722-6730.

Anhar Uddin Bhuiyan, A. F. M., et al. "MOCVD Epitaxy of β-(AlxGa1-x) 2O3 thin films on (010) Ga2O3 substrates and N-type doping." Applied Physics Letters 115.12 (2019): 120602.

Baldini, Michele, et al. "Si- and Sn-doped homoepitaxial β-Ga2O3 layers grown by MOVPE on (010)-oriented substrates." ECS Journal of Solid State Science and Technology 6.2 (2016): Q3040.

Bhuiyan, AFM Anhar Uddin, et al. "Band offsets of (100) β-(AlxGa1-x) 2O3/β-Ga2O3 heterointerfaces grown via MOCVD." Applied Physics Letters 117.25 (2020): 252105.

Bhuiyan, AFM Anhar Uddin, et al. "Phase transformation in MOCVD growth of (AlxGa1-x) 2O3 thin films." APL Materials 8.3 (2020): 031104.

Chabak, Kelson D., et al. "Lateral β-Ga2O3 field effect transistors." Semiconductor Science and Technology 35.1 (2019): 013002.

Chen, Xiaohong, et al. "Symmetrically abrupt GaN/AlGaN superlattices by alternative interface-interruption scheme." Journal of Materials Research 28.5 (2013): 716-722.

Fares, Chaker, et al. "Band Alignment of Atomic Layer Deposited SiO2 and Al2O3 on (AlxGa1-x) 2O3 for x=0.2-0.65." ECS Journal of Solid State Science and Technology 8.6 (2019): P351.

Fares, Chaker, et al. "Band alignment of atomic layer deposited SiO2 on (010)(A10.14Ga0. 86) 2O3." Journal of Vacuum Science & Technology B, Nanotechnology and Microelectronics: Materials, Processing, Measurement, and Phenomena 36.6 (2018): 061207.

Feng, Zixuan, et al. "MOCVD homoepitaxy of Si-doped (010) β-Ga2O3 thin films with superior transport properties." Applied Physics Letters 114.25 (2019): 250601.

Feng, Zixuan, et al. "Probing Charge Transport and Background Doping in Metal-Organic Chemical Vapor Deposition-Grown (010) β-Ga2O3." physica status solidi (RRL)—Rapid Research Letters 14.8 (2020): 2000145.

Fiedler, A., et al. "Influence of incoherent twin boundaries on electrial properties of β-Ga2O3 layers homoepitaxially grown by metal-organic vapor phase epitaxy." Journal of Applied Physics 122.16 (2017): 165701.

Ghosh, Krishnendu, and Uttam Singisetti. "Electron mobility in monoclinic β-Ga2O3—Effect of plasmon-phonon coupling, anisotropy, and confinement." Journal of Materials Research 32.22 (2017): 4142-4152.

Green, Andrew J., et al. "3.8-MV/cm Breakdown Strength of MOVPE-Grown Sn-Doped beta-Ga2O3 MOSFETs." IEEE Electron Device Letters 37.7 (2016): 902-905.

Higashiwaki, Masataka, and Gregg H. Jessen. "Guest Editorial: The drawn of gallium oxide microelectronics." (2018): 060401.

Higashiwaki, Masataka, et al. "Depletion-mode Ga2O3 metal-oxide-semiconductor field-effect transistors on β-Ga2O3 (010) substrates and temperature dependence of their device characteristics." Applied Physics Letters 103.12 (2013): 123511.

Higashiwaki, Masataka, et al. "Gallium oxide (Ga2O3) metal-semiconductor field-effect transistors on single-crystal β-Ga2O3 (010) substrates." Applied Physics letters 100.1 (2012): 013504.

Hill, V. G., Rustum Roy, and E. F. Osborn. "The system alumina-gallia-water." Journal of the American Ceramic Society 35.6 (1952): 135-142.

Hu, Zongyang, et al. "Enhancement-mode Ga 2 O 3 vertical transistors with breakdown voltage> 1 kV." IEEE Electron Device Letters 39.6. (2018): 869-872.

Joishi, Chandan, et al. "Low-pressure CVD-grown β-Ga2O3 bevel-field-plated Schottky barrier diodes." Applied Physics Express 11.3 (2018): 031101.

Kaneko, Kentaro, et al. "Growth characteristics of corundum-structured α-(AlxGa1-x) 2O3/Ga2O3 heterostructures on sapphire substrates." Journal of Crystal Growth 436 (2016): 150-154.

Khan, M. Asif, et al. "III-nitride UV devices." Japanese journal of applied physics 44.10R (2005): 7191.

Konishi, Keita, et al. "1-kV vertical Ga2O3 field-plated Schottky barrier diodes." Applied Physics Letters 110.10 (2017): 103506.

Krishnamoorthy, Sriram, et al. "Modulation-doped β-(A10. 2Ga0. 8) 2O3/Ga2O3 field-effect transistor." Applied Physics Letters 111.2 (2017): 023502.

Kuramata, Akito, et al. "High-quality β-Ga2O3 single crystals grown by edge-defined film-fed growth." Japanese Journal of Applied Physics 55.12 (2016): 1202A2.

Li, Jing, et al. "Identification and modulation of electronic band structures of single-phase β-(AlxGa1-x) 2O3 alloys grown by laser molecular beam epitaxy." Applied Physics Letters 113.4 (2018): 041901.

Li, Wenshen, et al. "Field-Plated Ga 2 O 3 Trench Schottky Barrier Diodes With a BV2/Ron,sp of up to 0.95 GW/cm 2." IEEE Electron Device Letters 41.1 (2019): 107-110.

Ma, Nan, et al. "Intrinsic electron mobility limits in β-Ga2O3." Applied Physics Letters 109.21 (2016): 212101.

Mauze, Akhil, et al. "Metal oxide catalyzed epitaxy (MOCATAXY) of β-Ga2O3 films in various orientations grown by plasma-assisted molecular beam epitaxy." APL Materials 8.2 (2020): 021104.

(56) References Cited

OTHER PUBLICATIONS

Mazumder, Baishakhi, et al. "Atomic scale investigation of chemical heterogeneity in β-(AlxGa1-x) 2O3 films using atom probe tomography." Applied Physics Letters 115.13 (2019): 132105.

Mazzolini, P., et al. "Substrate-orientation dependence of β-Ga2O3 (100),(010),(001), and (2⁻ 01) homoepitaxy by indium-mediated metal-exchange catalyzed molecular beam epitaxy (MEXCAT-MBE)." Apl Materials 8.1 (2020): 011107.

Ngo, Trong Si, et al. "Investigation of defect structure in homoepitaxial (2⁻ 01) β-Ga2O3 layers prepared by plasma-assisted molecular beam epitaxy." Journal of Alloys and Compounds 834 (2020): 155027.

Nichols, M. T., et al. "Measurement of bandgap energies in low-k organosilicates." Journal of Applied Physics 115.9 (2014): 094105.

Okumura, Hironori, et al. "Systematic investigation of the growth rate of β-Ga2O3 (010) by plasma-assisted molecular beam epitaxy." Applied Physics Express 7.9 (2014): 095501.

Oshima, Takayoshi, et al. "Vertical solar-blind deep-ultraviolet Schottky photodetectors based on β-Ga2O3 substrates." Applied physics express 1.1 (2008): 011202.

Oshima, Takayoshi, et al. "β-Al2xGa2-2xO3 thin film growth by molecular beam epitaxy." Japanese Journal of Applied Physics 48.7R (2009): 070202.

Oshima, Yuichi, et al. "Composition determination of β-(Al x Ga1-x) 2O3 layers coherently grown on (010) β-Ga2O3 substrates by high-resolution X-ray diffraction." Applied Physics Express 9.6 (2016): 061102.

Pearton, S. J., et al. "A review of Ga2O3 materials, processing, and devices." Applied Physics Reviews 5.1 (2018): 011301.

Peelaers, et al., Erratum: "Structural and electronic properties of Ga2O3—Al2O3 alloys" [Appl. Phys. Lett. 112, 242101 (2018)] Appl. Phys. Lett. 115, 159901 (2019).

R. Schewski, K. Lion, A. Fiedler, C. Wouters, A. Popp, S. V. Levchenko, T. Schulz, M. Schmidbauer, S. Bin Anooz, R. Grüneberg, Z. Galazka, G. Wagner, K. Irmscher, M. Scheffler, C. Draxl, and M. Albrecht, APL Mater. 7, 022515 (2019).

R. Schewski, M. Baldini, K. Irmscher, A. Fiedler, T. Markurt, B. Neuschulz, T. Remmele, T. Schulz, G. Wagner, Z. Galazka, and M. Albrecht, J. Appl. Phys. 120, 225308 (2016).

Rafique, Subrina, et al. "Homoepitaxial growth of β-Ga2O3 thin films by low pressure chemical vapor deposition." Applied Physics Letters 108.18 (2016): 182105.

Rafique, Subrina, et al. "LPCVD homoepitaxy of Si doped β-Ga2O3 thin films on (010) and (001) substrates." Applied Physics Letters 112.5 (2018): 052104.

Ranga, Praneeth, et al. "Si-doped β-(Al0. 26GaO. 74) 2O3 thin films and heterostructures grown by metalorganic vapor-phase epitaxy." Applied Physics Express 12.11 (2019): 111004.

Gao, Shang, et al. "Nanogrinding induced surface and deformation mechanism of single crystal β-Ga2O3." Materials Science in Semiconductor Processing 79 (2018): 165-170.

Sarker, Jith, et al. "Understanding the Growth Mechanism of β-(Al x Ga 1-x) 2 O 3 by Atom Probe Tomography." Microscopy and Microanalysis 25.S2 (2019): 2508-2509.

Ueda, Osamu, et al. "Structural evaluation of defects in β-Ga2O3 single crystals grown by edge-defined film-fed growth process." Japanese Journal of Applied Physics 55.12 (2016): 1202BD.

Varley, Joel B., et al. "Prospects for n-type doping of (Al x Ga1-x) 2O3 alloys." Applied Physics Letters 116.17 (2020): 172104.

Vogt, Patrick, et al. "Metal-oxide catalyzed epitaxy (MOCATAXY): the example of the O plasma-assisted molecular beam epitaxy of β-(Al x Ga1-x) 2O3/β-Ga2O3 heterostructures." Applied Physics Express 11.11 (2018): 115503.

Wakabayashi, Ryo, et al. "Band alignment at β-(Al x Ga1-x) 2O3/β-Ga2O3 (100) interface fabricated by pulsed-laser deposition." Applied Physics Letters 112.23 (2018): 232103.

Wen, Tzu-Chi, and Wei-I. Lee. "Influence of barrier growth temperature on the properties of InGaN/GaN quantum well." Japanese Journal of Applied Physics 40.9R (2001): 5302.

Wong, Man Hoi, et al. "Current Aperture Vertical $\beta $-Ga 2 O 3 MOSFETs Fabricated by N- and Si-Ion Implantation Doping." IEEE Electron Device Letters 40.3 (2018): 431-434.

Xia, Zhanbo, et al. "$\beta $-Ga 2 O 3 Delta-Doped Field-Effect Transistors With Current Gain Cutoff Frequency of 27 GHz." IEEE Electron Device Letters 40.7 (2019): 1052-1055.

Zhang, Fabi, et al. "Wide bandgap engineering of (AlGa) 2O3 films." Applied Physics Letters 105.16 (2014): 162107.

Zhang, Yuewei, et al. "Demonstration of high mobility and quantum transport in modulation-doped β-(AlxGa1-x) 2O3/Ga2O3 heterostructures." Applied Physics Letters 112.17 (2018): 173502.

* cited by examiner

DEPOSITION OF SINGLE PHASE BETA-(ALXGA1-X)2O3 THIN FILMS WITH 0.28< =X<=0.7 ON BETA GA2O3(100) OR (−201) SUBSTRATES BY CHEMICAL VAPOR DEPOSITION

CROSS-REFERENCE TO RELATED APPLICATIONS

This application claims the benefit of U.S. Provisional Application No. 63/039,830, filed Jun. 16, 2020, the content of which is incorporated herein by reference in its entirety.

STATEMENT ACKNOWLEDGING GOVERNMENT SUPPORT

This invention was made with government support under Grant No. FA9550-18-1-0479 awarded by the United States Air Force/AFOSR and under Grants No. 1810041 and 2019753 awarded by the National Science Foundation. The government has certain rights in the invention.

BACKGROUND

The $\beta$-$Ga_2O_3$ is known to have very wide bandgap energy (~4.8 eV) with a theoretically predicted high breakdown field strength of 8 MV/cm. Due to its higher thermal/chemical stability and n-type doping capability with excellent transport properties, $\beta$-$Ga_2O_3$ is predicted to outperform the current leading technology based on traditional wide bandgap semiconductors, such as SiC and GaN. Significant progress in developing high-quality $\beta$-$Ga_2O_3$ native substrates and epitaxy has been made since the first $\beta$-$Ga_2O_3$ based conceptual device demonstration. Owing to its outstanding material properties, high performance $\beta$-$Ga_2O_3$ based devices including lateral and vertical field-effect transistors, Schottky barrier diodes, and ultraviolet solar-blind photodetectors have already been previously demonstrated.

Energy bandgap engineering by alloying $\beta$-$Ga_2O_3$ with $Al_2O_3$ can expand the accessible bandgap of AlGaO alloy up to 8.8 eV, which can provide opportunities for optoelectronics in deep ultraviolet and electronics with even higher critical field strengths. In addition, the AlGaO/GaO heterostructures forming a two-dimensional electron gas (2DEG) can enable high power and high-frequency electronics. As compared to 2DEGs in AlGaN/GaN, electron mobility at AlGaO/GaO interface is predicted to be lower. However, because of its higher critical field strength, AlGaO/GaO field-effect transistors still gain benefits from device miniaturization, potentially exceeding what AlGaN/GaN devices can achieve today. Lateral device structures based on AlGaO/GaO heterostructures forming 2DEG have been previously demonstrated. In order to achieve 2DEG with higher sheet charge density, a larger band offset at AlGaO/GaO interface for better carrier confinement is required. Therefore, in order to maximize the advantages provided by the AlGaO/GaO heterostructures, the development of high-quality epitaxy of AlGaO with high Al composition is a key step.

Due to the different ground-state crystal structures of thermally stable monoclinic $\beta$-$Ga_2O_3$ (space group C2/m) and corundum $\alpha$-$Al_2O_3$ (space group R3c), the solubility of $Al_2O_3$ in $\beta$-$Ga_2O_3$ is expected to be limited. The phase diagram of $(Al_xGa_{1-x})_2O_3$ alloy predicted the existence of stable monoclinic $\beta$-phase AlGaO with Al composition up to 67%.

Prior efforts on the growth of $(Al_xGa_{1-x})_2O_3$ films include $\beta$-$(Al_xGa_{1-x})_2O_3$ growth on (010) $\beta$-$Ga_2O_3$ substrates via MBE and MOCVD with verified Al composition up to ~20% and 27%, respectively. While maximizing the Al incorporation in $\beta$-phase is critical for future AlGaO and AlGaO/GaO based device developments, the growth study of $\beta$-$(Al_xGa_{1-x})_2O_3$ films on (010) $\beta$-$Ga_2O_3$ substrates have indicated the appearance of phase segregation in the $(Al_xGa_{1-x})_2O_3$ layer when targeting for high Al compositions (x>27%). Although several studies on the growth of $\beta$-$(Al_xGa_{1-x})_2O_3$ films on (010) $\beta$-$Ga_2O_3$ substrates have been conducted, the Al incorporation into pure $\beta$-$(Al_xGa_{1-x})_2O_3$ is still limited to <30%. Previously, MBE growth of $\beta$-$(Al_xGa_{1-x})_2O_3$ thin films on (100) $\beta$-$Ga_2O_3$ substrates showed up to 61% of Al incorporation into $\beta$-phase. However, the growth rate of the MBE grown (100) $\beta$-$(Al_xGa_{1-x})_2O_3$ films ranged between 17.5 nm/hr and 37.5 nm/hr, which poses challenges for certain device's applications.

Considering the monoclinic $\beta$-$Ga_2O_3$, the lattice constants of a, b, and c are 1.22 nm, 0.30 nm, and 0.58 nm, respectively. This indicates the high asymmetric bonding strength along with different crystal orientations. Among the major crystal planes (010), (100), (−201), and (001), (100) represents a cleavage plane and is predicted to have the lowest surface energy. For AlGaO grown on GaO substrates, the lattice mismatch between AlGaO and GaO creates strain in the epitaxial films, leading to the generation of defects or phase transformation. And lattice mismatch increases monotonically as Al composition increases. As previously shown, for $\beta$-AlGaO grown on (010) GaO substrates, when the Al composition increases to above ~27%, a different phase appears due to the increase of the accumulated strain in the epi-film. For films grown on (010) crystal surface, there exists a large difference between the in-plane axial a and c lattices; the distortion becomes more severe when Al's composition increases.

The challenges to grow GaO or AlGaO on (100) or (−201) substrates are from the week attachment of the impinged adatoms on the epi-surface. This will lead to random and local nucleation of the adatoms, which results in the 2D island growth mode instead of the layer-by-layer growth mode.

Thus, there is a need for methods of depositing the $\beta$-$(Al_xGa_{1-x})_2O_3$ films and $\beta$-$(Al_xGa_{1-x})_2O_3$/$Ga_2O_3$ heterostructures with maximum Al composition as high as >60%. Also, there is a need for devices comprising such films and heterostructures. These needs and other needs are at least partially satisfied by the present disclosure.

SUMMARY

The present invention is directed to a method of forming an Al—Ga containing film comprising: a) exposing a substrate comprising a $\beta$-$Ga_2O_3$, wherein the substrate has a (100) or (−201) orientation, to a vapor phase comprising an aluminum precursor and a gallium precursor; and b) forming a $\beta$-$(Al_xGa_{1-x})_2O_3$ thin film by a chemical vapor deposition at predetermined conditions and wherein x is 0.01≤x≤0.7.

Still further disclosed herein is a method of forming an Al—Ga containing semiconductor device comprising: forming a superlattice on a substrate, wherein the superlattice comprises a plurality of stacked groups of thin film layers, wherein each group of the plurality of stacked groups comprises a (100) $\beta$-$(Al_xGa_{1-x})_2O_3$ thin layer disposed on a (100) $\beta$-$Ga_2O_3$ thin film layer or a (−201) $\beta$-$(Al_xGa_{1-x})_2O_3$ thin layer disposed on a (−201) $\beta$-$Ga_2O_3$ thin film layer and wherein Al concentration in each group is the same or different and wherein x is 0.01≤x≤0.7; and wherein a first group of the plurality of stacked groups of the thin layers is formed by a sequential chemical vapor deposition on the substrate at predetermined conditions; and wherein each following group of the plurality of stacked groups is deposited by the chemical vapor deposition on the preceding group at the predetermined conditions.

In still further aspects, disclosed herein are films formed by the disclosed methods. Also disclosed herein are devices comprising the inventive films. In yet other aspects, disclosed herein is a superlattice formed by any of the disclosed herein methods. In yet further aspects, disclosed herein are devices comprising the inventive superlattice.

Still further disclosed herein is a thin film comprising (100) β-$(Al_xGa_{1-x})_2O_3$ or (−201) β-$(Al_xGa_{1-x})_2O_3$ wherein x is 0.01≤x≤0.7, and wherein the film comprises at least one impurity selected from hydrogen or carbon.

Also disclosed herein is a device comprising: a) a substrate comprising (100) β-$Ga_2O_3$ or (−201) β-$Ga_2O_3$; and b) at least one layer comprising a (100) β-$(Al_xGa_{1-x})_2O_3$ thin film or a (−201) β-$(Al_xGa_{1-x})_2O_3$, wherein x is 0.01≤x≤0.7, and wherein the film comprises at least one impurity selected from hydrogen or carbon.

Additional aspects of the disclosure will be set forth, in part, in the detailed description, figures, and claims which follow, and in part will be derived from the detailed description or can be learned by practice of the invention. It is to be understood that both the foregoing general description and the following detailed description are exemplary and explanatory only and are not restrictive of the invention as disclosed.

BRIEF DESCRIPTION OF DRAWINGS

FIG. 7A—typical 2D island mode growth process of (100) β-$Ga_2O_3$ films on (100) on-axis β-$Ga_2O_3$ substrates including (1) the absorption and diffusion of Ga adatoms and (2) formation of 2D islands by the encounter of Ga adatoms due to the lack of energetically favorable lattice sites, such as surface steps or kinks and FIG. 7B step flow growth process of high Al content (100) β-$(Al_xGa_{1-x})_2O_3$ films on (100) on-axis β-$Ga_2O_3$ substrates include (1) absorption, diffusion and fast adherence of Al adatoms on the growth surface and (2) incorporation of Ga adatoms at the nearest Al site, which acts as the preferential nucleation site for incoming Ga adatoms.

FIG. 8A shows a low magnification image with a 50 nm scale displaying each interface. FIG. 8B shows an atomic resolution image of the β-$(Al_{0.17}Ga_{0.33})_2O_3$ film with (c) blue and (d) orange marked defect regions. FIG. 8C shows a HAADF-STEM image of a (100) twin boundary (red-dashed line) and structure accompanied by a model. FIG. 8D shows unit cell thick defects extended in the $[001]_m$. Yellow-outlines and aqua-outlined models overlapped (green outlined) represent the defect formation. FIG. 8E shows STEM-EDS profiles for Al (blue), Ga (green), and O (red) in the (100) β-$(Al_{0.17}Ga_{0.83})_2O_3$ film from the yellow region in FIG. 8A.

FIG. 11E shows the STEM-EDS line profiles for Al (blue), Ga (green), and O (red) along the direction indicated by the yellow arrow in FIG. 11D.

FIG. 16A—XRD ω-2θ spectra for the (−603) reflections of β-(Al$_x$Ga$_{1-x}$)$_2$O$_3$ films grown with 3.82% of [TMAl]/[TMAl+TEGa] molar flow ratio at different growth conditions: (i) 880° C. and 80 Torr (red curve), (ii) 920° C. and 20 Torr (blue curve), and (iii) 880° C. and 20 Torr (black curve). Surface view FESEM images for the films grown with (ii) and (i) growth conditions are shown in FIG. 16B and FIG. 16C, respectively.

FIG. 17E—STEM-EDS quantitative line profile displaying the atomic percentage (%) of Al (blue), Ga (green), and O (red) along the [−201] direction from the top of the film to the substrate marked with the orange arrow in FIG. 17A. The EDS experimental uncertainty is ≈±5%.

FIG. 18E—STEM-EDS quantitative line profile displaying the atomic percentage (%) of Al (blue), Ga (green), and O (red) along the [−201] direction from the top of the film to the substrate marked with the orange arrow in FIG. 17A. The EDS experimental uncertainty is ≈±5%.

DETAILED DESCRIPTION

Figure 1:
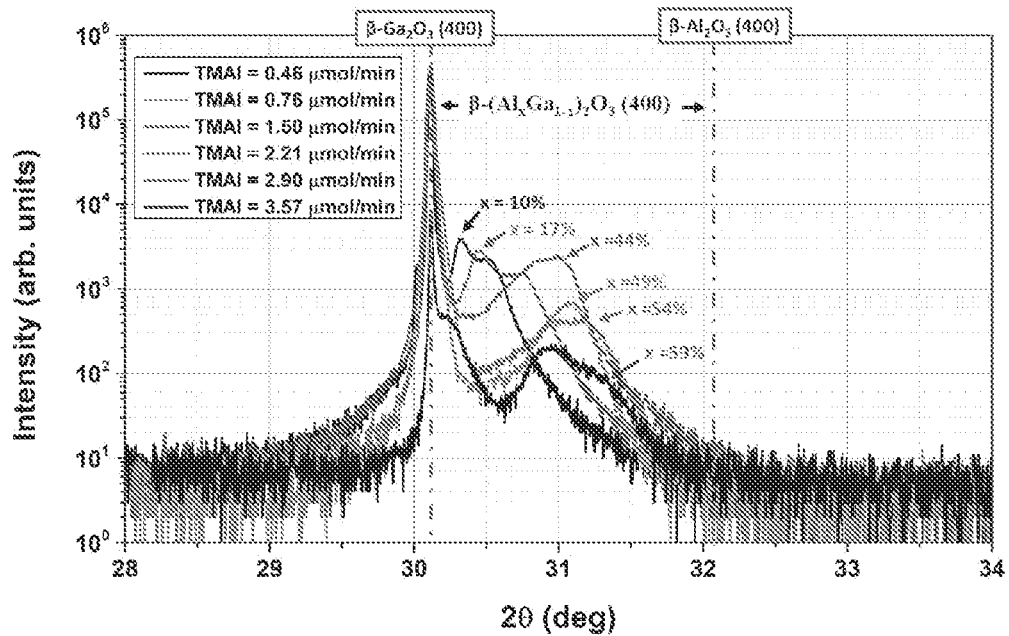
FIG. 1 shows XRD ω-2θ scan profiles for (100) β-$(Al_xGa_{1-x})_2O_3$ films grown on (100) β-$Ga_2O_3$ substrates with various Al compositions. XRD peaks corresponding to 10%, 17%, 44%, 49%, 54% and 59% of Al compositions were identified.

The present invention can be understood more readily by reference to the following detailed description, examples, drawings, and claims, and their previous and following description. However, before the present articles, systems, and/or methods are disclosed and described, it is to be understood that this invention is not limited to the specific or exemplary aspects of articles, systems, and/or methods disclosed unless otherwise specified, as such can, of course, vary. It is also to be understood that the terminology used herein is for the purpose of describing particular aspects only and is not intended to be limiting.

The following description of the invention is provided as an enabling teaching of the invention in its best, currently known aspect. To this end, those skilled in the relevant art will recognize and appreciate that many changes can be made to the various aspects of the invention described herein while still obtaining the beneficial results of the present invention. It will also be apparent that some of the desired benefits of the present invention can be obtained by selecting some of the features of the present invention without utilizing other features. Accordingly, those of ordinary skill in the pertinent art will recognize that many modifications and adaptations to the present invention are possible and may even be desirable in certain circumstances and are a part of the present invention. Thus, the following description is again provided as illustrative of the principles of the present invention and not in limitation thereof.

Definitions

As used herein, the singular forms "a," "an," and "the" include plural referents unless the context clearly dictates otherwise. Thus, for example, reference to a "device" includes aspects having two or more such devices unless the context clearly indicates otherwise.

It is appreciated that certain features of the disclosure, which are, for clarity, described in the context of separate aspects, can also be provided in a combination in a single aspect. Conversely, various features of the disclosure, which are, for brevity, described in the context of a single aspect, can also be provided separately or in any suitable subcombination.

As used herein, the terms "optional" or "optionally" mean that the subsequently described event or circumstance may or may not occur, and that the description includes instances where said event or circumstance occurs and instances where it does not.

It is also to be understood that the terminology used herein is for the purpose of describing particular aspects only and is not intended to be limiting. As used in the specification and in the claims, the term "comprising" can include the aspects "consisting of" and "consisting essentially of." Unless defined otherwise, all technical and scientific terms used herein have the same meaning as commonly understood by one of ordinary skill in the art to which this invention belongs. In this specification and in the claims, which follow, reference will be made to a number of terms that shall be defined herein.

For the terms "for example" and "such as," and grammatical equivalences thereof, the phrase "and without limitation" is understood to follow unless explicitly stated otherwise.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Furthermore, when numerical ranges of varying scope are set forth herein, it is contemplated that any combination of these values inclusive of the recited values may be used. Further, ranges can be expressed herein as from "about" one particular value and/or to "about" another particular value. When such a range is expressed, another aspect includes from the one particular value and/or to the other particular value.

Similarly, when values are expressed as approximations, by use of the antecedent "about," it will be understood that the particular value forms another aspect. It will be further understood that the endpoints of each of the ranges are significant both in relation to the other endpoint and independently of the other endpoint. Unless stated otherwise, the term "about" means within 5% (e.g., within 2% or 1%) of the particular value modified by the term "about."

Throughout this disclosure, various aspects of the invention can be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6, etc., as well as individual numbers within that range, for example, 1, 2, 2.7, 3, 4, 5, 5.3, 6 and any whole and partial increments therebetween. This applies regardless of the breadth of the range.

As used herein, the term "composition" is intended to encompass a product comprising the specified ingredients in the specified amounts, as well as any product which results, directly or indirectly, from a combination of the specified ingredients in the specified amounts. In yet further aspects, and as described herein, the term "composition" can also refer to a product whose exact components are known and are determined by the methods disclosed herein.

As used herein, the term "substantially," in, for example, the context "substantially no change" refers to a phenomenon or an event that exhibits less than about 1% change, e.g., less than about 0.5%, less than about 0.1%, less than about 0.05%, or less than about 0.01% change. For example, when the term substantially no change is used in the context of substantially no change is observed in the oscillations of the molten electrolyte, it is understood that the change in the oscillations is less than about 1%, less than about 0.5%, less than about 0.1%, less than about 0.05%, or less than about 0.01%.

As used herein, the term "substantially," in, for example, the context "substantially identical" or "substantially similar" refers to a method or a system, or a component that is at least about 80%, at least about 85%, at least about 90%, at least about 91%, at least about 92%, at least about 93%, at least about 94%, at least about 95%, at least about 96%, at least about 97%, at least about 98%, at least about 99%, or about 100% by similar to the method, system, or the component it is compared to.

While aspects of the present invention can be described and claimed in a particular statutory class, such as the system statutory class, this is for convenience only and one of ordinary skill in the art will understand that each aspect of the present invention can be described and claimed in any statutory class. Unless otherwise expressly stated, it is in no way intended that any method or aspect set forth herein be construed as requiring that its steps be performed in a specific order. Accordingly, where a method claim does not specifically state in the claims or descriptions that the steps are to be limited to a specific order, it is in no way intended that an order be inferred in any respect. This holds for any possible non-express basis for interpretation, including matters of logic with respect to arrangement of steps or operational flow, plain meaning derived from grammatical organization or punctuation, or the number or type of aspects described in the specification.

The present invention may be understood more readily by reference to the following detailed description of various aspects of the invention and the examples included therein and to the Figures and their previous and following description.

Methods

The present disclosure provides a method of forming an Al—Ga containing film comprising: a) exposing a substrate comprising a $\beta$-$Ga_2O_3$, wherein the substrate has a (100) or (−201) orientation, to a vapor phase comprising an aluminum precursor and a gallium precursor, and b) forming a β-(Al$_x$Ga$_{1-x}$)$_2$O$_3$ thin film by a chemical vapor deposition at predetermined conditions and wherein x is 0.01≤x≤0.7. It is understood that in certain aspects, the methods disclosed herein provide for the β-(Al$_x$Ga$_{1-x}$)$_2$O$_3$ thin film that can be formed on the (100) β-Ga$_2$O$_3$. While in other aspects, the methods disclosed herein provide for the β-(Al$_x$Ga$_{1-x}$)$_2$O$_3$ thin film that can be formed on the (−201) β-Ga$_2$O$_3$. In still further aspects, the β-(Al$_x$Ga$_{1-x}$)$_2$O$_3$ thin films formed by the disclosed herein methods can have a high Al content. In yet further aspects, Aluminium is present in an amount x from about 0.01 to about 0.7, including exemplary values of about 0.02, about 0.03, about 0.04, about 0.05, about 0.06, about 0.07, about 0.08, about 0.09, about 0.1, about 0.11, about 0.12, about 0.13, about 0.14, about 0.15, about 0.16, about 0.17, about 0.18, about 0.19, about 0.20, about 0.21, about 0.22, about 0.23, about 0.24, about 0.25, about 0.26, about 0.27, about 0.28, about 0.29, about 0.30, about 0.31, about 0.32, about 0.33, about 0.34, about 0.35, about 0.36, about 0.37, about 0.38, about 0.39, about 0.40, about 0.41, about 0.42, about 0.43, about 0.44, about 0.45, about 0.46, about 0.47, about 0.48, about 0.49, about 0.50, about 0.51, about 0.52, about 0.53, about 0.54, about 0.55, about 0.56, about 0.57, about 0.58, about 0.59, about 0.60, about 0.61, about 0.62, about 0.63, about 0.64, about 0.65, about 0.66, about 0.67, about 0.68, and about 0.69. In yet further aspects, x can have any value between any two foregoing values.

In still further aspects, the methods disclosed herein comprise exposing the substrate to a vapor phase. In certain aspects, the vapor phase comprises a gallium precursor and/or aluminum precursor. In still further aspects, the vapor phase further comprises an oxygen precursor. In yet further aspects, the oxygen precursor can comprise pure oxygen (O$_2$). In still further aspects, the vapor phase can also comprise a carrier gas. It is understood that in such aspects, the carrier gas can be any gas that does not participate in the chemical vapor deposition. For example, the carrier gas can comprise argon. In still other aspects, any inert gas that does not participate in the chemical vapor deposition can be utilized.

In still further aspects, the methods disclosed herein result in the β-(Al$_x$Ga$_{1-x}$)$_2$O$_3$ thin film is epitaxially grown. It is understood that the term "epitaxially grown film" refers to a film having a substantially ordered atomic arrangement following its substrate. It is understood that the epitaxial films can have a substantially single orientation relative to the substrate. In yet further aspects, the β-(Al$_x$Ga$_{1-x}$)$_2$O$_3$ thin film formed by the methods disclosed herein comprise a substantially uniform Al composition distribution through a thin film thickness. It is understood that in such aspects, the Al composition of the thin film is substantially identical on an interface with the substrate, in the bulk of the film, or on the surface of the film. However, there are also aspects where the Al composition of the thin film is not the same on an interface with the substrate, in the bulk of the film, or on the surface of the film.

In still further aspects, the β-(Al$_x$Ga$_{1-x}$)$_2$O$_3$ thin film formed by the methods disclosed herein exhibits a single-phase (100) when the film is formed on (100) β-Ga$_2$O$_3$ substrate. In yet further aspects, the β-(Al$_x$Ga$_{1-x}$)$_2$O$_3$ thin film formed by the methods disclosed herein exhibits a single-phase (−201) when the film is formed on (−201) β-Ga$_2$O$_3$ substrate.

In yet further aspects, the methods disclosed herein are performed at predetermined conditions. In such exemplary aspects, the predetermined conditions comprise a temperature from about 750° C. to about 1,000° C., including exemplary aspects, of about 760° C., about 770° C., about 780° C., about 790° C., about 800° C., about 810° C., about 820° C., about 830° C., about 840° C., about 850° C., about 860° C., about 870° C., about 880° C., about 890° C., about 900° C., about 910° C., about 920° C., about 930° C., about 940° C., about 950° C., about 960° C., about 970° C., about 980° C., and about 990° C. It is understood that the temperature used in the methods disclosed herein can have any values between any two foregoing values.

In still further aspects, the predetermined conditions comprise a pressure from about 1 torr to about 600 torr, including exemplary aspects of about 5 torr, about 10 torr, about 20 torr, about 30 torr, about 50 torr, about 80 torr, about 100 torr, about 150 torr, about 200 torr, about 250 torr, about 300 torr, about 350 torr, about 400 torr, about 450 torr, about 500 torr, about 600 torr. It is understood that the pressure used in the methods disclosed herein can have any values between any two foregoing values.

In still further aspects, the predetermined conditions comprise a growth rate from about 2 nm/min to about 15 nm/min, including exemplary values of about 3 nm/min, 4 nm/min, 5 nm/min, 6 nm/min, about 7 nm/min, about 8 nm/min, about 9 nm/min, about 10 nm/min, about 11 nm/min, about 12 nm/min, about 13 nm/min, and about 14 nm/min. It is understood that films disclosed herein can be grown at any growth rate disclosed herein, and the growth rate can have any values between any two foregoing values.

In still further aspects, the growth conditions of the disclosed films can be tuned by varying a molar flow rate of the aluminum precursor relative to a total molar flow rate of the aluminum and gallium precursors. In such aspects, the molar flow rate of the aluminum precursor can be anywhere from about 2% to about 50% based on a total molar flow rate of aluminum and gallium precursors, including exemplary values of about 3%, about 4%, about 5%, about 6%, about 7%, about 8%, about 9%, about 10%, about 11%, about 12%, about 13%, about 14%, about 15%, about 16%, about 17%, about 18%, about 19%, about 20%, about 21%, about 22%, about 23%, about 24%, about 25%, about 26%, about 27%, about 28%, about 29%, about 30%, about 31%, about 32%, about 33%, about 34%, about 35%, about 36%, about 37%, about 38%, about 39%, about 40%, about 41%, about 42%, about 43%, about 44%, about 45%, about 46%, about 47%, about 48%, and about 49%.

In still further aspects, the β-(Al$_x$Ga$_{1-x}$)$_2$O$_3$ thin film formed according to the methods disclosed herein is substantially free of 2D island growth modes. In yet other aspects, and as shown herein, the β-(Al$_x$Ga$_{1-x}$)$_2$O$_3$ thin film can be formed by a step-flow growth. Without wishing to be bound by any theory, it is hypothesized that Al behaves as a surfactant and promotes layer-by-layer growth mode. The Al adatoms can act as a preferred bonding species to the O atoms on (100) or (−201) growth surfaces. The combination of relatively high growth temperature from chemical vapor deposition and the use of Al as a surfactant can enable the realization of growing high-quality phase pure β-GaO, β-Al-GaO, and their heterostructures for device applications, as disclosed herein.

In yet further aspects, the β-(Al$_x$Ga$_{1-x}$)$_2$O$_3$ thin films formed according to the disclosed methods exhibit an RMS roughness from about 0.5 nm to about 15 nm, including exemplary values of about 1 nm, about 2 nm, about 3 nm, about 4 nm, about 5 nm, about 6 nm, about 7 nm, about 8 nm, about 9 nm, about 10 nm, about 11 nm, about 12 nm, about 13 nm, and about 14 nm.

In yet further aspects, when the β-(Al$_x$Ga$_{1-x}$)$_2$O$_3$ thin films formed according to the disclosed methods comprise 0.01≤x≤0.7, such films exhibit an RMS roughness of less than about 10 nm, less than about 9.5 nm, less than about 9 nm, less than about 8.5 nm, less than about 8 nm, less than about 7.5 nm, less than about 7 nm, less than about 6.5 nm, less than about 6 nm, less than about 5.5 nm, less than about 5 nm, less than about 4.5 nm, less than about 4 nm, less than about 3.5 nm, less than about 3 nm, less than about 2.5 nm, less than about 2 nm, less than about 1.5 nm, or less than about 1.4 nm, or less than about 1.3 nm, or less than about 1.2 nm, or less than about 1.1 nm, or less than about 1.0 nm, or less than about 0.9 nm, or less than about 0.8 nm, or less than about 0.7 nm, or less than about 0.6 nm, or even less than about 0.5 nm.

In still further aspects, the chemical vapor deposition comprises a metalorganic vapor deposition, a hydride vapor phase epitaxy, a low-pressure chemical vapor deposition, or any combination thereof. In yet still further aspects, the methods disclosed herein do not comprise molecular beam epitaxy (MBE) or pulsed laser deposition (PLD).

In certain aspects, the exemplary metalorganic vapor deposition (MOCVD) growth technique can be used to produce high-quality semiconductor materials with scalability. Different from the MBE growth method, which is a physical deposition process and requires an extremely high vacuum, MOCVD growth is based on chemical reactions and usually uses close to atmospheric pressures. Different growth method often uses different types of precursors. The MOCVD growth process is involved with the use of metalorganic precursors. Therefore, in certain aspects, impurities can be found in the MOCVD films. In some exemplary aspects, the $\beta$-$(Al_xGa_{1-x})_2O_3$ thin films formed according to the disclosed methods can comprise one or more impurities. In such aspects, the impurities comprise carbon and/or hydrogen. In aspects, when one or more impurities comprise carbon, carbon is present in an amount from about $10^{15}$ to about $10^{19}$/cm$^3$, including exemplary values of about $10^{16}$, about $10^{17}$, and about $10^{18}$/cm$^3$.

It is understood that n-type dopability in GaO and AlGaO is critical for device applications. Group IV elements (e.g., Si, Ge, and Sn) are considered shallow donors for GaO and AlGaO. In certain aspects, Si is one of the efficient shallow donors among other group IV elements in high Al-content $(Al_xGa_{1-x})_2O_3$ alloys, active at least up to 85% of Al compositions based on the first principle DFT calculation. While Si has been considered as one of the desired n-type shallow donors due to its lower activation energy and compatibility with different epitaxial growth processes, MBE growth study on Si doping revealed the challenge to achieve controllable light doping (<low $10^{18}$ cm$^{-3}$) due to the oxidation of Si on Si surface in the effusion cell. The methods disclosed herein can allow controllable doping of $\beta$-$Ga_2O_3$ films as low as $10^{15}$ cm$^{-3}$.

In yet further aspects, the methods disclosed herein comprise steps of doping of the $\beta$-$(Al_xGa_{1-x})_2O_3$ thin film with one or more elements selected from Group IV. It is understood that the doping can be performed sequentially to the $\beta$-$(Al_xGa_{1-x})_2O_3$ thin film formation or concurrently with the $\beta$-$(Al_xGa_{1-x})_2O_3$ thin film formation.

In yet further aspects, the one or more elements of Group IV can be selected from Si, Ge, and Sn. In yet further aspects, the one or more elements comprises Si. In such exemplary aspects, when Si is present, it can be present in an amount from about $10^{14}$ to less than about $10^{21}$/cm$^3$, including exemplary values of about $10^{15}$/cm$^3$, about $10^{16}$/cm$^3$, about $10^{17}$/cm$^3$, about $10^{18}$/cm$^3$, about $10^{19}$/cm$^3$, and about $10^{20}$/cm$^3$.

In still further aspects, the methods disclosed here comprise the steps where the substrate is treated in the $O_2$ atmosphere at a temperature from about 850° C. to about 1,000° C. prior to step a) of the film growth. In such aspects, any temperature values in a range from 850° C. to about 1,000° C., including exemplary values of about 860° C., about 870° C., about 880° C., about 890° C., about 900° C., about 910° C., about 920° C., about 930° C., about 940° C., about 950° C., about 960° C., about 970° C., about 980° C., and about 990° C.

In still further aspects, the aluminum precursor can comprise trimethylaluminum, triethylaluminium, or a combination thereof. While yet in other aspects, the gallium precursor can comprise triethylgallium, trimethylgallium, or a combination thereof.

In still further aspects, the films formed by the disclosed methods can have any applicable and desired thickness. For example, and without limitations, the films formed by the disclosed methods can have a thickness greater than 0 to about 1 μm, including exemplary values of about 1 nm, about 5 nm, about 10 nm, about 30 nm, about 50 nm, about 80 nm, about 100 nm, about 130 nm, about 150 nm, about 180 nm, about 200 nm, about 230 nm, about 250 nm, about 280 nm, about 300 nm, about 330 nm, about 350 nm, about 380 nm, about 400 nm, about 530 nm, about 550 nm, about 580 nm, about 600 nm, about 630 nm, about 650 nm, about 680 nm, about 700 nm, about 730 nm, about 750 nm, about 780 nm, about 800 nm, about 830 nm, about 850 nm, about 880 nm, about 900 nm, about 930 nm, about 950 nm, about 980 nm.

Also disclosed herein are methods of forming an Al—Ga containing semiconductor device comprising: forming a superlattice on a substrate, wherein the superlattice comprises a plurality of stacked groups of thin film layers, wherein each group of the plurality of stacked groups comprises a (100) $\beta$-$(Al_xGa_{1-x})_2O_3$ thin layer disposed on a (100) $\beta$-$Ga_2O_3$ thin film layer or a (−201) $\beta$-$(Al_xGa_{1-x})_2O_3$ thin layer disposed on a (−201) $\beta$-$Ga_2O_3$ thin film layer and wherein Al concentration in each group is the same or different and wherein x is 0.01≤x≤0.7; and wherein a first group of the plurality of stacked groups of the thin layers is formed by a sequential chemical vapor deposition on the substrate at predetermined conditions; and wherein each following group of the plurality of stacked groups is deposited by the chemical vapor deposition on the preceding group at the predetermined conditions. As disclosed in the preceding aspects, x can have any value within 0.01≤x≤0.7.

In still further aspects, the substrate can be (100) $\beta$-$Ga_2O_3$ or (−201) $\beta$-$Ga_2O_3$ buffer layer, respectively. In such exemplary aspects, the substrate can be unintentionally doped. Yet, in other aspects, the substrate can be intentionally doped.

In yet further aspects, the (100) $\beta$-$(Al_xGa_{1-x})_2O_3$ thin layer or (−201) $\beta$-$(Al_xGa_{1-x})_2O_3$ thin film layer formed by the methods disclosed herein behaves as a barrier layer. While in other aspects, the (100) $\beta$-$Ga_2O_3$ thin film layer or (−201) $\beta$-$Ga_2O_3$ thin film layer behaves as a well layer.

In still further aspects, the (100) $\beta$-$(Al_xGa_{1-x})_2O_3$ thin film layer or (−201) $\beta$-$(Al_xGa_{1-x})_2O_3$ thin film layer present in each group has a thickness from greater than 0 nm and to about 30 nm, including exemplary values of about 1 nm, about 2 nm, about 3 nm, about 4 nm, about 5 nm, about 6 nm, about 7 nm, about 8 nm, about 9 nm, about 10 nm, about 11 nm, about 12 nm, about 13 nm, about 14 nm, about 15 nm, about 16 nm, about 17 nm, about 18 nm, about 19 nm, about 20 nm, about 21 nm, about 22 nm, about 23 nm, about 24 nm, about 25 nm, about 26 nm, about 27 nm, about 28 nm, and about 29 nm. In yet still further aspects, the thickness of the film, if needed, can be greater than 30 nm.

For example, the thickness of the film can be anywhere between greater than 0 nm to about 300 nm, including exemplary values of about 10 nm, about 30 nm, about 50 nm, about 80 nm, about 100 nm, about 130 nm, about 150 nm, about 180 nm, about 200 nm, about 230 nm, about 250 nm, and about 280 nm.

In still further aspects, the (100) β-$Ga_2O_3$ thin film layer or (−201) β-$Ga_2O_3$ thin film layer present in each group has a thickness from greater than 0 nm and to about 30 nm, including exemplary values of about 1 nm, about 2 nm, about 3 nm, about 4 nm, about 5 nm, about 6 nm, about 7 nm, about 8 nm, about 9 nm, about 10 nm, about 11 nm, about 12 nm, about 13 nm, about 14 nm, about 15 nm, about 16 nm, about 17 nm, about 18 nm, about 19 nm, about 20 nm, about 21 nm, about 22 nm, about 23 nm, about 24 nm, about 25 nm, about 26 nm, about 27 nm, about 28 nm, and about 29 nm. In yet still further aspects, the thickness of the film can be greater than 30 nm. For example, the thickness of the film, if needed, can be anywhere between greater than 0 nm to about 300 nm, including exemplary values of about 10 nm, about 30 nm, about 50 nm, about 80 nm, about 100 nm, about 130 nm, about 150 nm, about 180 nm, about 200 nm, about 230 nm, about 250 nm, and about 280 nm.

In still further aspects, the predetermined conditions used to form the disclosed herein superlattices can comprise any predetermined conditions disclosed above. For example and without limitation, the predetermined conditions can comprise a vapor atmosphere comprising an aluminum and/or gallium precursor, a temperature from about 750° C. to about 1,000° C., and a pressure from about 1 torr to about 600 torr. In yet further aspects, the predetermined conditions can comprise a growth rate from about 2 nm/min to about 15 nm/min.

In yet further aspects, the vapor phase can comprise an oxygen precursor. In such exemplary aspects, the oxygen precursor can be a pure oxygen. In still further aspects, the aluminum precursor can comprise trimethylaluminum, triethylaluminium, or a combination thereof. While yet in other aspects, the gallium precursor can comprise triethylgallium, trimethylgallium, or a combination thereof.

In still further aspects, to deposit the films of the disclosed superlattices, any molar flow rates of aluminum and gallium precursors can be used. Any of the disclosed above ratios can be utilized to form the superlattice structures as disclosed herein.

In still further aspects, similar to the preceding aspects, the (100) β-$(Al_xGa_{1-x})_2O_3$ thin film or (−201) β-$(Al_xGa_{1-x})_2O_3$ thin film is substantially free of 2D island growth modes. In such exemplary aspects, the (100) β-$(Al_xGa_{1-x})_2O_3$ thin film or (−201) β-$(Al_xGa_{1-x})_2O_3$ thin film can be formed by a step-flow growth.

In yet further aspects, the (100) β-$(Al_xGa_{1-x})_2O_3$ thin film or (−201) β-$(Al_xGa_{1-x})_2O_3$ thin film layer comprises a substantially uniform Al composition distribution throughout a thin film thickness. While in yet further aspects, wherein the (100) β-$(Al_xGa_{1-x})_2O_3$ thin film layer or (−201) β-$(Al_xGa_{1-x})_2O_3$ thin film layer is a single phase ((100) or (−201)) film.

It is understood that the thin films present in the superlattices disclosed herein can have any RMS, as disclosed above.

In still further aspects, the (100) β-$(Al_xGa_{1-x})_2O_3$ thin film layer or (−201) β-$(Al_xGa_{1-x})_2O_3$ thin film layer can comprise one or more impurities. In such aspects, the one or more impurities comprise carbon and/or hydrogen. In such aspects, when one or more impurities comprise carbon, carbon is present in an amount from about $10^{15}$ to about $10^{19}/cm^3$.

Also, as disclosed above, in certain aspects, the methods of forming the superlattice structures as disclosed above can also comprise a step of doping of the (100) β-$(Al_xGa_{1-x})_2O_3$ thin film or (−201) β-$(Al_xGa_{1-x})_2O_3$ thin film with one or more elements selected from Group IV. In such aspects, the one or more elements of Group IV can comprise one or more of Si, Ge, or Sn. In still further aspects, the one or more elements comprised Si. In such exemplary aspects and as disclosed above, the (100) β-$(Al_xGa_{1-x})_2O_3$ thin film or (−201) β-$(Al_xGa_{1-x})_2O_3$ thin film comprises Si in an amount from about $10^{14}$ to less than about $10^{21}/cm^3$.

Films and Devices

Also, in some aspects, disclosed herein are thin films formed by the disclosed above methods. In yet further aspects, disclosed herein are devices comprising these films. In still further aspects, disclosed herein are superlattices formed by the methods disclosed herein. In yet other aspects, disclosed herein are devices comprising such superlattices.

Also disclosed herein is thin film comprising (100) β-$(Al_xGa_{1-x})_2O_3$ or (−201) β-$(Al_xGa_{1-x})_2O_3$ wherein x is 0.01≤x≤0.7, and wherein the film comprises at least one impurity selected from hydrogen or carbon. In such aspects, the disclosed β-$(Al_xGa_{1-x})_2O_3$ thin films have a high Al content. In such exemplary aspects, Aluminium is present in an amount x from about 0.01 to about 0.7, including exemplary values of about 0.02, about 0.03, about 0.04, about 0.05, about 0.06, about 0.07, about 0.08, about 0.09, about 0.1, about 0.11, about 0.12, about 0.13, about 0.14, about 0.15, about 0.16, about 0.17, about 0.18, about 0.19, about 0.20, about 0.21, about 0.22, about 0.23, about 0.24, about 0.25, about 0.26, about 0.27, about 0.28, about 0.29, about 0.30, about 0.31, about 0.32, about 0.33, about 0.34, about 0.35, about 0.36, about 0.37, about 0.38, about 0.39, about 0.40, about 0.41, about 0.42, about 0.43, about 0.44, about 0.45, about 0.46, about 0.47, about 0.48, about 0.49, about 0.50, about 0.51, about 0.52, about 0.53, about 0.54, about 0.55, about 0.56, about 0.57, about 0.58, about 0.59, about 0.60, about 0.61, about 0.62, about 0.63, about 0.64, about 0.65, about 0.66, about 0.67, about 0.68, and about 0.69. In yet further aspects, x can have any value between any two foregoing values.

In yet further aspects, carbon is present in an amount from about $10^{15}$ to about $10^{19}/cm^3$, including exemplary values of about $10^{16}$, about $10^{17}$, and about $10^{16}/cm^3$.

In still further aspects, the (100) β-$(Al_xGa_{1-x})_2O_3$ thin film or (−201) β-$(Al_xGa_{1-x})_2O_3$ thin film is substantially free of 2D island growth modes. While in yet other aspects, the (100) β-$(Al_xGa_{1-x})_2O_3$ thin film or (−201) β-$(Al_xGa_{1-x})_2O_3$ thin film comprises a substantially uniform Al composition distribution throughout a thin film thickness. Also, in some aspects, disclosed herein, the (100) β-$(Al_xGa_{1-x})_2O_3$ thin film or (−201) β-$(Al_xGa_{1-x})_2O_3$ thin film is a single phase (100) film or a single-phase (−201) film, respectively.

In still further aspects, the (100) β-$(Al_xGa_{1-x})_2O_3$ thin film or (−201) β-$(Al_xGa_{1-x})_2O_3$ thin film exhibits an RMS roughness from about 0.5 nm to about 15 nm, including exemplary values of about 1 nm, about 2 nm, about 3 nm, about 4 nm, about 5 nm, about 6 nm, about 7 nm, about 8 nm, about 9 nm, about 10 nm, about 11 nm, about 12 nm, about 13 nm, and about 14 nm. In yet further exemplary aspects, an RMS roughness less than about 10 nm, less than about 9.5 nm, less than about 9 nm, less than about 8.5 nm, less than about 8 nm, less than about 7.5 nm, less than about 7 nm, less than about 6.5 nm, less than about 6 nm, less than about 5.5 nm, less than about 5 nm, less than about 4.5 nm, less than about 4 nm, less than about 3.5 nm, less than about 3 nm, less than about 2.5 nm, less than about 2 nm, less than about 1.5 nm, or less than about 1.4 nm, or less than about 1.3 nm, or less than about 1.2 nm, or less than about 1.1 nm, or less than about 1.0 nm, or less than about 0.9 nm, or less than about 0.8 nm, or less than about 0.7 nm, or less than about 0.6 nm, or even less than about 0.5 nm.

In certain aspects, the disclosed herein films can be doped. In certain aspects, the (100) $\beta$-$(Al_xGa_{1-x})_2O_3$ thin film or (−201) $\beta$-$(Al_xGa_{1-x})_2O_3$ thin film further comprises one or more elements selected from Group IV. In such aspects, the elements can comprise Si, Ge, Sn, or a combination thereof. In yet further aspects, the one or more elements comprises Si. In such exemplary aspects, the (100) $\beta$-$(Al_xGa_{1-x})_2O_3$ thin film or (−201) $\beta$-$(Al_xGa_{1-x})_2O_3$ thin film comprises Si in an amount from about $10^{14}$ to less than about $10^{21}$/cm$^3$, including exemplary values of about $10^{15}$/cm$^3$, about $10^{16}$/cm$^3$, about $10^{17}$/cm$^3$, about $10^{18}$/cm$^3$, about $10^{19}$/cm$^3$, and about $10^{20}$/cm$^3$.

Also disclosed herein is a device comprising: a) a substrate comprising (100) $\beta$-$Ga_2O_3$ or (−201) $\beta$-$Ga_2O_3$; and b) at least one layer comprising a (100) $\beta$-$(Al_xGa_{1-x})_2O_3$ thin film or a (−201) $\beta$-$(Al_xGa_{1-x})_2O_3$, wherein x is 0.01≤x≤0.7, and wherein the film comprises at least one impurity selected from hydrogen or carbon. The impurities can be any impurities disclosed herein. It is understood that such impurities can be present in any amount as disclosed herein.

In still further aspects, the device can further comprise at least one additional layer comprising a (100) $\beta$-$(Al_yGa_{1-y})_2O_3$ thin film or a (−201) $\beta$-$(Al_yGa_{1-y})_2O_3$, wherein y is 0.01≤y≤0.7. It is understood that y can be in any amount from 0.01 to about 0.7, including exemplary values of about 0.02, about 0.03, about 0.04, about 0.05, about 0.06, about 0.07, about 0.08, about 0.09, about 0.1, about 0.11, about 0.12, about 0.13, about 0.14, about 0.15, about 0.16, about 0.17, about 0.18, about 0.19, about 0.20, about 0.21, about 0.22, about 0.23, about 0.24, about 0.25, about 0.26, about 0.27, about 0.28, about 0.29, about 0.30, about 0.31, about 0.32, about 0.33, about 0.34, about 0.35, about 0.36, about 0.37, about 0.38, about 0.39, about 0.40, about 0.41, about 0.42, about 0.43, about 0.44, about 0.45, about 0.46, about 0.47, about 0.48, about 0.49, about 0.50, about 0.51, about 0.52, about 0.53, about 0.54, about 0.55, about 0.56, about 0.57, about 0.58, about 0.59, about 0.60, about 0.61, about 0.62, about 0.63, about 0.64, about 0.65, about 0.66, about 0.67, about 0.68, and about 0.69. In yet further aspects, y can have any value between any two foregoing values.

Also, in such aspects, the (100) $\beta$-$(Al_yGa_{1-y})_2O_3$ thin film, or a (−201) $\beta$-$(Al_yGa_{1-y})_2O_3$ can comprise carbon in an amount from about $10^{15}$ to about $10^{19}$/cm$^3$.

As disclosed herein, the devices can comprise the (100) $\beta$-$(Al_xGa_{1-x})_2O_3$ thin film, (−201) $\beta$-$(Al_xGa_{1-x})_2O_3$ thin film, 100) $\beta$-$(Al_yGa_{1-y})_2O_3$ thin film, or a (−201) $\beta$-$(Al_yGa_{1-y})_2O_3$ thin film that are substantially free of 2D island growth modes. While in yet other aspects, the devices comprise the (100) $\beta$-$(Al_xGa_{1-x})_2O_3$ thin film, (−201) $\beta$-$(Al_xGa_{1-x})_2O_3$ thin film, 100) $\beta$-$(Al_yGa_{1-y})_2O_3$ thin film or a (−201) $\beta$-$(Al_yGa_{1-y})_2O_3$ thin film comprising a substantially uniform Al composition distribution throughout a thin film thickness. In such exemplary aspects, the (100) $\beta$-$(Al_xGa_{1-x})_2O_3$ thin film, (−201) $\beta$-$(Al_xGa_{1-x})_2O_3$ thin film, (100) $\beta$-$(Al_yGa_{1-y})_2O_3$ thin film or a (−201) $\beta$-$(Al_yGa_{1-y})_2O_3$ thin film that can be present in the disclosed herein devices are a single-phase (100) film or a single-phase (−201) film, respectively.

In yet further exemplary and unlimiting aspects, the (100) $\beta$-$(Al_xGa_{1-x})_2O_3$ thin film or (−201) $\beta$-$(Al_xGa_{1-x})_2O_3$ thin film, present in the disclosed devices, exhibits an RMS roughness of less than about 10 nm, less than about 9.5 nm, less than about 9 nm, less than about 8.5 nm, less than about 8 nm, less than about 7.5 nm, less than about 7 nm, less than about 6.5 nm, less than about 6 nm, less than about 5.5 nm, less than about 5 nm, less than about 4.5 nm, less than about 4 nm, less than about 3.5 nm, less than about 3 nm, less than about 2.5 nm, less than about 2 nm, less than about 1.5 nm, or less than about 1.4 nm, or less than about 1.3 nm, or less than about 1.2 nm, or less than about 1.1 nm, or less than about 1.0 nm, or less than about 0.9 nm, or less than about 0.8 nm, or less than about 0.7 nm, or less than about 0.6 nm, or even less than about 0.5 nm. However, it is also understood that films can have any RMS, as disclosed above. For example, in some aspects, the (100) $\beta$-$(Al_yGa_{1-y})_2O_3$ thin film or a (−201) $\beta$-$(Al_yGa_{1-y})_2O_3$ thin film, present in the disclosed herein devices, exhibits an RMS roughness 0.5 nm to about 15 nm.

In still further aspects, the (100) $\beta$-$(Al_xGa_{1-x})_2O_3$ thin film, (−201) $\beta$-$(Al_xGa_{1-x})_2O_3$ thin film, 100) $\beta$-$(Al_yGa_{1-y})_2O_3$ thin film or a (−201) $\beta$-$(Al_yGa_{1-y})_2O_3$ thin film can further comprise one or more elements selected from Group IV, for example, Si. In such exemplary aspects, the (100) $\beta$-$(Al_xGa_{1-x})_2O_3$ thin film, (−201) $\beta$-$(Al_xGa_{1-x})_2O_3$ thin film, 100) v$Al_yGa_{1-y})_2O_3$ thin film or a (−201) $\beta$-$(Al_yGa_{1-y})_2O_3$ thin film comprise Si in an amount from about $10^{14}$ to less than about $10^{21}$/cm$^3$, including exemplary values of about $10^{15}$/cm$^3$, about $10^{16}$/cm$^3$, about $10^{17}$/cm$^3$, about $10^{16}$/cm$^3$, about $10^{19}$/cm$^3$, and about $10^{20}$/cm$^3$.

Figure 12A:
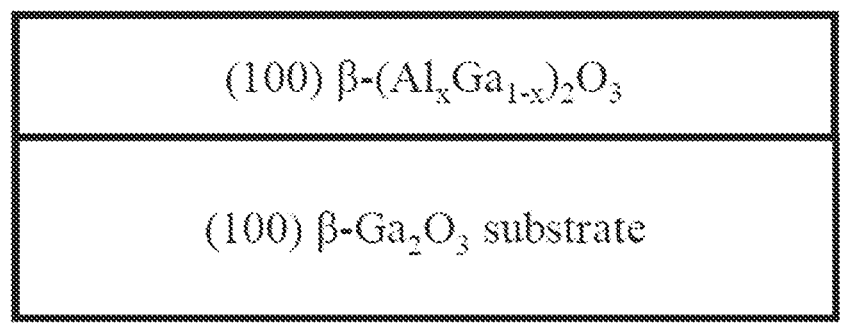
FIGS. 12A-12C show cross-sectional schematics of exemplary devices in some aspects: a cross-section view showing a (100) β-$(Al_xGa_{1-x})_2O_3$/β-$(Al_yGa_{1-y})_2O_3$ heterostructures grown on top of (100) β-$Ga_2O_3$ substrate (similar concept applies to (−201) orientation)-FIG. 12A. A cross-section view showing a (100) β-$(Al_xGa_{1-x})_2O_3$ film grown on top of (100) β-$Ga_2O_3$ substrate. The heterostructure can be composed of more than 2 layers (a similar concept applies to (−201) orientation) (FIG. 12B). A cross-section view showing a (100) β-(Al$_x$Ga$_{1-x}$)$_2$O$_3$ buffer layer grown on top of (100) β-Ga$_2$O$_3$ substrate with (100) β-Ga$_2$O$_3$ grown on top of the buffer layer (similar concept applies to (−201) orientation) (FIG. 12C).
Figure 12B:
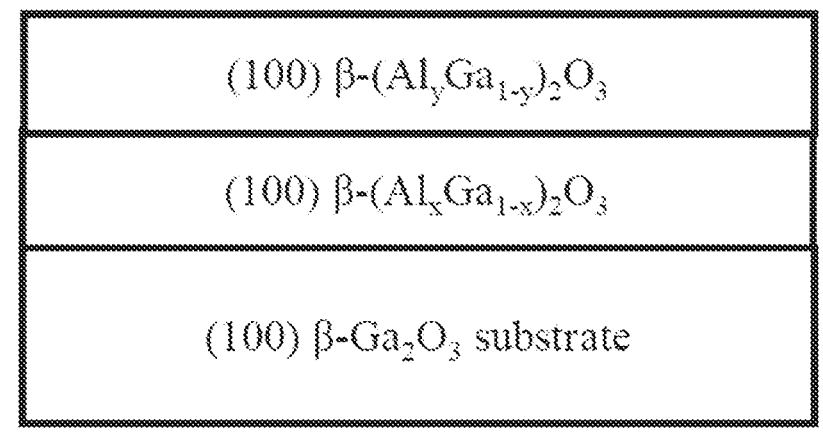
Figure 12C:
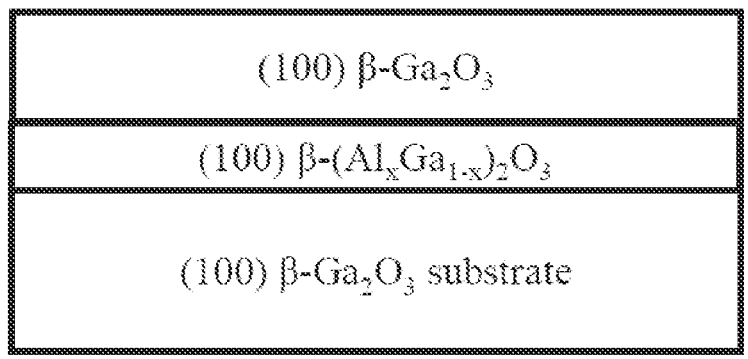

In yet further aspects, also disclosed herein a device further comprising a (100) $\beta$-$Ga_2O_3$ thin film layer or (−201) $\beta$-$Ga_2O_3$ thin film layer disposed on the (100) $\beta$-$(Al_xGa_{1-x})_2O_3$ thin film or (−201) $\beta$-$(Al_xGa_{1-x})_2O_3$ thin film layers. Some exemplary devices are shown in FIG. 12.

The claims are not intended to include, and should not be interpreted to include, means-plus- or step-plus-function limitations, unless such a limitation is explicitly recited in a given claim using the phrase(s) "means for" or "step for," respectively.

In view of the described processes and compositions, hereinbelow are described certain more particularly described aspects of the inventions. These particularly recited aspects should not, however, be interpreted to have any limiting effect on any different claims containing different or more general teachings described herein, or that the "particular" aspects are somehow limited in some way other than the inherent meanings of the language and formulas literally used therein.

EXAMPLES

The following examples are put forth so as to provide those of ordinary skill in the art with a complete disclosure and description of how the compounds, compositions, articles, devices and/or methods claimed herein are made and evaluated and are intended to be purely exemplary and are not intended to limit the disclosure. Efforts have been made to ensure accuracy with respect to numbers (e.g., amounts, temperature, etc.), but some errors and deviations should be accounted for.

Example 1

In this example, (100) oriented $\beta$-$(Al_xGa_{1-x})_2O_3$ thin films on Fe doped semi-insulating (100) $\beta$-$Ga_2O_3$ substrates (provided by Novel Crystal Technology, Inc.) were grown via MOCVD and then investigated utilizing several characterization techniques. Triethylgallium (TEGa), Trimethylaluminum (TMAl), and pure $O_2$ were used as Ga, Al, and O precursors, respectively. Argon (Ar) was used as the carrier gas. The chamber pressure was varied between 20 torr and 80 torr. The growth temperature was tuned between 880° C. and 920° C. Film thicknesses were varied between ~19 nm and ~85 nm. The growth rates of different Al composition samples grown with different chamber pressures were found to be ranged between ~5.3 nm/min and ~13.3 nm/min. [TMAl]/[TEGa+TMAl] molar flow rate ratio was systematically tuned from 2.35% to 22.21%. The group VI/III ratio was varied between 908 and 1140. All substrates were treated with high temperature in-situ annealing for 10 minutes at 920° C. under $O_2$ atmosphere prior to epi-growth.

The crystal quality and the Al compositions of the films were evaluated with XRD measurements by a Bruker D8 Discover. Al compositions and the bandgap energies were calculated using XPS utilizing a Kratos Axis Ultra X-ray photoelectron spectrometer with a monochromatized Al Kα x-ray source ($E_{photon}$=1486.6 eV).

The binding energy scale was referenced to C 1s core levels at 284.8 eV. High angle annular dark-field (HAADF) STEM images of the samples were obtained using a Thermo-Fisher Scientific Titan scanning transmission electron microscopy operated at 300 kV. The microscope was also equipped with a quad-silicon drift detector (Super-X/ChemiSTEM) for X-ray collection, enabling EDS spectral mapping. The film thicknesses were estimated by both Pendellösung fringes observed from XRD spectra and high-resolution STEM images. Al compositions were confirmed by characterization through XRD, XPS, and STEM-EDS mapping. The surface morphology and the surface roughness of the films were characterized via field emission scanning electron microscopy (FESEM, FEI Helios 600) and atomic force microscopy (AFM, Bruker AXS Dimension Icon), respectively.

Example 2

Figure 2:
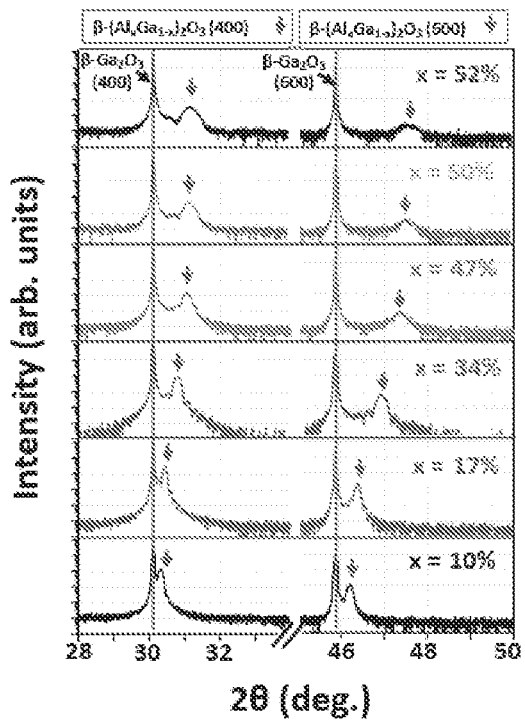
FIG. 2 show XRD ω-2θ patterns for the (400) and (600) reflections of β-$(Al_xGa_{1-x})_2O_3$ films grown on (100) β-$Ga_2O_3$ substrates. Sharp peaks at 30.11° and 45.86° indicate the (400) and (600) reflections from β-$Ga_2O_3$ substrates. Red and blue arrows indicate the XRD peak positions for the (400) and (600) reflections of β-$(Al_xGa_{1-x})_2O_3$ films with x ranging from 10% to 52%.

FIGS. 1 and 2 show the XRD spectra in ω-2θ scanning for (100) β-$(Al_xGa_{1-x})_2O_3$ films with different Al compositions.

The films were grown by varying the [TMAl]/[TEGa+TMAl] molar flow rate ratios from 2.35% to 22.21% and chamber pressures from 50 torr to 80 torr at 880° C. as summarized in Table 1.

TABLE 1

Summary of (100) β-$(Al_xGa_{1-x})_2O_3$ samples (as shown in FIG. 1) grown with different [TMAl]/[TEGa + TMAl] molar flow rate ratios and chamber pressures with corresponding Al compositions, film thicknesses, and growth rates.

| No | [TMAl]/ [TMAl + TEGa] (%) | Al (%) | Chamber pressure (Torr) | Film Thickness (nm) | Growth rate (nm/min) |
|---|---|---|---|---|---|
| 1 | 2.35 | 10 | 80 | ~53 | 5.3 |
| 2 | 3.82 | 17 | 80 | ~85 | 8.5 |
| 3 | 10.36 | 34 | 60 | ~44 | 8.8 |
| 4 | 18.08 | 47 | 50 | ~38 | 9.5 |
| 5 | 20.20 | 50 | 50 | ~19 | 9.5 |
| 6 | 22.21 | 52 | 50 | ~20 | 13.3 |

It was demonstrated that Al incorporations and the growth rates increase with increasing molar flow rate ratio. The sharp and high-intensity X-ray diffraction peaks at 2θ≈30.11° and 45.87°, as shown in FIG. 2, correspond to the signals originating from (400) and (600) reflections of (100) β-$Ga_2O_3$ substrates, respectively. The prominent characteristic diffraction peaks, marked by red and blue arrows, represent the (400) and (600) reflection peaks of (100) β-$(Al_xGa_{1-x})_2O_3$ films, respectively. Without wishing to be bound by any theory, it was found that with increasing Al compositions, the separations between the diffraction peak positions of the β-$Ga_2O_3$ substrates and the β-$(Al_xGa_{1-x})_2O_3$ films increase, indicating an increase in lattice mismatch between the substrate and the epitaxial films. Al compositions were determined by analyzing the separations between the peak positions of the substrate and the epitaxial films, assuming a fully coherent growth of (100) β-$(Al_xGa_{1-x})_2O_3$ films.

By the systematical tuning of the [TMAl]/[TEGa+TMAl] molar flow rate ratios and chamber pressures, up to 52%, Al incorporation in β-phase was identified from both (400) and (600) diffraction peaks of (100) β-$(Al_xGa_{1-x})_2O_3$ films.

It was also found that at lower Al compositions, high-intensity peaks with distinguishable Pendellösung fringes was originated from the epitaxial films, indicating the higher crystalline quality of the films. Without wishing to be bound by any theory, it was found that with increasing Al compositions, the crystalline quality degrades, as evidenced by the decrease of the XRD peak intensities, broadening of the linewidths and lack of discernible Pendellösung fringes. However, again without wishing to be bound by any theory, it was assumed that the lower X-ray scattering factor of Al compared to Ga and relatively smaller thickness of high Al content samples can also partially contribute to the weaker X-ray diffraction peak intensity at higher Al compositions.

Figures 3A, 3B, 3C, 3D:
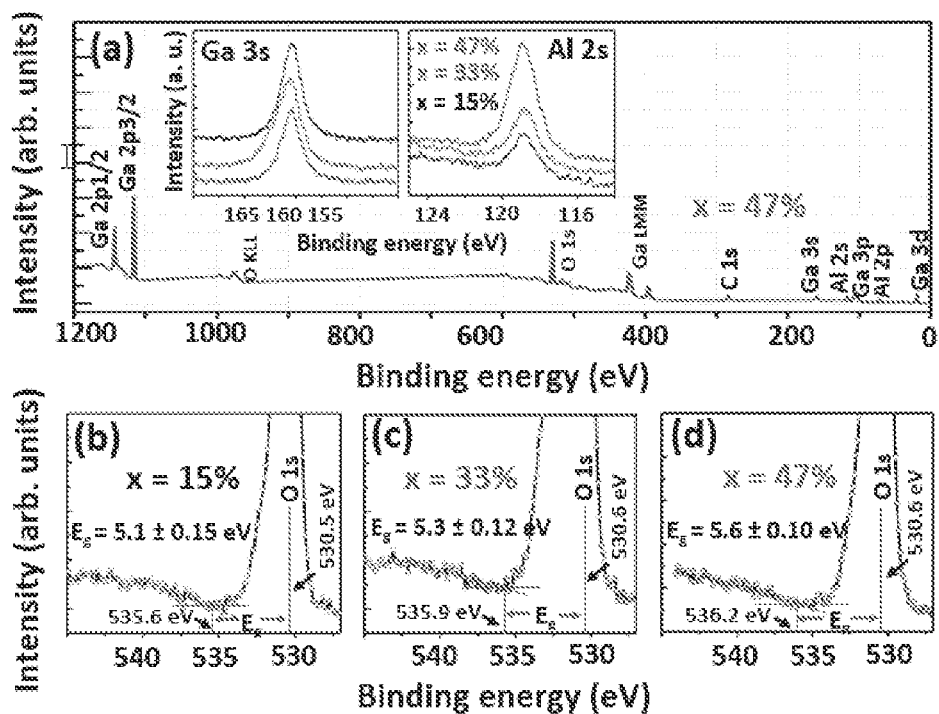
FIGS. 3A-3D show XPS wide scan spectra of (100) β-$(Al_{0.47}Ga_{0.53})_2O_3$, showing the element-specific peaks (FIG. 3A). The insets show the photoemission peaks of Ga 3s and Al 2s core levels for the Al composition of x=47% (blue), 33% (red), and 15% (black). The corresponding bandgap of (100) β-$(Al_xGa_{1-x})_2O_3$ films was determined by the energy difference between O 1s core level peak and the onset of energy loss spectrum for x=15% (FIG. 3B), x=33% (FIG. 3C), and x=47% (FIG. 3D).

In order to identify the elements in (100) β-$(Al_xGa_{1-x})_2O_3$ films and to estimate the Al compositions and bandgaps, high resolution XPS was performed for different Al content samples. FIG. 3(a) shows the XPS survey spectra for a representative β-$(Al_{0.47}Ga_{0.53})_2O_3$ film (Sample No. 4) in the binding energy range from 0 to 1,200 eV.

From the overview scans, no metallic contaminants in the films were detected, indicating high purity growths of β-$(Al_{0.47}Ga_{0.53})_2O_3$ film. The insets of FIG. 2A show the high-resolution XPS spectra of Ga 3s and Al 2s core levels for 15%, 33%, and 47% Al content samples.

It was further found that with increasing Al compositions, the peak intensity of Ga 3s core level decreases, while Al 2s core level increases, resulting in the increase of Al/Ga intensity ratio. Al compositions were determined by estimating Ga and the Al atomic concentrations from the Ga 3s and the Al 2s core level peak areas after applying atomic sensitivity factors that can be found in the literature. It was found that the Al compositions calculated by XRD diffraction peak separations correlate well with the Al compositions estimated by XPS measurements, as shown in Table 2.

TABLE 2

Summary of the Al contents and the bandgaps of (100) β-$(Al_xGa_{1-x})_2O_3$ samples, estimated from XRD and XPS. The calculated direct and indirect bandgaps of β-$(Al_xGa_{1-x})_2O_3$ samples with different content are listed from Ref. 25. The errors in the bandgaps measured from XPS are defined as the root-mean-square errors.

| Sample No. | Al (%) (XRD) | Al % (XPS) | Bandgap (XPS) (eV) | Bandgap [25] (eV) |
|---|---|---|---|---|
| 2 | 17 | 15 | 5.1 ± 0.15 | $5.03^{direct}$, $4.99^{indirect}$ |
| 3 | 34 | 33 | 5.3 ± 0.12 | $5.33^{direct}$, $5.26^{indirect}$ |
| 4 | 47 | 47 | 5.6 ± 0.10 | $5.64^{direct}$, $5.54^{indirect}$ |

In the case of Sample No. 2 and 3, the Al compositions from XRD measurements (17% and 34% Al), which were calculated based on the assumption of fully strained films, slightly overestimate the Al compositions measured by XPS (15% and 33% Al). With ~80 nm (Sample No. 2) and ~44 nm (Sample No. 3) thicknesses, the films may not be fully strained (partial relaxation), which can result in the overestimation of the Al compositions.

By using XPS, the bandgap energies of (100) β-$(Al_xGa_{1-x})_2O_3$ films were also calculated. XPS can be used to analyze inelastic collisions that can happen during photoexcitation and photoemission of electrons from the sample.

Without wishing to be bound by any theory, it was assumed that due to inelastic collisions, such as band-to-band electronic transitions and excitation of "plasma waves" by coulombic interaction with electrons in the valence band, the photoexcited electrons can lose their final kinetic energy, which can be measured by XPS detector. These "loss spectra" peaks appeared as widened copies of the core-level peaks shifted towards higher binding energy relative to their original levels. As the fundamental lower limit of inelastic loss is equal to the bandgap energy, the onset of inelastic energy loss spectra relative to the core level peak corresponds to the bandgap energy.

By measuring the onset of inelastic loss relative to the O 1s core-level peaks, the bandgaps of (100) β-$(Al_xGa_{1-x})_2O_3$ films with different Al compositions were estimated as shown in FIGS. 3B-3D. Again, without wishing to be bound by any theory, the energy corresponding to the onset of the loss spectra was estimated by calculating the intersection of the linear fitting of the loss spectra curve and its background 'zero' level, which was determined by subtracting the Shirley background fitting. The bandgap energies of (100) β-$(Al_xGa_{1-x})_2O_3$ films with x=15%, 33% and 47% were calculated as $E_g$=5.1±0.15 eV, 5.3±0.12 eV, and 5.6±0.1 eV, respectively. The bandgap energies estimated by the XPS measurement are found to be substantially in agreement with the values calculated by using first-principles hybrid density functional theory (DFT), as listed in Table 2.

Example 3

Figures 4A, 4B, 4C:
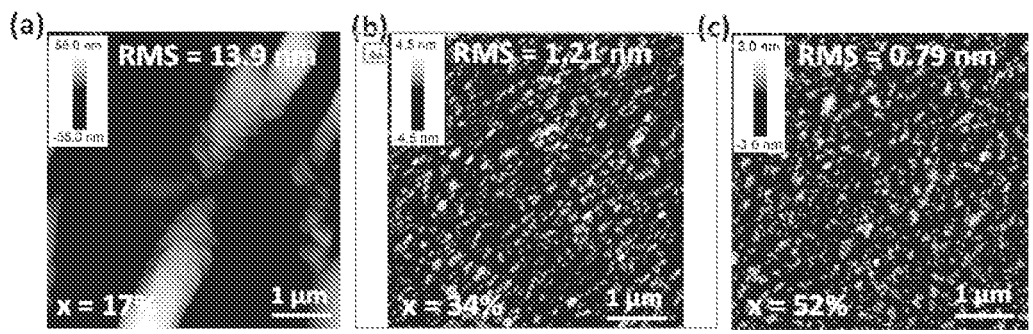
FIGS. 4A-4C show surface topographic images of (100) β-$(Al_xGa_{1-x})_2O_3$ films with x=17% (FIG. 4A), x=34% (FIG. 4B), and x=52% (FIG. 4C) captured by AFM. The scan area is 5×5 μm².
Figures 5A, 5B, 5C, 5D:
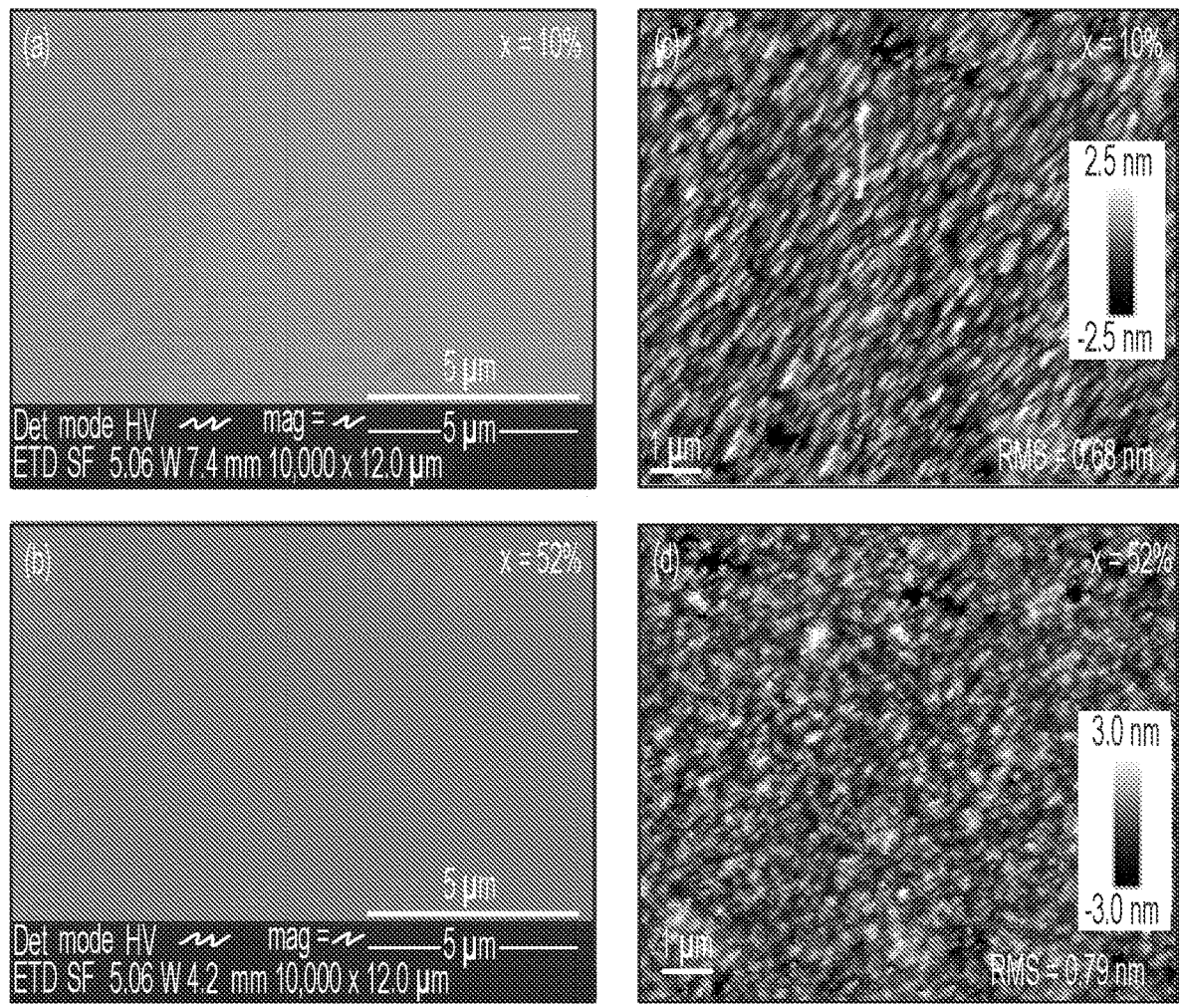
FIGS. 5A-5D show surface view FESEM images of (100) β-$(Al_xGa_{1-x})_2O_3$ films grown on (100) β-$Ga_2O_3$ substrates with Al compositions of x=10% (FIG. 5A), and x=52% (FIG. 5B) with a film thickness of 53 nm and 20 nm, respectively. The corresponding surface topographic images of (100) β-$(Al_xGa_{1-x})_2O_3$ films with x=10% (FIG. 5C) and x=52% (FIG. 5D) were measured by AFM. The scan area is 5×5 μm².

The surface morphology of (100) β-$(Al_xGa_{1-x})_2O_3$ films was further characterized by both FESEM and AFM imaging (FIGS. 4-5). FIGS. 5A and 5B show the surface view SEM images of two β-$(Al_xGa_{1-x})_2O_3$ films with 10% (Sample No. 1; 53 nm thick) and 52% (Sample No. 6; ~20 nm thick) Al compositions, respectively. The films were grown by varying the TMAl molar flow rates with optimized growth conditions. The SEM image for the 10% Al composition sample shows the presence of granular protrusions on the surface, as observed in FIG. 5A, whereas the surface for the higher Al composition (52%) sample exhibits almost uniform and featureless morphology (FIG. 5B).

While a previous PLD growth study of (100) β-$(Al_xGa_{1-x})_2O_3$ films has indicated the formations of protrusions that can be related to the quality of the target materials (as shown in Ref. 35), this study has found that the surface of the epitaxial films becomes flat and smooth without visible protrusions with increasing Al incorporation.

The surface morphology and root mean square (RMS) roughness for the same samples were also investigated by AFM imaging with a scanning area of 5 μm×5 μm. As shown in FIGS. 5C and 5D, the AFM images exhibit uniform and smooth surface morphologies with RMS roughness values less than 0.8 nm for both 10% and 52% Al composition samples, respectively, indicating the growth of high quality of the (100) β-$(Al_xGa_{1-x})_2O_3$ films.

Example 4

To further investigate the effect of higher Al incorporation in the β-$(Al_xGa_{1-x})_2O_3$ films, the surface morphology of different samples grown with the same thickness (~170 nm) and the same growth conditions, but with varied Al compositions are compared by FESEM images.

Figures 6A, 6B, 6C, 6D:
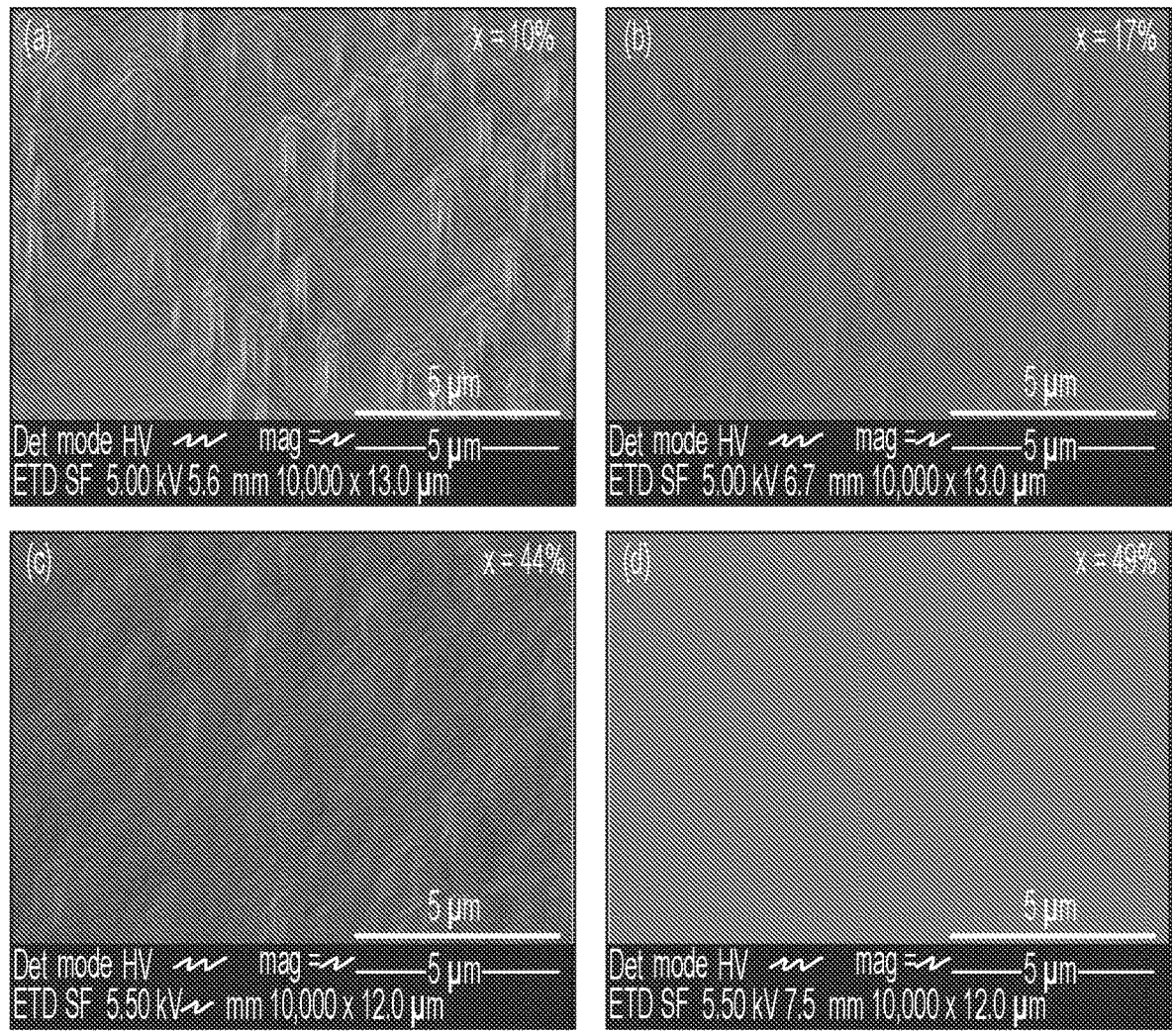
FIGS. 6A-6D show surface view FESEM images of ~170 nm thick (100) β-$(Al_xGa_{1-x})_2O_3$ films grown with Al compositions of x=10% (FIG. 6A), x=17% (FIG. 6B), x=44% (FIG. 6C), and x=49% (FIG. 6D). The films were grown epitaxially on (100) β-$Ga_2O_3$ substrates at 880° C. with a chamber pressure of 20 Torr.

FIGS. 6A-6D show the surface view FESEM images of β-$(Al_xGa_{1-x})_2O_3$ films with an Al composition of 10% to 49%. The films were grown at 880° C. with the same chamber pressure (20 Torr). At relatively lower Al compositions, it was found that the surface exhibits nonuniformity with bump-like three-dimensional island structures. Without wishing to be bound by any theory, it was hypothesized that the Ga adatoms, due to the lack of energetically favorable sufficient nucleation sites, attach to other Ga adatoms and nucleate a new island, leading to the roughening of the surface, as observed in FIGS. 6A-6B. As the Al molar flow rate increases, for example, in the case of 49% Al, the surface uniformity is significantly enhanced, and the surface morphology evolves from three-dimensional surface roughness to progressive smoothness, as shown in FIG. 6D. Again, without wishing to be bound by any theory, it was assumed that at relatively higher Al molar flow rates, Al adatoms provide more distribution of nucleation sites, which suppress the 2D island growth modes and enhance the surface uniformity with smooth morphology.

While obtaining smooth and flat surface is difficult on on-axis (100) β-$Ga_2O_3$ due to both surface anisotropy of the β-Gallia structure and lack of energetically favorable nucleation, the present disclosure has observed surface smoothing with increasing Al compositions, indicating higher incorporation of Al adatoms on the growth surface promoting step-flow growth with surface homogeneity. The schematic of the proposed step-flow growth mechanism, promoted by the incorporation of higher Al in (100) β-$(Al_xGa_{1-x})_2O_3$ film, is illustrated in FIG. 7.

Previous studies have shown that the step-flow growth of the β-$Ga_2O_3$ films was achieved on (100) native substrates only with higher miscut-angels, wherein the surface steps act as the preferred incorporation sites for the Ga adatoms. While the lower adatom incorporation efficiency, due to the lack of energetically favorable lattice sites, such as surface steps or kinks, can lead to random nucleation and 2D island formation on the on-axis (100) β-$Ga_2O_3$ substrates, as illustrated in FIG. 7A, without wishing to be bound by any theory, the inventors have proposed a mechanism for step flow growth on on-axis (100) substrates that considers Al as a preferential binding site for Ga adatoms.

Figures 7A, 7B:
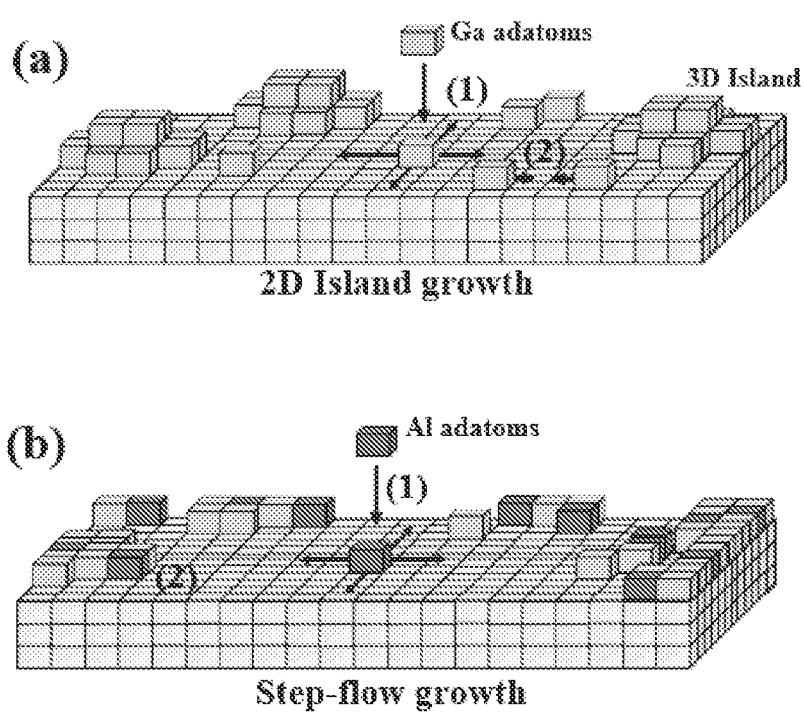
FIGS. 7A-B show schematic illustrations of the proposed growth mechanism of β-$(Al_xGa_{1-x})_2O_3$ films grown on (100) β-$Ga_2O_3$ substrates.

FIG. 7B illustrates the proposed processes involved in the step-flow growth of the β-$(Al_xGa_{1-x})_2O_3$ film on (100) native substrates. As known, Al adatoms have a much larger sticking coefficient than Ga adatoms, and therefore, they are less likely to move on the growth surface from their point of impact from the vapor. As soon as the Al adatoms reach the growth surface, they are absorbed, nucleated, and distributed densely on the surface due to their higher affinity to oxidize as compared to Ga. Without wishing to be bound by any theory, it was assumed that these densely distributed Al sites on the growth surface can act as the preferential nucleation sites for Ga adatoms and eventually can promote the step-flow growth on in-plane (100) native substrates. Increasing the Al incorporation can provide more densely distributed Al sites, thus leading to the step-flow growth of the $\beta$-(Al$_x$Ga$_{1-x}$)$_2$O$_3$ film with enhanced surface smoothness and uniformity.

Figures 8A, 8B, 8C, 8D, 8E:
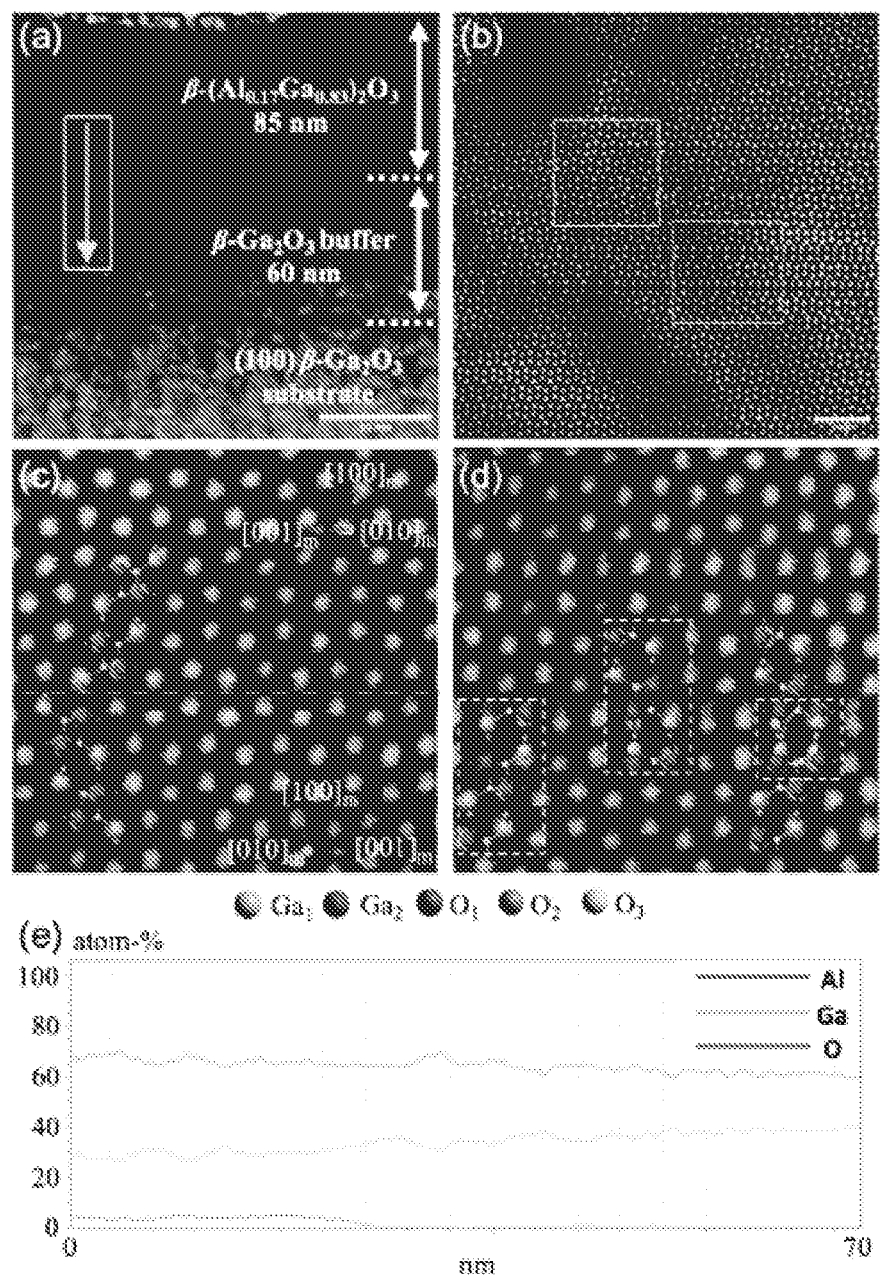
FIGS. 8A-8E show high-resolution HAADF-STEM images and EDS taken from the [010]m zone axis of an 85 nm thick β-$(Al_{0.17}Ga_{0.33})_2O_3$ film with a 60 nm thick (100) β-$Ga_2O_3$ buffer layer grown on top of (100) β-$Ga_2O_3$ substrate.

Utilizing atomic-resolution STEM, the exact structure, including extended defects, and composition of the $\beta$-(Al$_{0.17}$Ga$_{0.33}$)$_2$O$_3$ film (Sample No. 2) was analyzed. FIG. 8A shows a HAADF-STEM image of an 85 nm $\beta$-(Al$_{0.17}$Ga$_{0.33}$)$_2$O$_3$ film grown on (100) $\beta$-Ga$_2$O$_3$. Without wishing to be bound by any theory, it was suggested that based on the lack of contrast within the film and at the interface, high-quality epitaxial films can be obtained. These findings correlate with the observed sharp peak in the XRD spectrum, as shown in FIG. 2. At higher magnification, as shown in FIG. 8B, the HAADF image reveals the [010] cross-section of the $\beta$-phase film. Additionally, extended defects were observed at the atomic scale and are better shown in FIGS. 8C and 8D, which display the blue and orange regions, respectively, and are outlined in FIG. 8B.

The structure, as shown in FIG. 8C reveals a typical defect found in $\beta$-Ga$_2$O$_3$ bulk crystals and films—a twin (as shown in Ref. 23, 44-46). The twin boundary is marked with the red-dashed line, which lies in the (100) plane. This twin is detailed by a mirror at the boundary plane and a translation in the [001]$_m$. Previously, twin formation has been described by the double positioning mechanism. This mechanism suggests a higher density of twins at smaller miscut-angles due to the predominant 2D island growth. The films disclosed herein are grown with an ~0° miscut-angle, and therefore the twins can be formed.

Additionally, and without wishing to be bound by any theory, it was hypothesized that although the incorporation of Al promotes the step flow growth of the film, it can also play a role in the development of defects like these twins. The defects shown in FIG. 8D, extending in the [001]$_m$ for a half unit cell in the growth direction, display twin boundaries in the (100) and (010) planes.

At an (010) plane located within the thickness of the film foil, the crystal structure mirrors the matrix. This is depicted by overlaying the matrix structure (yellow outline) with the twinned structure (aqua outlined), resulting in staggered Ga atomic columns (green outline), which produces the intensities in the HAADF image. Immediately after the following half unit cell, the same defect is observed. An atomic column intensity analysis is still required to identify the role of Al on the formation of this defect. EDS performed on this film revealed a homogenous distribution of Al in the film with the expected 17% incorporation (FIG. 8E).

Example 5

Figures 9A, 9B, 9C:
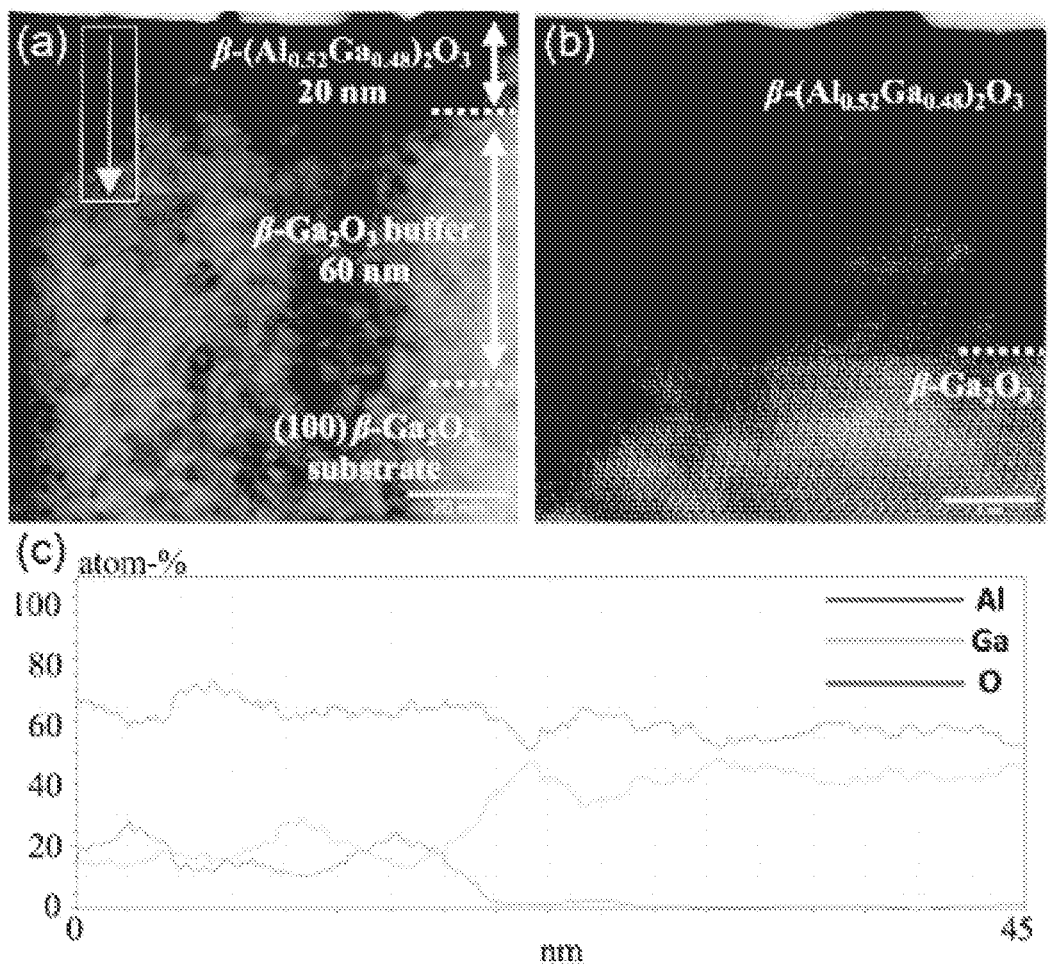
FIGS. 9A-9C show high-resolution HAADF-STEM images taken from the $[010]_m$ zone axis of the 20 nm thick β-$(Al_{0.52}Ga_{0.48})_2O_3$ film with a 60 nm thick (100) β-$Ga_2O_3$ buffer layer grown on top of (100) β-$Ga_2O_3$ substrate at 20 nm (FIG. 9A) and 5 nm scales (FIG. 9B). STEM-EDS profiles (FIG. 9C) for Al (blue), Ga (green), and O (red) in the (100) β-$(Al_{0.52}Ga_{0.43})_2O_3$ film from the yellow region in (FIG. 9A).

The $\beta$-(Al$_{0.52}$Ga$_{0.48}$)$_2$O$_3$ film (Sample No. 6) grown on (100) $\beta$-Ga$_2$O$_3$ was analyzed using STEM to determine the quality of its structure and composition. FIG. 9 shows the results of HAADF-STEM imaging and EDS. The images in FIGS. 9A and 9B show the epitaxial growth of the 20 nm (100) $\beta$-(Al$_{0.52}$Ga$_{0.48}$)$_2$O$_3$ film. The contrast change in the film in both images results from the incorporation of the lighter Al species. However, as shown in FIG. 9B, the Al tends to segregate rather than homogeneously distribute amongst the film, which can be identified by the intensity variation. Additionally, a high density of twin boundaries and extended defects, such as those observed in the $\beta$-(Al$_{0.17}$Ga$_{0.33}$)$_2$O$_3$ film, are scattered throughout the film. The local segregation of Al is also detected by EDS (FIG. 9C), with local composition ranging from 30% to 64%, with an average value of ~48%.

Example 6

In this example, the growth of (100) $\beta$-(Al$_x$Ga$_{1-x}$)$_2$O$_3$ superlattice (SL) structures with different Al compositions was investigated.

Figures 10A, 10B, 10C, 10D:
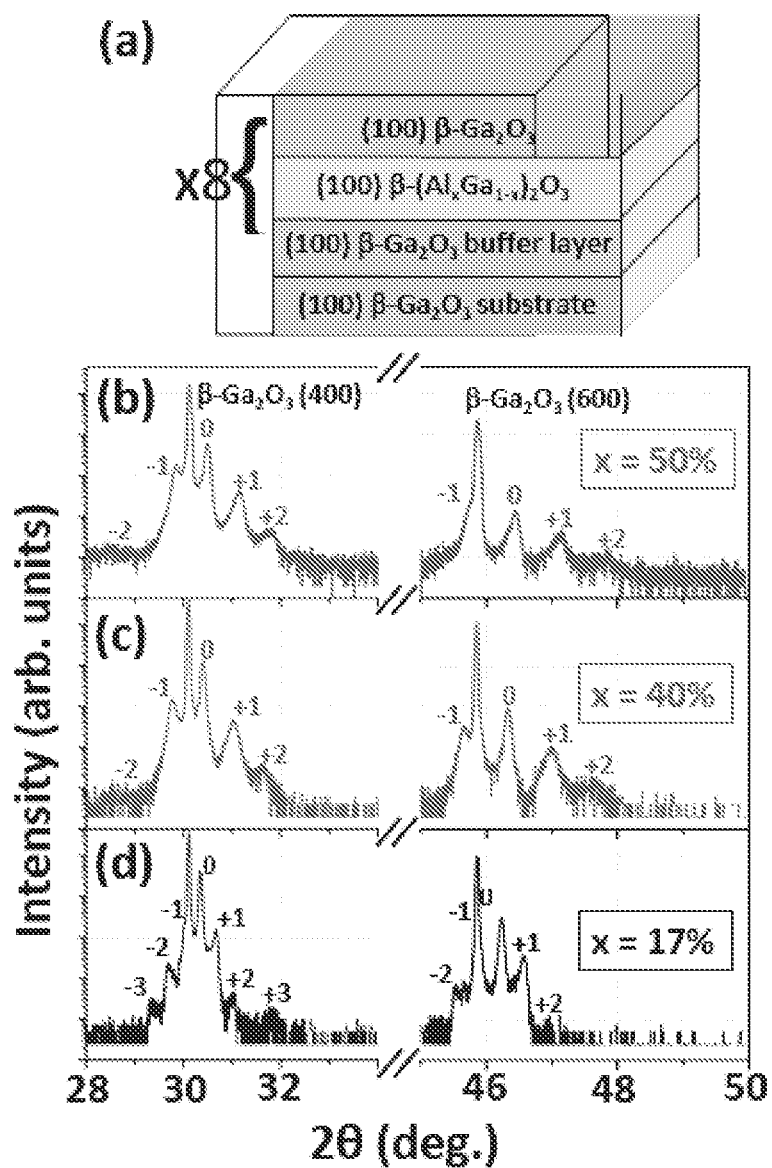
FIGS. 10A-10D show a schematic of the 8-period (100) β-$(Al_xGa_{1-x})_2O_3$/β-$Ga_2O_3$ superlattice structures grown with 60 nm thick (100) β-$Ga_2O_3$ buffer layer grown on top of (100) β-$Ga_2O_3$ substrate (FIG. 10A). XRD ω-2θ scan profiles for (400) and (600) reflections period (100) β-$(Al_xGa_{1-x})_2O_3$/β-$Ga_2O_3$ superlattice structures with Al composition of 50% (blue) (FIG. 10B); 40% (red) (FIG. 10C), and 17% (black) (FIG. 10D).

FIG. 10 shows the schematic of the SL structure grown with 8 periods of AlGaO/GaO layers on top of an unintentionally doped (UID) 60 nm thick $\beta$-Ga$_2$O$_3$ buffer layer by targeting 50%, 40% and 17% of Al compositions in AlGaO barrier layers. The targeted thicknesses of AlGaO barrier layers for both 50% and 40% Al content SL structures were 5 nm with 10 nm of GaO well thicknesses (15 nm period), whereas for 17% Al content SL structure, the targeted barrier and well thicknesses were 15 nm and 10 nm, respectively (25 nm period). The structural quality and the abruptness of the AlGaO/GaO interfaces were evaluated from both (400) and (600) reflections of (100) $\beta$-(Al$_x$Ga$_{1-x}$)$_2$O$_3$/Ga$_2$O$_3$SL structures by utilizing XRD spectra as shown in FIGS. 8A-8D. The high-intensity satellites, along with strong 0$^{th}$ order peaks, were observed from the XRD spectra. The SL structure grown with 17% Al composition shows up to 3$^{rd}$ order of satellite peaks with a strong 0$^{th}$ order peak. With increasing Al contents, the 0$^{th}$ order peak shifts towards higher 2$\theta$ angles, indicating the increase of average Al compositions for the entire SL structures. The average Al compositions calculated from the separation between the 0$^{th}$ order peak and the substrate peak positions were 11.5%, 14.9% and 18.9% (corresponding targeted average Al compositions: 10.2%, 13.3%, and 16.7%) for x=17%, 40%, and 50%, respectively, and the periods estimated from the interval distances between adjacent satellite peaks were 26.6 nm, 14.6 nm, 14.1 nm (corresponding targeted periods: 25 nm, 15 nm, and 15 nm), respectively.

The average Al compositions and the periods calculated from XRD peak positions for each SL structure were found to be in good agreement with the targeted average Al compositions of the entire superlattice structures and the periods. The XRD spectra for different Al compositions exhibit very sharp and distinguishable high order satellite peaks, indicating the coherent growth of high-quality superlattice structures with abrupt interfaces, even with 50% of Al compositions.

Figures 11A, 11B, 11C, 11D, 11E:
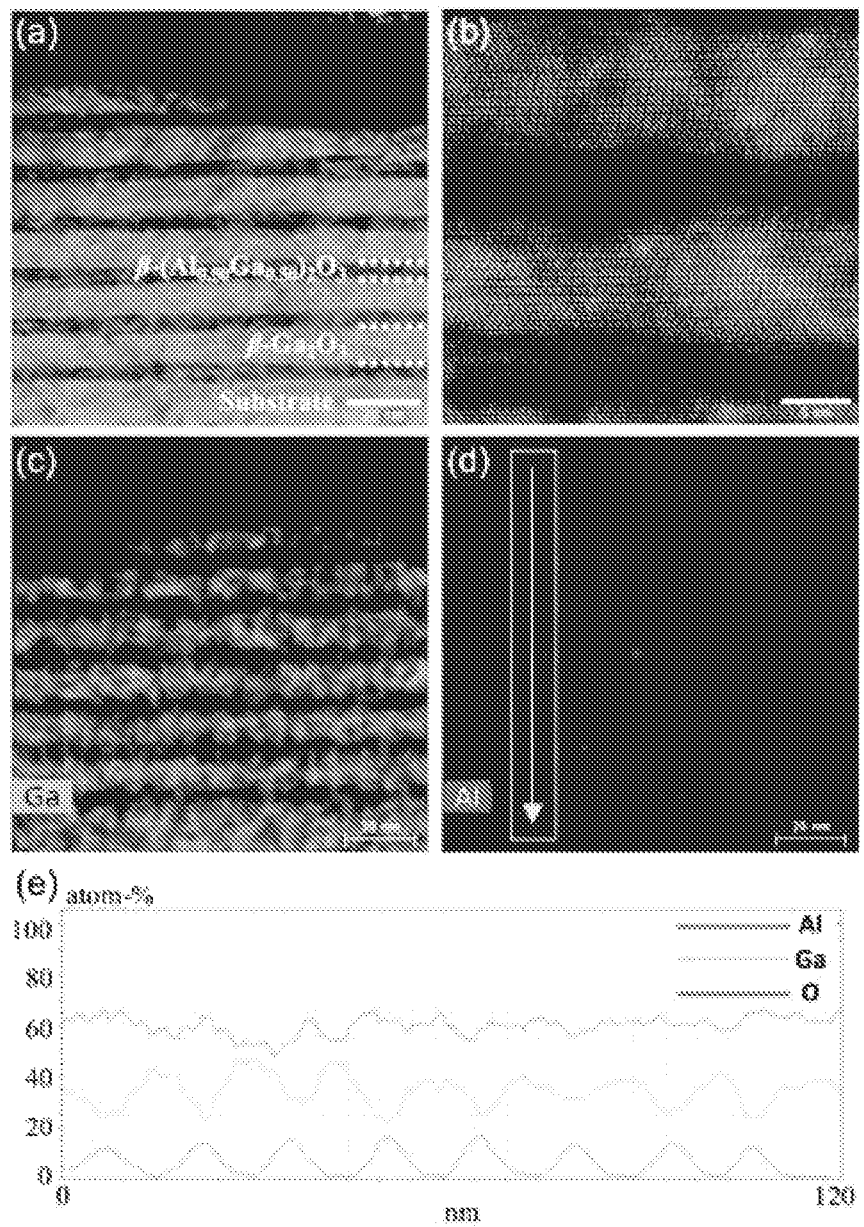
FIGS. 11A-11E show high-resolution HAADF-STEM images of the 8-period (100) β-$(Al_xGa_{1-x})_2O_3$/β-$Ga_2O_3$ superlattice grown on (100) β-$Ga_2O_3$ substrate at 20 nm (FIG. 11A), 5 nm scales and associated EDS maps (FIG. 11B) for Ga (FIG. 11C) and Al (FIG. 11D).

STEM imaging also revealed high-quality of the (100) $\beta$-(Al$_x$Ga$_{1-x}$)$_2$O$_3$/Ga$_2$O$_3$SL structures. The AlGaO barrier layers in the SL structure were grown with targeted 50% Al compositions. The HAADF-STEM images, shown in FIGS. 11A and 11B display the alternating (100) $\beta$-(Al$_x$Ga$_{1-x}$)$_2$O$_3$/Ga$_2$O$_3$SL structures with sub-layers of ~5 nm (100) $\beta$-(Al$_x$Ga$_{1-x}$)$_2$O$_3$ exhibiting dark contrast from the high Al concentration. The images show that the superlattice structure maintains the beta phase throughout the entire structure. The EDS color maps in FIGS. 11C and 11D correspond to Ga and Al concentrations from the plot in FIG. 11E. This data demonstrates the alternating compositional profile of the periodic structure with the $\beta$-(Al$_x$Ga$_{1-x}$)$_2$O$_3$ layers. The Al content in $\beta$-(Al$_x$Ga$_{1-x}$)$_2$O$_3$ layer calculated by using the average Al composition (18.9%) and the period (14.1 nm) from the XRD measurement (FIG. 10) is found to be ~50%, the slight compositional deviation from EDS mapping can be related to the nonuniformity of Al distribution in (Al$_x$Ga$_{1-x}$)$_2$O$_3$ layers scanned along the direction indicated by the yellow arrow in FIG. 11D.

The MOCVD epitaxy of (100) $\beta$-(Al$_x$Ga$_{1-x}$)$_2$O$_3$ films and $\beta$-(Al$_x$Ga$_{1-x}$)$_2$O$_3$/Ga$_2$O$_3$ superlattice structures that are grown on (100) native substrates with up to 52% of Al compositions has been shown herein. High crystalline quality film with smooth surface morphology was achieved at high Al composition samples by systematical tuning of the growth parameters, including growth temperature, chamber pressure, VI/III ratio, etc. Cross-sectional STEM images and EDS mapping for both thin films and superlattice structures exhibited abrupt GaO/AlGaO interfaces with homogenous Al distribution. Twin boundary defects were observed in the epitaxial films. Smooth and uniform surface morphology observed for high Al composition samples revealed high-quality step-flow growth promoted by higher Al incorporation, where Al adatoms act as preferential nucleation sites for AlGaO growth. The successful development of high-quality epitaxy of pure (100) $\beta$-$(Al_xGa_{1-x})_2O_3$ films and $\beta$-$(Al_xGa_{1-x})_2O_3$/$Ga_2O_3$ superlattice structures with high-Al composition will enable device technologies based on this emerging ultrawide bandgap semiconductor material system.

Example 7

In this Example, $\beta$-$(Al_xGa_{1-x})_2O_3$ thin films on (−201) $\beta$-$Ga_2O_3$ substrates were prepared and investigated. By systematic mapping of the growth parameters, including the precursor flow rate, chamber pressure, and growth temperature, Al incorporation up to 48% in pure $\beta$-phase $(Al_xGa_{1-x})_2O_3$ films was demonstrated. Coherent growth of (−201) $\beta$-$(Al_xGa_{1-x})_2O_3$/$Ga_2O_3$ superlattice structures with various Al compositions was also achieved. Comprehensive characterization via X-ray diffraction (XRD, Bruker D8 Discover), high resolution scanning transmission electron microscopy (HRSTEM, Thermo Fisher Scientific Titan and Themis Z) imaging, energy dispersive x-ray spectroscopy (EDS) mapping, scanning electron microscopy (SEM, FEI Helios 600), and atomic force microscopy (AFM, Bruker ICON) has revealed phase pure epitaxy of (−201) $\beta$-$(Al_xGa_{1-x})_2O_3$ films and (−201) $\beta$-$(Al_xGa_{1-x})_2O_3$/$Ga_2O_3$ superlattice (SL) structures with Al compositions close to 50%. Al compositions and energy bandgaps were further extracted from X-ray photoelectron spectroscopy (XPS, Kratos AxisUltra XPS). The binding energy scale was referenced to the C 1s core level (284.8 eV).

Commercially acquired Sn doped (−201) $\beta$-$Ga_2O_3$ substrates (NCT, Inc.) were used for MOCVD growth. High temperature (920° C.) in situ annealing under an $O_2$ atmosphere was employed for 10 min prior to the $(Al_xGa_{1-x})_2O_3$ growth.

Trimethylaluminum (TMAl), Triethylgallium (TEGa), and pure $O_2$ were used as Al, Ga, and O precursors, respectively. Argon was used as the carrier gas. The explored growth window included a varying chamber pressure between 20 and 80 Torr, a growth temperature between 880 and 920° C., a constant $O_2$ flow rate of 500 sccm, and a [TMAl]/[TMAl+TEGa] molar flow rate ratio between 2.35% and 18.08%.

Figure 13:
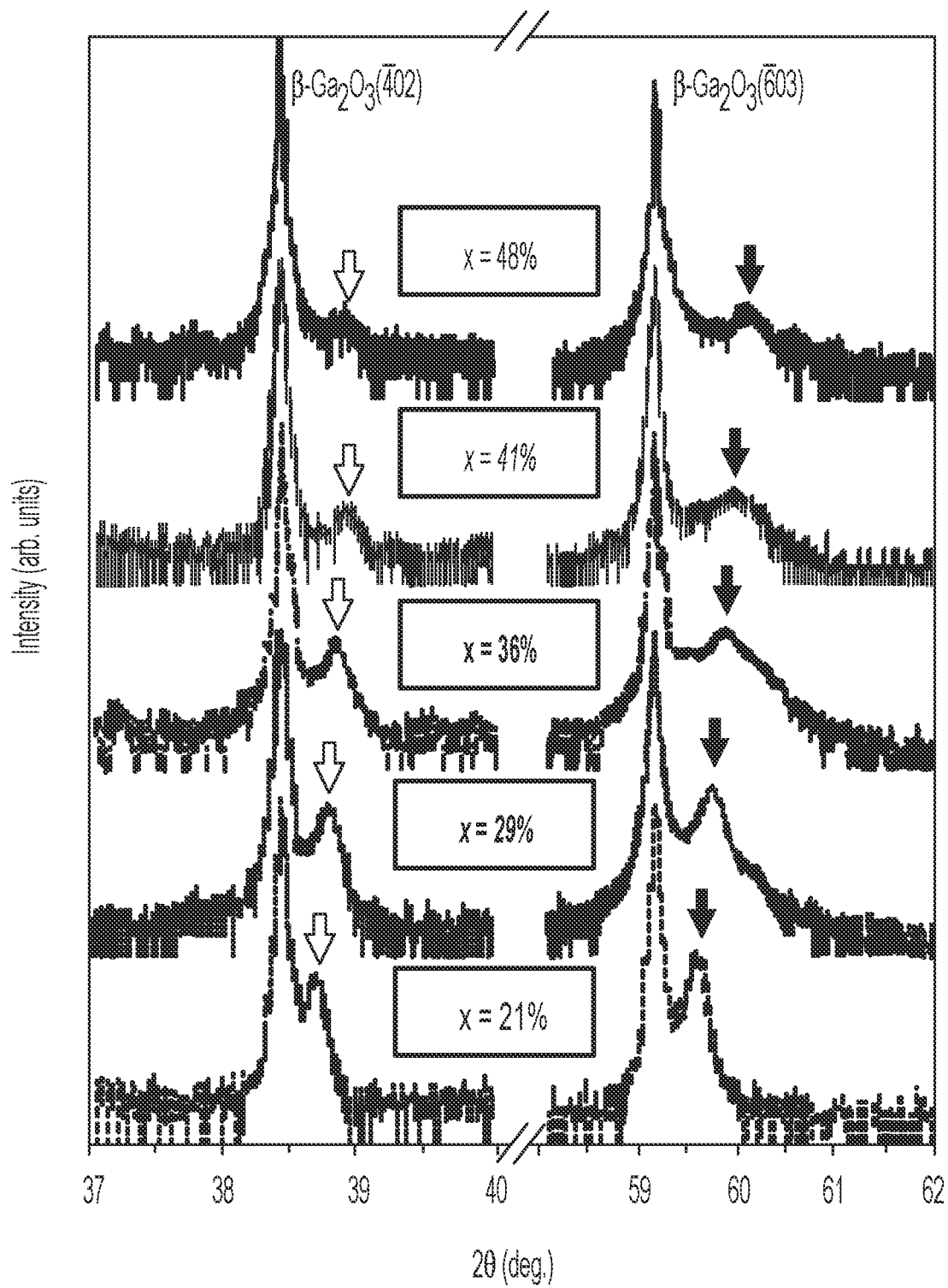
FIG. 13 shows XRD ω-2θ spectra for (−402) and (−603) reflections from (−201) β-(Al$_x$Ga$_{1-x}$)$_2$O$_3$ films with different Al compositions: 21%, 29%, 36%, 41%, and 48%. The (−402) and (−603) reflections from (−201) β-Ga$_2$O$_3$ are represented by the high intensity diffraction peaks at 2θ≈38.44° and 59.18°, respectively. Blue and green arrows indicate the (−402) and (−603) reflections of bβ-(Al$_x$Ga$_{1-x}$)$_2$O$_3$ films, respectively.

The XRD 2θ-ω spectra for (−402) and (−603) reflections of $\beta$-$(Al_xGa_{1-x})_2O_3$ films with x=21%, 29%, 36%, 41%, and 48% was measured and is shown in FIG. 13. All films were grown on $\beta$-$Ga_2O_3$ substrates at 880° C. and 20 Torr with thicknesses estimated between 155 nm and 197 nm as listed in Table 3. The general trend showed that the film thicknesses increase with the increasing [TMAl]/[TMAl+TEGa] molar flow rate ratio. XRD peaks at 2θ=38.44° and 2θ=59.18° correspond to the (−402) and (−603) crystal planes of $\beta$-$Ga_2O_3$ substrates, respectively. By varying the [TMAl]/[TMAl+TEGa] molar flow rate ratio from 2.35% to 18.08%, $\beta$-$(Al_xGa_{1-x})_2O_3$ films with increasing Al up to 48% were obtained based on the shift of both (−402) and (−603) peaks, using Vegard's law.

High-resolution XPS measurements on the series of $\beta$-$(Al_xGa_{1-x})_2O_3$ samples were performed to verify the Al compositions and to extract the energy bandgaps. Wide survey scans in the binding energy range of 0-1200 eV for $\beta$-$(Al_xGa_{1-x})_2O_3$ films with different Al compositions were performed. The XPS peaks for Ga, Al, and O were identified, without the presence of other metallic contaminants. The Al compositions were determined using Al 2s and Ga 3s core level peak areas and their corresponding relative sensitivity factors, which agree well with the values extracted from XRD listed in Table 3.

TABLE 3

Summary of (−201) for $\beta$-$(Al_xGa_{1-x})_2O_3$ samples grown with different [TMAI]/[TMAI + TEGa] molar flow rate rations, film thickness, and their corresponding Al compositions and bandgap energies estimated from XRD and XPS characterization.

| Sample No. | [TMAI]/ [TMAI + TEGa], % | Thickness, nm | Al compos. (XRD, %) | Al compos. (XPS, %) | Bandgap energies, eV |
|---|---|---|---|---|---|
| 1 | 2.35 | ~155 | 21 | 20.58 | 5.20 ± 0.06 |
| 2 | 3.82 | ~173 | 29 | 28.10 | 5.35 ± 0.04 |
| 3 | 7.27 | ~167 | 36 | 35.23 | 5.44 ± 0.08 |
| 4 | 10.36 | ~177 | 41 | 41.48 | 5.54 ± 0.05 |
| 5 | 18.08 | ~197 | 48 | 47.94 | 5.72 ± 0.08 |

Figures 14A, 14B, 14C, 14D, 14E:
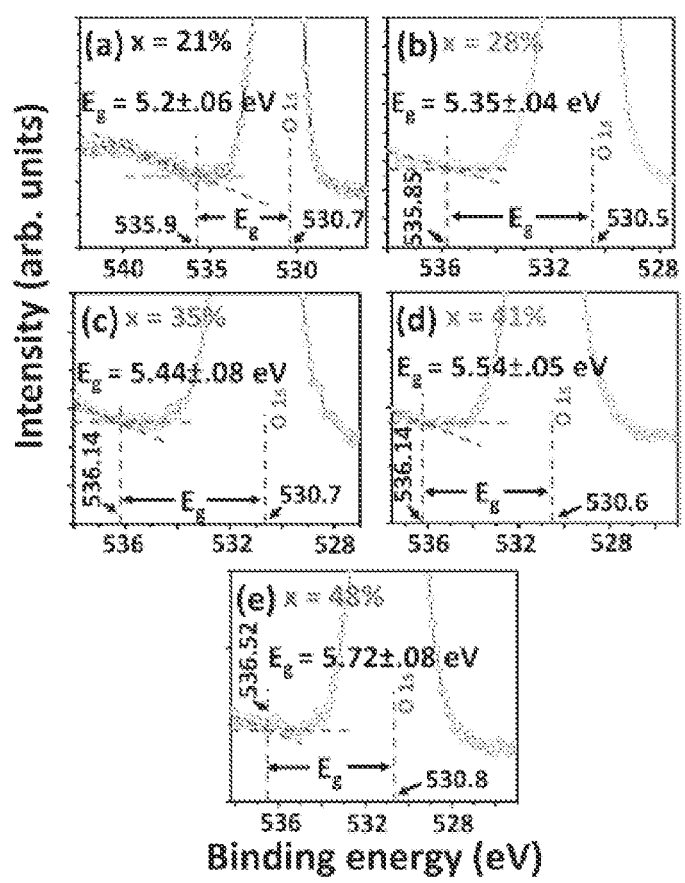
FIGS. 14A-14E depict the bandgap energies of (−201) β-(Al$_x$Ga$_{1-x}$)$_2$O$_3$ films determined by the energy difference of the O 1s core level peak and the onset of the energy loss spectrum for x=21% (FIG. 14A), x=28% (FIG. 14B), x=35% (FIG. 14C), x=41% (FIG. 14D), and x=48% (FIG. 14E).
Figures 15A, 15B, 15C, 15D:
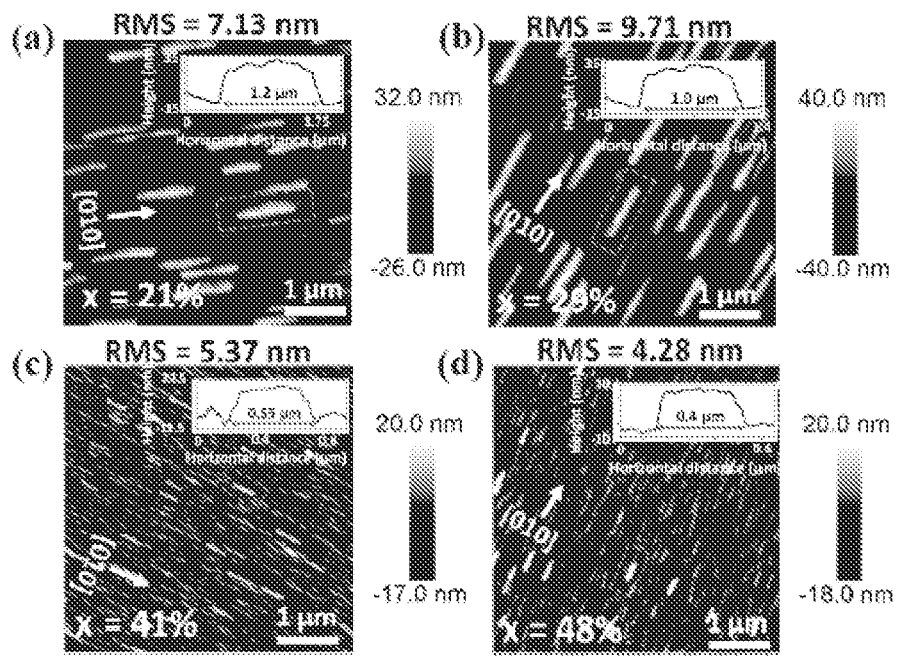
FIGS. 15A-15D depict AFM images (scan area: 5×5 μm$^2$) for (−201) β-(Al$_x$Ga$_{1-x}$)$_2$O$_3$ films grown with Al compositions of x=21% (FIG. 15A), x=29% (FIG. 15B), x=41% (FIG. 15C), and x=48% (FIG. 15D). One-dimensional (1 D) height profiles, showing the maximum height and the length of the granules, are included in the inset.

The energy bandgaps of the $\beta$-$(Al_xGa_{1-x})_2O_3$ films were further characterized by XPS through analyzing the inelastic collisions that occur during photoexcitation and photoemission of electrons. Utilizing the energy loss peak of the O 1s spectrum to estimate the energy bandgap for various wide bandgap semiconductors has been demonstrated previously. FIG. 14 shows the O 1s core-level peaks for $\beta$-$(Al_xGa_{1-x})_2O_3$ films with x=21%, 28%, 35%, 41%, and 48%. Energy bandgap values were extracted from the difference in the onset of the inelastic loss spectra and the O 1s core level peak energy: 5.20±0.06 eV ($\beta$-$(Al_{0.21}Ga_{0.79})_2O_3$), 5.35±0.04 eV ($\beta$-$(Al_{0.28}Ga_{0.72})_2O_3$), 5.44±0.08 eV ($\beta$-$(Al_{0.35}Ga_{0.65})_2O_3$), 5.54±0.05 eV $\beta$-$(Al_{0.41}Ga_{0.59})_2O_3$), and 5.72±0.08 eV ($\beta$-$(Al_{0.48}Ga_{0.52})_2O_3$). These results match well with the theoretically predicted energy bandgap values for $\beta$-$(Al_xGa_{1-x})_2O_3$.

FESEM and AFM imaging were used to characterize the surface morphology of $\beta$-$(Al_xGa_{1-x})_2O_3$ samples. It was found that samples with a relatively low Al composition exhibit elongated surface morphology with granules along the [010] direction. The β-gallia structure has two cleavage planes that are parallel to the [100] and [001] directions. Due to the higher surface energy of the (010) plane as compared to those of the (100) and (001) planes, the adatom incorporation along the [010] direction is, thus, higher, causing the directional growth toward the [010] direction. It was found that with the increasing Al composition, the granular surface feature size reduces. Without wishing to be bound by any theory, it was assumed that demonstrated trend indicates that the surface morphology of (−201) $\beta$-$(Al_xGa_{1-x})_2O_3$ films highly depends on the Al composition.

AFM images (5×5 μm$^2$) in FIGS. 15A-15D were taken on (−201) $\beta$-$(Al_xGa_{1-x})_2O_3$ films grown with Al compositions of x=21%, 29%, 41%, 48%. The surface morphology and root mean square (RMS) roughness show an obvious trend as the Al composition increases. For $\beta$-$(Al_xGa_{1-x})_2O_3$ films with x=21% and 29% (FIGS. 15A and 15B), surfaces exhibit granular morphology with lengths of 1.0-1.2 μm, oriented along the [010] direction. The RMS values were measured at 7.13 nm and 9.71 nm, respectively. As the Al composition increases to 41% and 48% (FIGS. 15C and 15D), the lengths of the granule structures reduce to ~0.4-0.55 μm with better uniformity and RMS of 5.37 nm and 4.28 nm. While recent MBE growth of (−201) $\beta$-$Ga_2O_3$ films has correlated the reduction of RMS roughness with growth temperature, from the MOCVD growth of (−201) $\beta$-$(Al_xGa_{1-x})_2O_3$, it was observed that the RMS value tends to decrease with the increase in Al at the same growth temperature (880° C.) and pressure (20 Torr). Again, without wishing to be bound by any theory, it was assumed that the introduction of Al adatoms to the growth surface can facilitate uniform nucleation on the (−201) surface, due to a higher sticking coefficient of Al than Ga and stronger Al—O bonding energy than Ga—O. With a higher flow rate of TMAl, the dense Al adatoms can act as preferential nucleation sites, which promotes epitaxy with uniform surface morphologies.

Figures 16A, 16B, 16C:
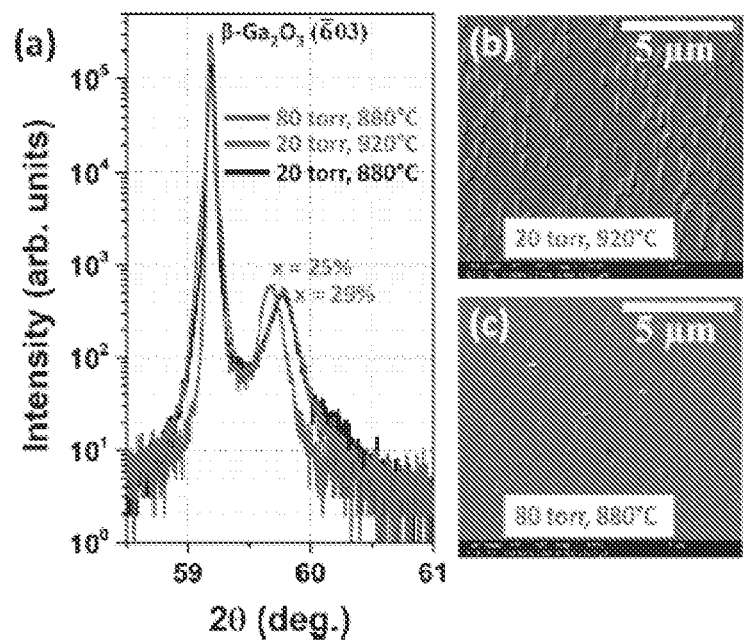
FIGS. 16A-16C show.

The MOCVD growth condition was further tuned to investigate its impact on the $\beta$-$(Al_xGa_{1-x})_2O_3$ film crystalline quality and surface morphology. Three samples were grown with varying chamber pressures and temperatures but with the same [TMAl]/[TMAl+TEGa] molar flow rate ratio of 3.82%. FIG. 16A compares the XRD spectra for the three films grown at (i) 880° C. and 80 Torr, (ii) 920° C. and 20 Torr, and (iii) 880° C. and 20 Torr. As the growth pressure increases from 20 to 80 Torr at the same temperature (880° C.), the shift of the (−603) refection peak indicates a reduction of the Al composition from 29% to 25%. It was found that the surface morphologies show an obvious change that the granule feature size reduces at the higher growth pressure. Although higher Al incorporation at the same chamber pressure (20 Torr) can lead to surface smoothening, it was observed that the higher chamber pressure can also promote epitaxial growth with smoother surface morphologies. While the chamber pressure has a strong influence on the Al incorporation and the surface morphology, the increase in growth temperature from 880 to 920° C. does not show an obvious impact on the XRD peak position or surface morphology (FIG. 16B).

Figures 17A, 17B, 17C, 17D, 17E:
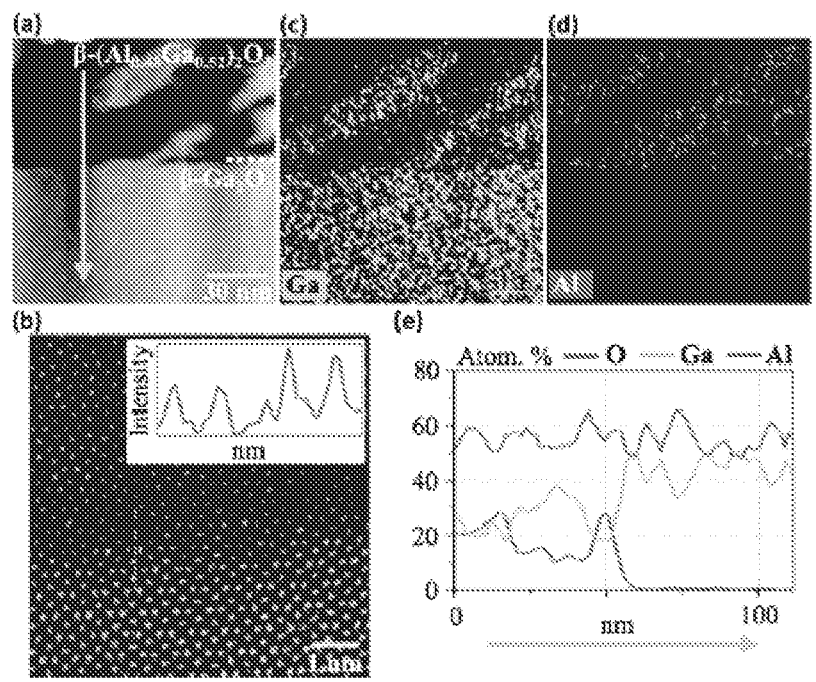
FIGS. 17A-17E depict cross-sectional HAADF-STEM images observed along the [010] zone axis projection for the 60 nm thick (−201) β-(Al$_{0.48}$Ga$_{0.55}$)$_2$O$_3$ film grown on top of (−201) β-Ga$_2$O$_3$ substrates at low magnification (FIG. 17A) and atomic resolution (FIG. 17B) and associated EDS for Ga (FIG. 17C) and Al (FIG. 17D).

The crystalline quality and the alloy homogeneity of high Al content (−201) $\beta$-$(Al_xGa_{1-x})_2O_3$ films were evaluated at the atomic scale by high-angle annular dark-field (HAADF) STEM imaging and EDS. HAADF STEM images, shown in FIGS. 17A and 17B display the (−201) $\beta$-$(Al_{0.48}Ga_{0.52})_2O_3$ film grown on an ~65 nm (−201) $\beta$-$Ga_2O_3$ buffer layer. As the HAADF signal is approximately proportional to the square of an element's atomic number, the contrasts in the images directly correspond to Al incorporation and segregation, producing darker regions in the film as compared to the brighter $\beta$-$Ga_2O_3$ substrate. The low magnification image, shown in FIG. 17A reveals a 60 nm thick film on top of a $\beta$-$Ga_2O_3$ substrate, which is clearly visible by locating the sharp interface. It was noted that the interface between the ~65 nm UID (−201) $\beta$-$Ga_2O_3$ buffer layer and the $\beta$-$Ga_2O_3$ substrate was not clearly identified, which indicates good quality homoepitaxial growth of the (−201) $\beta$-$Ga_2O_3$ buffer layer. Additionally, as seen in FIG. 17A, the significant contrast observed in the $(Al_xGa_{1-x})_2O_3$ film indicates an inhomogeneous Al distribution. This contrast is also detected at the atomic scale, where atomic column intensity fluctuates as a result of nonuniform Al distribution (FIG. 17B). Elemental maps for Ga and Al, shown in FIG. 17C and FIG. 17D indicate that the darker regions of the film in FIG. 17 arise from the increase in the Al concentration. Furthermore, the EDS quantitative line scan (orange arrow), plotted in FIG. 17E shows the fluctuation of the Al concentration in the film with an experimental uncertainty of ~±5%, which is typical for EDS. Still, the EDS quantified average Al composition matches well with the calibrated Al composition of 48%. The exact Al distribution pattern, seemingly in alignment with the [100] direction, is parallel to the (100) primary cleavage plane in $\beta$-$Ga_2O_3$. Without wishing to be bound by any theory, it was assumed that this directional dependence of the Al distribution along the [100] direction in the (−201) $\beta$-$(Al_xGa_{1-x})_2O_3$ layer can be the consequence of the highly anisotropic properties of the $\beta$-gallia structure.

Unlike (010) $\beta$-$(Al_xGa_{1-x})_2O_3$ films grown on (010) $\beta$-$Ga_2O_3$ substrates, where the Al incorporation in the pure $\beta$-phase is found to be limited (x<27%) due to the domain rotation and phase segregation while targeting for high-Al compositions, (−201) $\beta$-$(Al_xGa_{1-x})_2O_3$ films grown on (−201) $\beta$-$Ga_2O_3$ substrates did not exhibit any domain rotation or phase segregations even at high Al compositions. Without wishing to be bound by any theory, it was hypothesized that this phenomenon can be related to the asymmetric crystal structures of $\beta$-$(Al_xGa_{1-x})_2O_3$. The lattice constants a, b, and c for the monoclinic $\beta$-$Ga_2O_3$ structure are 1.22 nm, 0.30 nm, and 0.58 nm, respectively. Among the major crystal surfaces of $\beta$-gallia structures, including (010) and (001), the (−201) surface is more stabilized as the relaxation energy for (−201) is significantly larger than that for (010) or (001) surfaces. This leads to a lower surface energy of the relaxed (−201) plane (0.96 J/m²) as compared to the surface energies of (010) (1.67 J/m²) and (001) (1.95 J/m²). This significantly lower surface energy of the (−201) plane may lead to the higher Al adatom incorporation on the growth surface in the pure $\beta$-phase without occurring any structural phase change or domain rotation.

Also, 8-period (−201)/$\beta$-$(Al_xGa_{1-x})_2O_3$/$\beta$-$Ga_2O_3$ SL structures with Al compositions of 48% and 21% were investigated. The films were grown on an ~65 nm/$\beta$-$Ga_2O_3$ buffer layer. The structural quality of the superlattice structures was evaluated by XRD and HRSTEM imaging. The periods consist of $\beta$-$Ga_2O_3$ well and $\beta$-$(Al_xGa_{1-x})_2O_3$ barrier layers for 48% and 21% Al compositions targeted for 15 nm and 20 nm, respectively. The XRD spectrum (not shown) has demonstrated distinguishable satellite peaks along with zeroth-order peaks for both structures, indicating that the periodicities of the structures are well maintained even with high-Al compositions. In general, the separation between the $\beta$-$Ga_2O_3$ substrate peak and the zeroth-order satellite peaks has been found to reflect the average Al composition over the entire superlattices and the thickness of the period of the well and barrier. With increasing Al compositions, the zeroth-order satellite peaks were found to shift toward higher 2θ angles, showing the increase in the average Al in the SL. For the 48% Al SL, the average Al composition calculated from a distance between the substrate peak and zeroth-order satellite peak positions is 15% [targeted average Al %: (AlGaO barrier thickness: 5 nm)/(GaO+AlGaO period thickness: 15 nm)×48%=16%] and the period thickness estimated from the separations between the adjacent satellite peak positions is 14.2 nm (targeted period: 5 nm+10 nm=15 nm). Similarly, the average Al composition and the period for the SL structures with 21% Al are 9.5% (targeted average Al %: 10.5%) and 21.26 nm (targeted period: 20 nm), respectively.

Figures 18A, 18B, 18C, 18D, 18E:
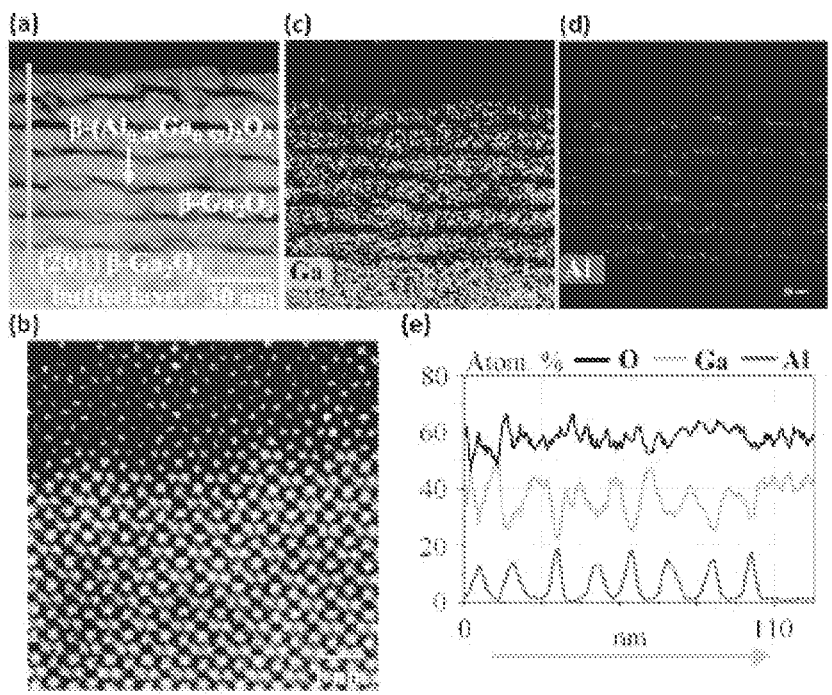
FIGS. 18A-18E depict cross-sectional HAADF-STEM images of the 8-period (−201) β-(Al$_{0.48}$Ga$_{0.55}$)$_2$O$_3$/β-Ga$_2$O$_3$ superlattice structure grown on the (−201) β-Ga$_2$O$_3$ substrate at low magnification (FIG. 18A) and atomic resolution (FIG. 18B) and associated EDS maps for Ga (FIG. 18C) and Al (FIG. 18D).
Figures 19A, 19B, 19C, 19D:
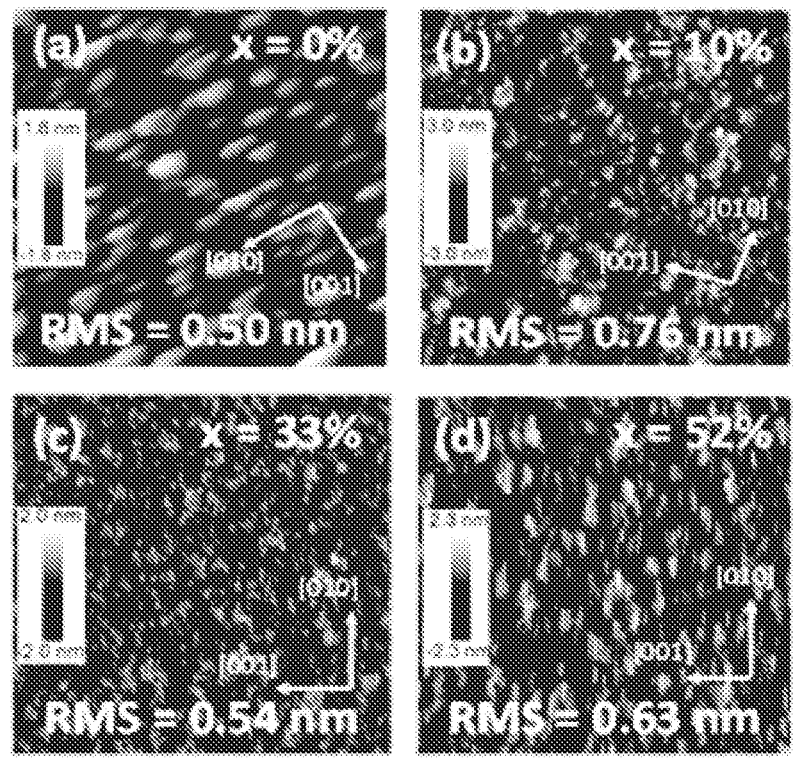
FIGS. 19A-19D show AFM images (scan area: 3×3 μm$^2$) of FIG. 19A 150-nm-thick (100) β-Ga$_2$O$_3$ films and 50-nm-thick β-(Al$_{0.48}$Ga$_{0.55}$)$_2$O$_3$ alloys grown with Al compositions of (b) x=10%, (c) x=33%, and (d) x=52%.

To evaluate the interface abruptness and Al uniformity in the $\beta$-$(Al_xGa_{1-x})_2O_3$/$\beta$-$Ga_2O_3$ SL, HRSTEM imaging and EDS were performed. FIGS. 18A and 18B show HAADF- STEM images at low magnification and atomic resolution of the SL structure grown with a target of 48% Al, respectively. The alternating dark and bright contrast in FIG. 18A corresponds to the $\beta$-$(Al_xGa_{1-x})_2O_3$ barriers and $\beta$-$Ga_2O_3$ wells. As shown in FIGS. 18C and 18D, STEM-EDS displayed not only the relatively consistent Al concentration in the layered structure but also the deterioration of the interfacial abruptness and inhomogeneous Al distribution within individual layers. The Al compositions in the $(Al_xGa_{1-x})_2O_3$ layers as determined by the quantitative line scan (orange arrow) shown in FIG. 18E show some deviation from the targeted Al composition (48%), which can be related to a potential non-uniform distribution of Al in $(Al_xGa_{1-x})_2O_3$ barrier layers.

Example 8

In this Example, the valence and conduction band offsets between MOCVD-grown high-quality (100) $\beta$-$(Al_xGa_{1-x})_2O_3$ and $\beta$-$Ga_2O_3$ interfaces with Al compositions up to $x \leq 0.52$ were investigated. The bandgap energies and the valence band offsets for 10%, 33%, and 52% Al compositions were determined via XPS. Using the bandgap energies and the valence band offsets, the conduction band offsets were extracted and were found to be consistent with the theoretically predicted band offset values. As there are deviations in the previous experimental reports from theoretically predicted band offset values, this example shows the band offsets in $\beta$-$(Al_xGa_{1-x})_2O_3$/$\beta$-$Ga_2O_3$ interfaces with the evolution of Al compositions. In this example, (100) $\beta$-$(Al_xGa_{1-x})_2O_3$ thin films were grown via MOCVD on Fe-doped semi-insulating (100) $\beta$-$Ga_2O_3$ substrates (commercially acquired from Novel Crystal Technology, Inc.) as shown in other examples disclosed herein. Triethylgallium (TEGa) and Trimethylaluminum (TMAl) were used as Ga and Al precursors, respectively. Pure $O_2$ was used as the oxygen precursor, and argon (Ar) was used as the carrier gas. The chamber pressure was varied between 50 and 80 Torr. The growth temperature was kept at 880° C. The (TMAl)/(TEGa þ TMAl) molar flow rate ratio was tuned from 2.35% to 22.21%. As part of the substrate preparation, prior to the epitaxial growth, $\beta$-$Ga_2O_3$ substrates were treated under high-temperature in situ annealing for 10 min at 920° C. under an atmosphere for removing the potential contamination from the substrate surface.

To confirm the Al compositions and determine the bandgaps and band offsets, chemical bonding states were studied using XPS. XPS measurements were performed using a Kratos Axis Ultra x-ray photoelectron spectrometer with a monochromatized Al Kα x-ray source (Ephoton=1486.6 eV) with an energy resolution of 0.1 eV. The bandgap energies were calculated by measuring the onset of inelastic loss spectra relative to the O 1s core level (CL) peaks. The crystalline quality and the Al compositions of the films were evaluated by X-ray diffraction spectra (XRD, Bruker D8 Discover). Atomic force microscopy (AFM, Bruker ICON) and field emission scanning electron microscopy (FESEM, FEI Helios 600) were used to evaluate the surface morphology and roughness. High-angle annular dark field (HAADF) STEM images were obtained using a Thermo Fisher Scientific Themis-Z scanning transmission electron microscope operated at 200 kV.

A series of samples with targeted 10%, 33%, and 52% Al compositions were grown by varying the (TMAl)/(TMAl+ TEGa) molar flow ratio.

As the XPS measurement is surface sensitive, the surface roughness of $\beta$-$(Al_xGa_{1-x})_2O_3$ and $\beta$-$Ga_2O_3$ films can affect the data accuracy. The smooth and uniform surface can help to access all electronic states intrinsic to the interface. To investigate the surface features and estimate the surface roughness, AFM and SEM imaging for the films with different Al compositions were performed. (AFM images are shown FIGS. 19A-19D, SEM images are not shown). The changes in the Al adatom diffusivity on the growth surface with different Al compositions can lead to surface morphological changes. Although granular surface morphology was observed for the samples with different Al compositions, the surface root mean square (RMS) roughness of an area of 3×3 $\mu m^2$ for both $\beta$-$Ga_2O_3$ (150 nm thick) and $\beta$-$(Al_xGa_{1-x})_2O_3$ (50 nm thick) films was varied between 0.50 nm and 0.76 nm, indicating uniform and smooth surface morphology. The crystalline quality of $\beta$-$(Al_xGa_{1-x})_2O_3$ films with different Al compositions was also investigated by the XRD measurements. The full-width at half-maximum (FWHM) of the x rocking curve was measured to be 85, 95, and 111 arcsec for the (400) reflection of $\beta$-$(Al_xGa_{1-x})_2O_3$ films with 10%, 33%, and 52% Al compositions, respectively. The narrow rocking curves with smaller FWHM values also indicate the growth of high-quality epitaxial films on (100) both $\beta$-$Ga_2O_3$ substrates.

Figures 20A, 20B, 20C:
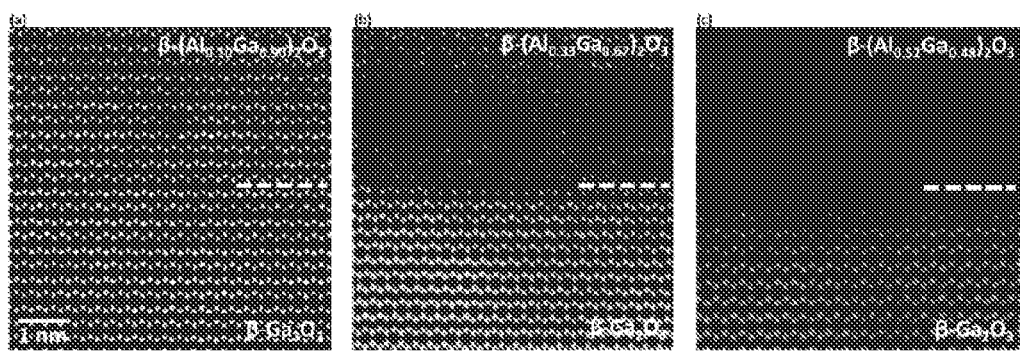
FIGS. 20A-20C depict atomic resolution HAADF-STEM images of [001]$_m$ β-(Al$_{0.48}$Ga$_{0.55}$)$_2$O$_3$/β-Ga$_2$O$_3$ interfaces (white dashed line) with x=0.10 (FIG. 20A), 0.33 (FIG. 20B), and 0.52 (FIG. 20C). β-(Al$_{0.48}$Ga$_{0.55}$)$_2$O$_3$ films were grown on top of a 65-nm-thick/β-Ga$_2$O$_3$ buffer layer on a (100)/β-Ga$_2$O$_3$ substrate.
Figures 21A, 21B, 21C:
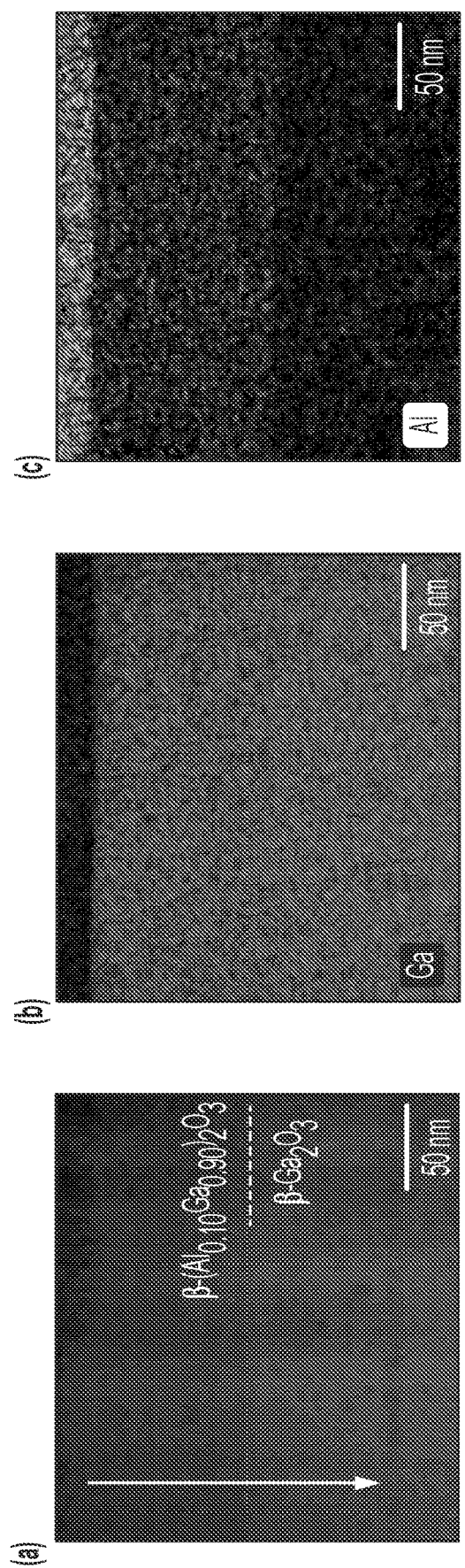
FIGS. 21A-21L depict TEM-EDS for each β-(Al$_{0.48}$Ga$_{0.55}$)$_2$O$_3$ film. HAADF image (FIG. 21A) with corresponding Ga (FIG. 21B) and Al EDS maps (FIG. 21C) and atomic fraction (FIG. 21D) elemental profile [orange arrow in FIG. 21A] for x=0.10. HAADF image (FIG. 21E) with corresponding Ga (FIG. 21F) and Al (FIG. 21G) EDS maps and atomic fraction (FIG. 21H) elemental profile [orange arrow in FIG. 21E] for x=0.33. HAADF image (FIG. 21I) with corresponding Ga (FIG. 21J) and Al (FIG. 21K) EDS maps and atomic fraction (FIG. 21L) elemental [orange arrow in FIG. 21I] for x=0.52.
Figure 21D:
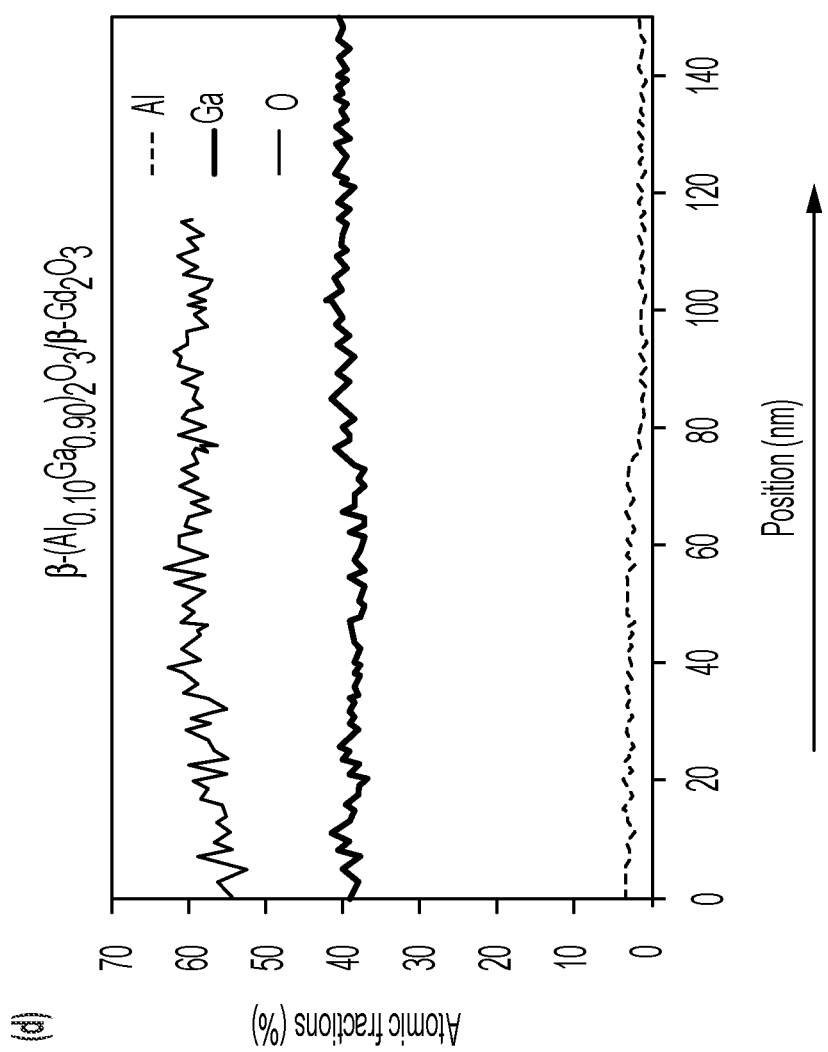
Figures 21E, 21F, 21G:
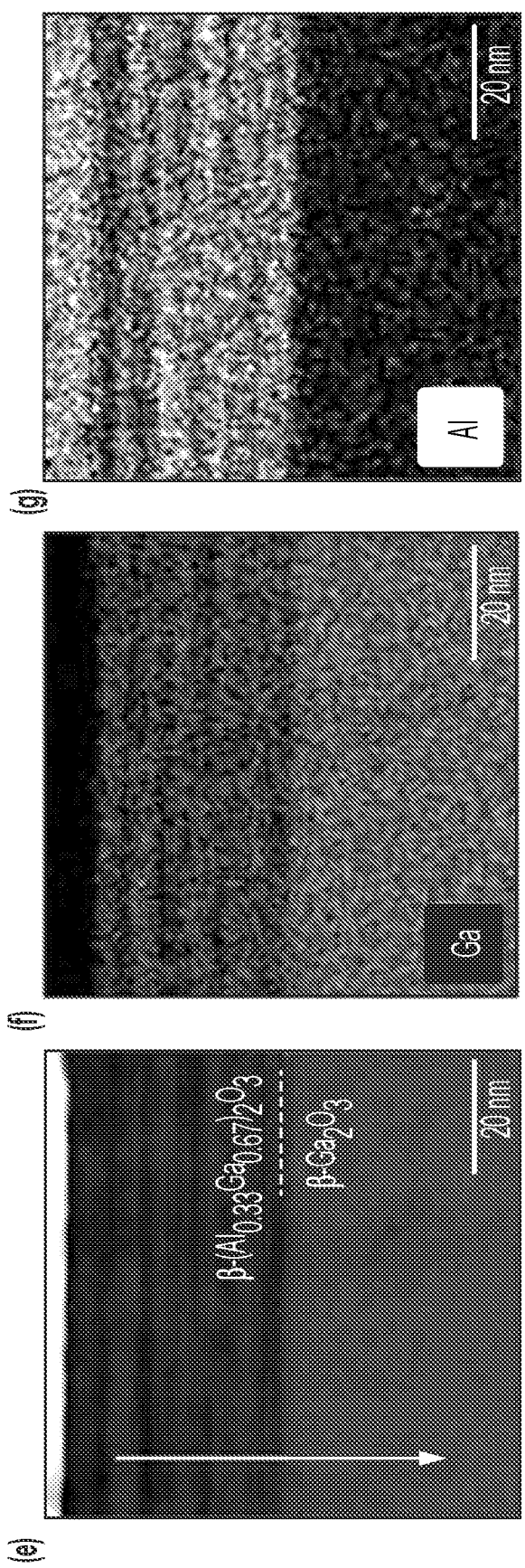
Figure 21H:
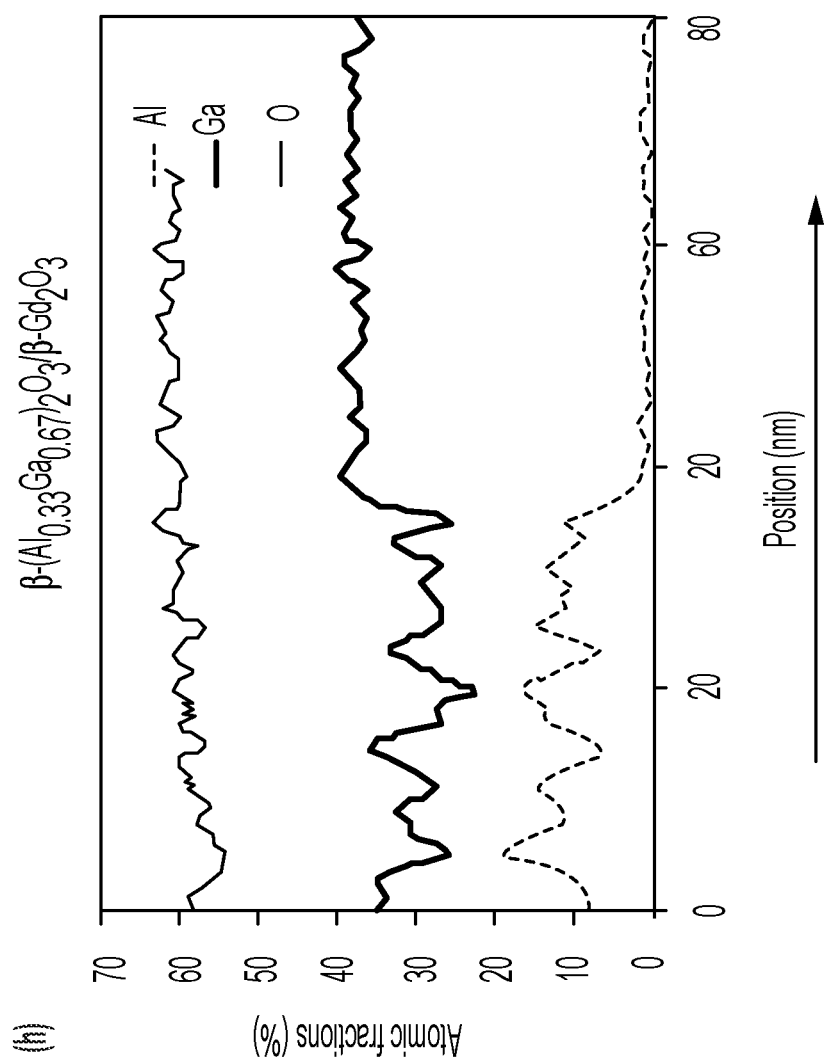
Figures 21I, 21J, 21K:
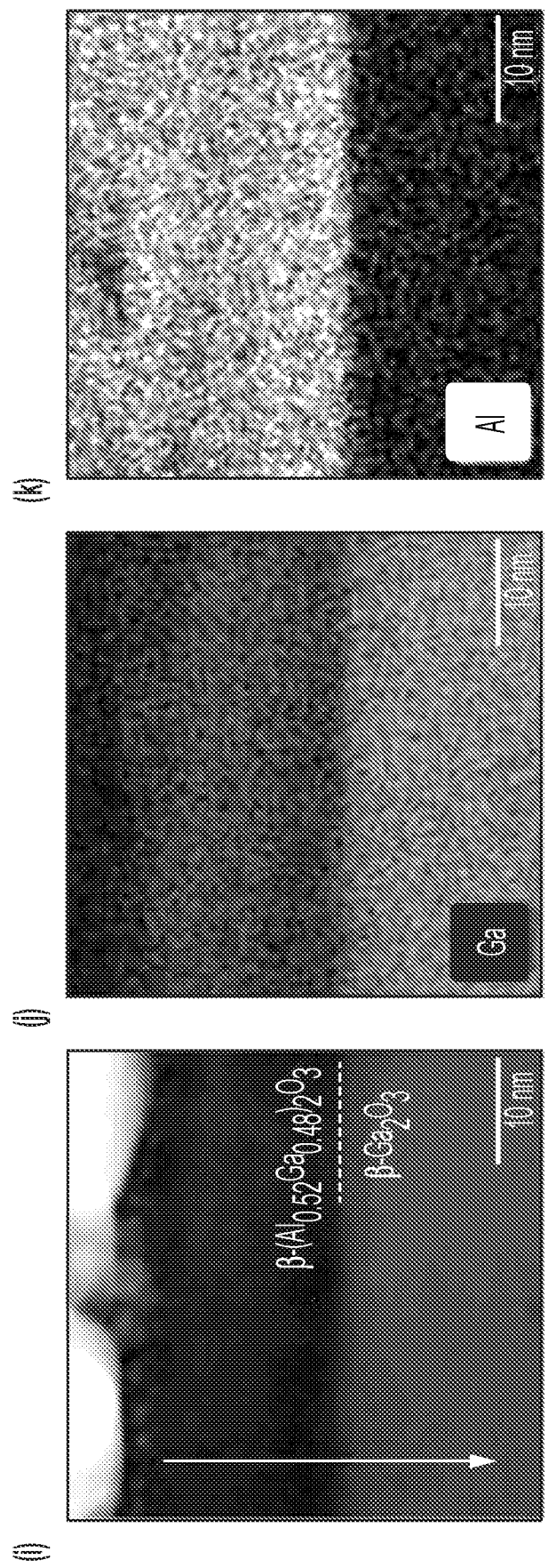
Figure 21L:
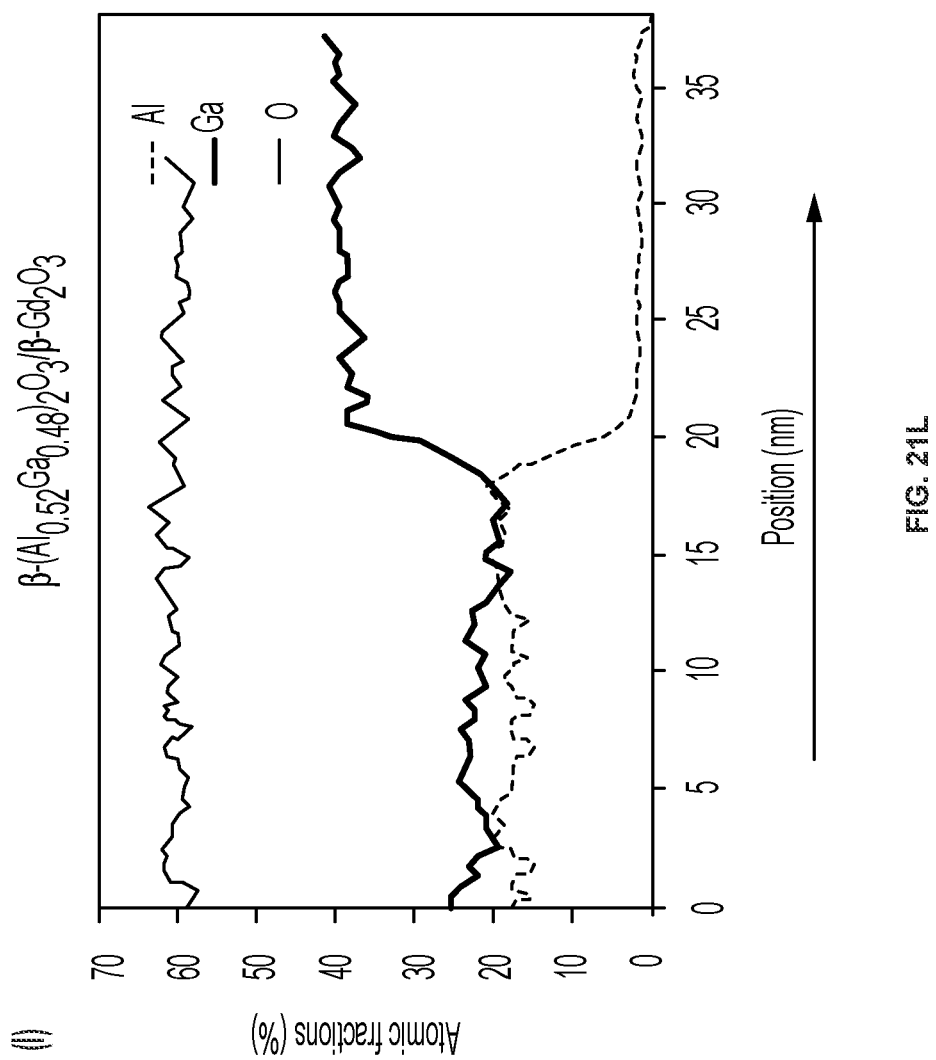
Figures 22A, 22B, 22C, 22D:
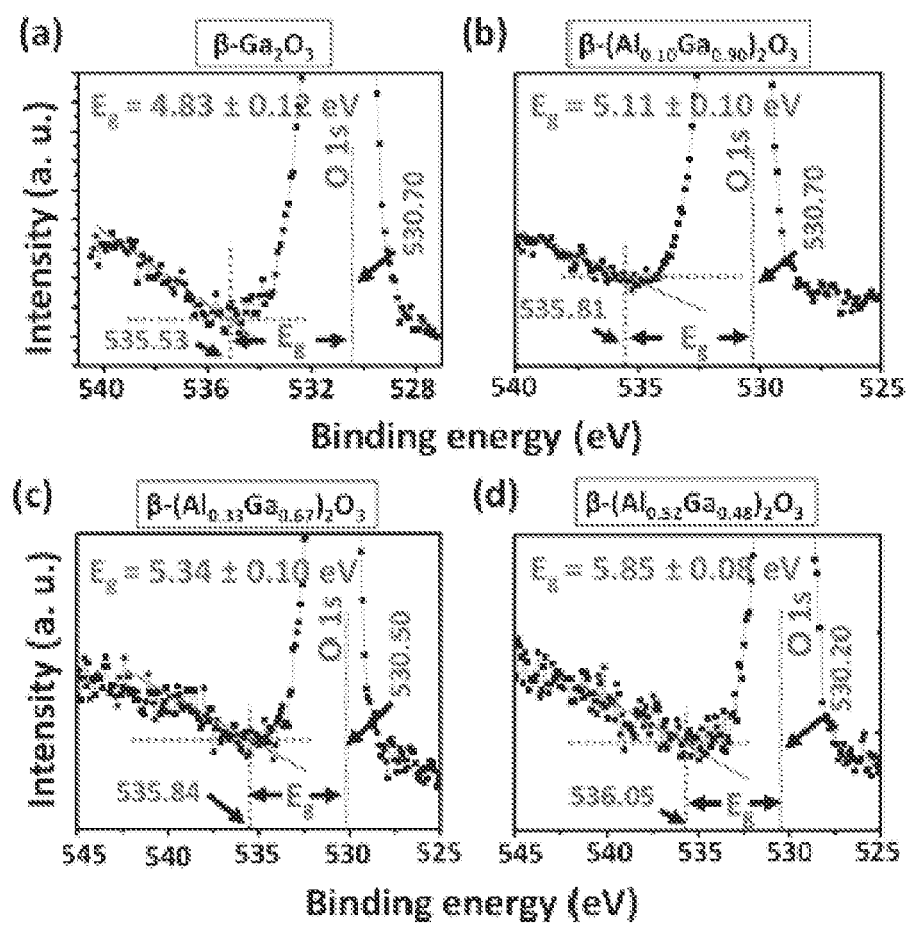
FIGS. 22A-22D depict the bandgap energies of (100) b-Ga$_2$O$_3$ films (FIG. 22A) and β-(Al$_x$Ga$_{1-x}$)$_2$O$_3$ alloys (FIG. 22B) determined by the energy difference of the O 1s core level peak and the onset of the energy loss spectrum for FIG. 22B, x=10%, x=33% (FIG. 22C), and x=52% (FIG. 22D).

Also, the quality of $\beta$-$(Al_xGa_{1-x})_2O_3$/$\beta$-$Ga_2O_3$ growth, especially at the interface, is critical for the accurate measurement of band offsets. To investigate the interfacial abruptness, $\beta$-$(Al_xGa_{1-x})_2O_3$/$\beta$-$Ga_2O_3$ with 10%, 33%, and 52% Al compositions were investigated using high-resolution STEM imaging and energy-dispersive x-ray spectroscopy (EDS). FIGS. 20A-20C show the atomic-resolution HAADF STEM images for $[001]_m$ $\beta$-$(Al_xGa_{1-x})_2O_3$/$\beta$-$Ga_2O_3$ interfaces with film compositions of 10%, 33%, and 52% Al. The undisturbed $\beta$-phase structure and the sharp contrast between the $\beta$-$(Al_xGa_{1-x})_2O_3$ epi-film (dark) and the $\beta$-$Ga_2O_3$ layer (bright) reveal high-quality interfaces for each sample. EDS performed throughout the entirety of the films, shown in FIGS. 21A-21L also demonstrated the abrupt interfaces. Additionally, EDS was used to estimate the Al distribution across the grown films. Generally, the samples with 10% and 52% Al compositions reveal the uniform distribution of Al throughout the films. EDS from the 33% Al film (FIGS. 21E-21H) shows fluctuation of Al compositions throughout the film. The average Al compositions in all films show good agreement with those extracted from XRD and XPS measurements, as presented later.

The recent theoretical DFT calculation on the critical thickness of $\beta$-$(Al_xGa_{1-x})_2O_3$ alloys grown on $\beta$-$Ga_2O_3$ substrates shows a higher critical thickness for (100) $\beta$-$(Al_xGa_{1-x})_2O_3$ films than other orientations such as (010) and (001). Considering different critical thicknesses for different Al compositions, the strain in (100) $\beta$-$(Al_xGa_{1-x})_2O_3$ films with different Al compositions can be different. As there exist no ideal $(Al_xGa_{1-x})_2O_3$/$Ga_2O_3$ interfaces without strain, this example investigated the effect on the experimental band offset values of the (100) $((Al_xGa_{1-x})_2O_3$/$Ga_2O_3$ interface with different Al compositions. Although extended defects such as twin boundaries and slight Al and Ga diffusion at the interface were observed in the (100)-oriented $\beta$-$(Al_xGa_{1-x})_2O_3$ films, the lower surface roughness with sharp interfaces indicate the decent epitaxial growth of (100) $\beta$-$Ga_2O_3$ films on $\beta$-$Ga_2O_3$ substrates, which are essential for the extraction of the band offsets by using surface sensitive XPS.

The elemental compositions of 50-nm-thick $\beta$-$(Al_xGa_{1-x})_2O_3$ films were also estimated using the XPS technique. Due to the large sampling depth of other techniques such as Rutherford backscattering or energy-dispersive x-ray spectroscopy (EDX), the reliable determination of the elemental compositions for thin epi-films is non-trivial. As the sampling depth of XPS techniques is only a couple of nanometers, it allows an accurate determination of the elemental compositions of the films. The Al compositions were determined by analyzing the area of Ga 3s and Al 2s core levels with their respective sensitivity factors ($S_{Ga}$ 3s=1.13 and $S_{Al}$ 2s=0.753) after applying the Shirley background subtraction. The survey spectra for $\beta$-Ga$_2$O$_3$ and $\beta$-(Al$_x$Ga$_{1-x}$)$_2$O$_3$ samples with different Al compositions and Ga 3s and Al 2s core-level spectra were measured. No metallic contaminants other than Ga, Al, C, and O were observed in the survey spectra, indicating high-crystalline quality epi-films.

To estimate the bandgap energies of $\beta$-Ga$_2$O$_3$ and $\beta$-(Al$_x$Ga$_{1-x}$)$_2$O$_3$ films, the inelastic energy loss spectrum of the O 1s core-level XPS peak was utilized. The onset of the inelastic loss spectrum at lower kinetic energy (higher binding energy) relative to the core level peak corresponds to the bandgap energy. FIGS. 22A-22D show the O 1s core-level spectrum of the $\beta$-Ga$_2$O$_3$ film and $\beta$-(Al$_x$Ga$_{1-x}$)$_2$O$_3$ films with x=10%, 33%, and 52%, respectively. The bandgaps estimated by measuring the onset of energy loss peaks are 4.83±0.12 eV, 5.11±0.10 eV, 5.34±0.10 eV, and 5.85±0.08 eV for x=0%, 10%, 33%, and 52%, respectively, as listed in Table 4. The experimental bandgap energies measured in different Al composition samples were in good agreement with the DFT calculations. The bowing parameter (b) obtained from the quadratic fitting of the experimentally observed bandgap values is 1.25 eV. This experimental value agrees well with the theoretically calculated value of b=0.93 eV (indirect) [1.37 eV (direct)].

By utilizing XPS, the valence band offsets ($\Delta E_v$) at $\beta$-(Al$_x$Ga$_{1-x}$)$_2$O$_3$/$\beta$-Ga$_2$O$_3$ heterointerfaces with different Al compositions were calculated by using Ga 2p$_{3/2}$ and Al 2p core-level spectra and the valence-band (VB) spectra of $\beta$-Ga$_2$O$_3$ and $\beta$-(Al$_x$Ga$_{1-x}$)$_2$O$_3$ films. FIG. 23A-23D show the valence band spectra and Ga 2p$_{3/2}$ and Al 2p core-level spectra for $\beta$-Ga$_2$O$_3$ and $\beta$-(Al$_x$Ga$_{1-x}$)$_2$O$_3$ films with 52%, 33%, and 10% Al compositions, respectively. The VB onsets' position for each sample is estimated through a linear extrapolation of the leading edge of the valence band spectra to the background, as shown in the crossover points in FIGS. 23A-23D. The Ga 2p$_{3/2}$ and Al 2p core level positions for $\beta$-Ga$_2$O$_3$ and $\beta$-Ga$_2$O$_3$ are determined by fitting with a combination of Gaussian and Lorentzian line shapes after applying Shirley's background subtraction.

XPS is well-established to determine the band discontinuities at the heterojunction interface. Although $\Delta E_v$ at the interface of two materials can be directly determined by utilizing the difference between their VB onsets, for more accurate determination of the valence band offsets between $\beta$-Ga$_2$O$_3$ and $\beta$-Ga$_2$O$_3$ with different Al compositions, Kraut's method was employed, to determine the valence band offsets.

Figures 23A, 23B, 23C, 23D:
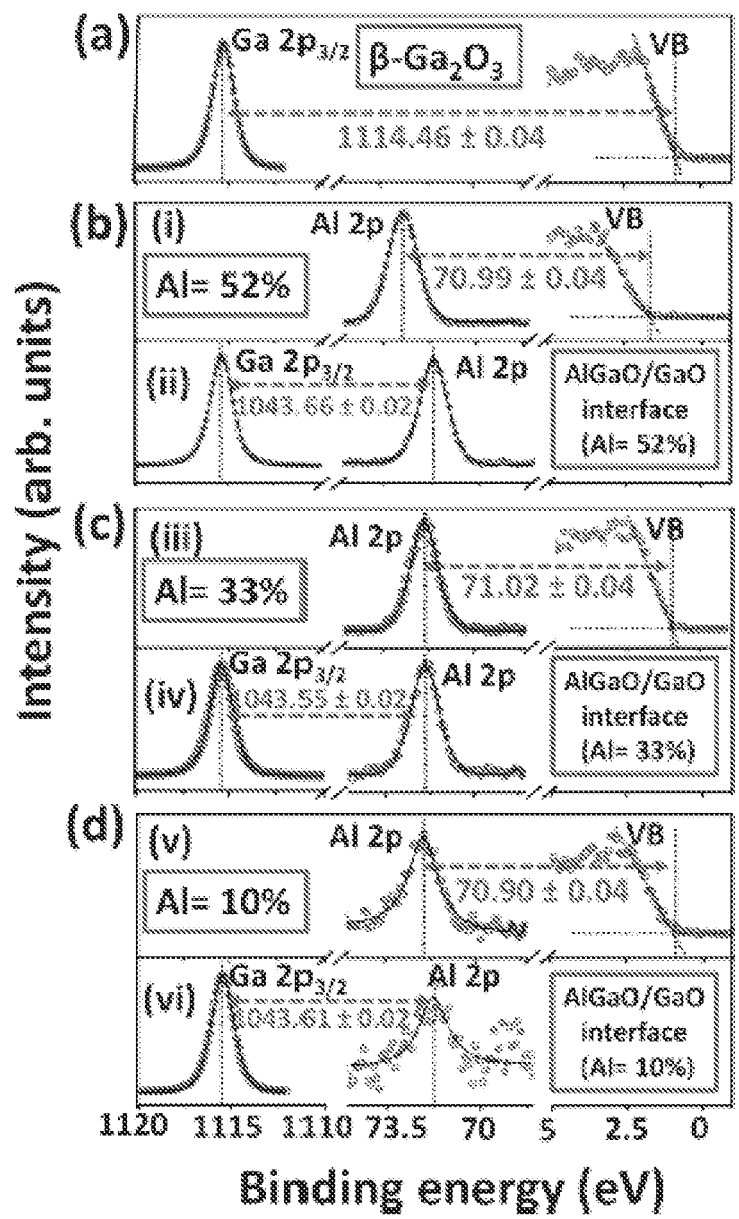
FIGS. 23A-23D depict Ga 2p$_{3/2}$ and Al 2p core-level and valence band spectra of β-(Al$_x$Ga$_{1-x}$)$_2$O$_3$/β-Ga$_2$O$_3$ (FIG. 23A) and β-(Al$_x$Ga$_{1-x}$)$_2$O$_3$ (FIG. 23B-23D) alloys with different Al compositions. (b-i), (c-iii), and (d-v) represent the binding energy difference between Al 2p core levels and valence band onsets for 50-nm-thick β-(Al$_x$Ga$_{1-x}$)$_2$O$_3$ alloys grown with Al compositions of x=52% (FIG. 23B), (c) x=33% (FIG. 23C), and (d) x=10% (FIG. 23D). The binding energy differences between Ga 2p$_{3/2}$ and Al 2p core levels for β-(Al$_x$Ga$_{1-x}$)$_2$O$_3$/β-Ga$_2$O$_3$ interfaces are represented in (b-ii), (c-iv), and (d-vi) for x=52%, 33%, and 10% Al compositions, respectively.

The binding energy difference ($E_{Ga2p3/2}^{GaO}-E_{VBM}^{GaO}$)) between the Ga 2p$_{3/2}$ core level and the VB onsets for $\beta$-Ga$_2$O$_3$ (GaO) is estimated to be 1114.46±0.04 eV as shown in FIG. 23A. For $\beta$-(AlGa$_{1-x}$)$_2$O$_3$ (AlGaO) samples with 52%, 33%, and 10% Al compositions, the binding energy differences ($E_{Al2p}^{AlGaO}-E_{VBM}^{AlGaO}$) between Al 2p and VB onsets are determined to be 70.90±0.04 eV (x=10%), 71.02±0.04 eV (x=33%), and 70.99±0.04 eV (x=52%). For the (Al$_x$Ga$_{1-x}$)$_2$O$_3$/Ga$_2$O$_3$ (AlGaO/GaO) interface samples, the binding energy differences ($E_{GAl2p3/2}^{AlGaO/GaO}-E_{Al2p}^{AlGaO/GaO}$) between Ga 2p$_{3/2}$ and Al 2p core levels are determined to be 1043.61±0.02 eV (x=10%), 1043.55±0.02 eV (x=33%), and 1043.66±0.02 eV (x=52%) as represented in FIGS. 23B-23D. To verify the values of the valence band and the conduction band offsets achieved, the calculation based on the Al 2s core level energy was also carried out. Comparing the values obtained using both Al 2p and Al 2s with Ga 2p$_{3/2}$ is summarized in Table 4, which shows consistent $\Delta E_v$ and $\Delta E_c$ values at different Al compositions. The valence band and the conduction band offset values extracted using different core level XPS peaks match well with the theoretically predicted values.

TABLE 4

Summary of the Al compositions, the bandgap energies, and the valence and conduction band offsets for (100) $\beta$-(Al$_x$Ga$_{1-x}$)$_2$O$_3$/$\beta$-Ga$_2$O$_3$ interfaces, estimated by using valence band spectra and Ga 2p3/2, Al 2p, and Al 2s core levels from the XPS measurement. The valence and the conduction band offsets calculated using both Al 2p and Al 2s core levels are listed for each Al composition sample, indicating the consistency in the measured values. The errors in the measured values are defined as the root mean square errors.

| Al comp., % | Bandgap energy (ev) | Core levels (CL) | $E_{CL(GaO)}^{GdO} - E_{VBM}^{GaO}$ | $E_{CL(AlGaO)}^{AlGaO} - E_{VBM}^{AlGaO}$ | $E_{CL(GaO)}^{AlGaO/GaO} - E_{CL(AlGaO)}^{AlGaO/GaO}$ | Valence band offset $\Delta E_v$(ev) | Conduction band offset $\Delta E_c$(ev) |
|---|---|---|---|---|---|---|---|
| 0 | 4.83 ± 0.12 | Ga 2p3/2 | 1114.46 ± 0.04 | | | | |
| 10 | 5.11 ± 0.10 | Al 2p | | 70.90 ± 0.04 | 1043.61 ± 0.02 | -0.06 ± 0.06 | 0.34 ± 0.17 |
| | | Al 2s | | 115.61 ± 0.04 | 998.92 ± 0.02 | -0.07 ± 0.06 | 0.35 ± 0.17 |
| 33 | 5.34 ± 0.10 | Al 2p | | 71.02 ± 0.04 | 1043.55 ± 0.02 | -0.11 ± 0.06 | 0.62 ± 0.17 |
| | | Al 2s | | 115.83 ± 0.04 | 998.72 ± 0.02 | -0.09 ± 0.06 | 0.60 ± 0.17 |
| 52 | 5.85 ± 0.08 | Al 2p | | 70.99 ± 0.04 | 1043.66 ± 0.02 | -0.19 ± 0.06 | 1.21 ± 0.16 |
| | | Al 2s | | 115.75 ± 0.04 | 998.90 ± 0.02 | -0.19 ± 0.06 | 1.21 ± 0.16 |

Figures 24A, 24B:
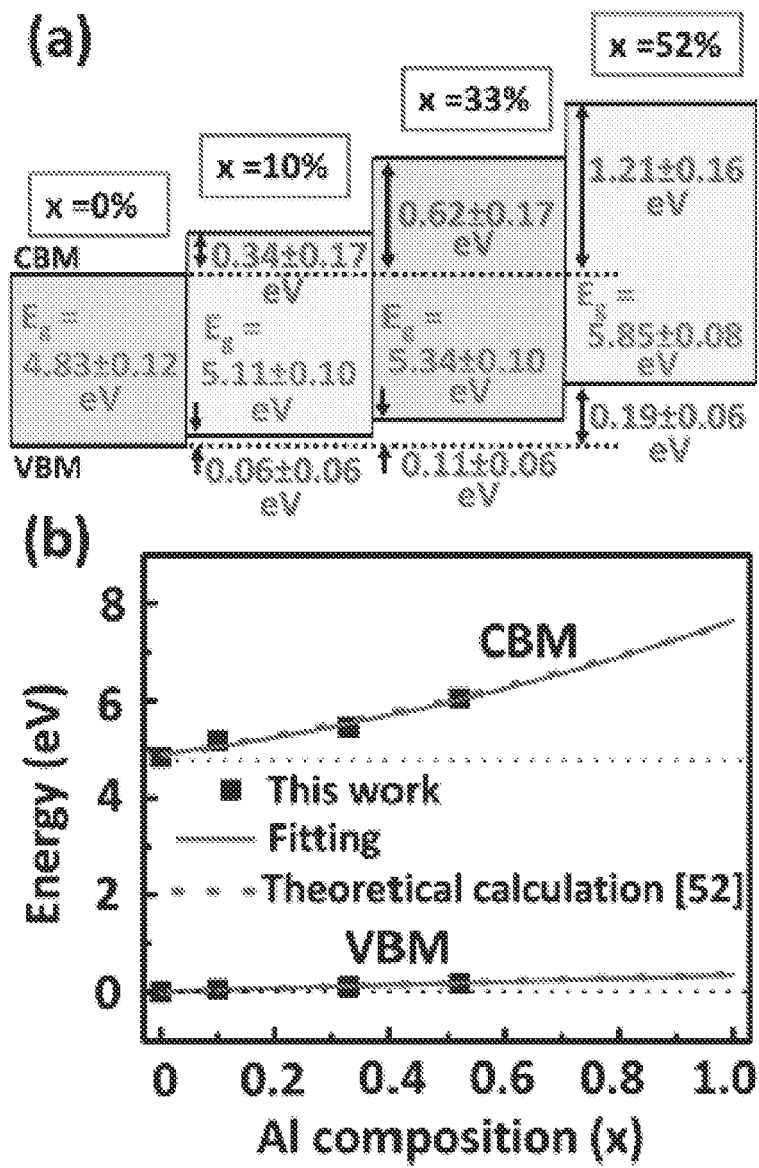
FIGS. 24A-24B depict band offsets at β-(Al$_x$Ga$_{1-x}$)$_2$O$_3$/β-Ga$_2$O$_3$ interfaces for β-(Al$_x$Ga$_{1-x}$)$_2$O$_3$ alloys with Al compositions of 10%, 33%, and 52%. The bandgaps and the conduction and valence band offset values are represented in green, red, and blue, respectively (FIG. 24A). The position of the conduction band minimum (CBM) and the valence band maximum (VBM) for β-(Al$_x$Ga$_{1-x}$)$_2$O$_3$ alloys as a function of Al compositions (FIG. 24B). The values at the VBM indicate valence-band offsets, and values at the CBM indicate conduction-band offsets by considering the valence band edge position of/β-Ga$_2$O$_3$ at 0 eV. The solid black symbols represent the experimental values. Blue solid lines are the quadratic fitting of the measured CBM and VBM values, and the red dashed lines represent the theoretically predicted CBM and VBM positions from H. Peelaers, J. B. Varley, J. S. Speck, and C. G. Van de Walle, *Appl. Phys. Lett.* 115, 159901 (2019).

Based on the calculated bandgaps and the values of $\Delta E_v$ and $\Delta E_c$, the band alignments at $\beta$-Ga$_2$O$_3$/$\beta$-(Al$_x$Ga$_{1-x}$)$_2$O$_3$ heterojunctions with different Al compositions were plotted in FIG. 24A, which indicates that the investigated $\beta$-Ga$_2$O$_3$/$\beta$-(Al$_x$Ga$_{1-x}$)$_2$O$_3$ interfaces have type II staggered band alignment, which agrees with the prediction by DFT calculations. While a recent report on the band offset measurement is demonstrated with a type-I band alignment between PLD-grown (100) β-Ga$_2$O$_3$/β-(Al$_x$Ga$_{1-x}$)$_2$O$_3$ interfaces, the results obtained herein showed a type-II band alignment. The differences from the previous report on the band offset values can be caused by the differences in the property of the epilayers as the films are grown in different growth environments via different growth techniques. FIG. 24B shows the valence band maximum (VBM) and conduction band minimum (CBM) positions for β-(Al$_x$Ga$_{1-x}$)$_2$O$_3$ as a function of the alloy concentration. The values at the VBM and CBM indicate the valence band and the conduction band offsets, respectively, calculated by considering the valence band edge of monoclinic β-Ga$_2$O$_3$ at 0 eV. The measured VBM and CBM values for different Al compositions are represented by solid black symbols. It was found that both VBM and CBM values increase as the Al composition increases. While the CBM values increase largely as the Al content increases from 10% to 52%, there is only a slight increase in VBM values with increasing Al compositions, which is expected as O 2p states dominate the VBM. The bowing parameters obtained from the quadratic fitting of both VBM and CBM values (as depicted by the solid blue lines) are estimated to be 0.005 eV and 1.25 eV, respectively.

In summary, via XPS measurements, the bandgap energies as well as the valence and the conduction band offsets at (100) β-Ga$_2$O$_3$/β-(Al$_x$Ga$_{1-x}$)$_2$O$_3$ heterojunctions are determined over a wide Al composition range (x≤0.52). The bandgaps are estimated to be varied between 4.83±0.12 eV (β-Ga$_2$O$_3$) and 5.85±0.08 eV [β-(Al$_{0.52}$Ga$_{0.48}$)$_2$O$_3$]. β-Ga$_2$O$_3$ films form a type II heterostructure with/β-(Al$_x$Ga$_{1-x}$)$_2$O$_3$ alloy for all investigated compositions with the conduction band offsets up to 1.21±0.16 eV (x=0.52). The valence band offsets of up to ~0.19±0.06 eV (x=52%) are determined. Much weaker variations in the valence band offsets are observed as compared to the conduction band offsets. The bowing parameters for the valence band maximum and the conduction band minimum are determined to be 0.005 eV and 1.25 eV, respectively. The demonstration of the bandgaps and the valence and the conduction band offsets at (100) β-(Al$_x$Ga$_{1-x}$)$_2$O$_3$/β-Ga$_2$O$_3$ interfaces with the variation of alloy compositions would guide future device designs.

Aspects:

Aspect 1: A method of forming an Al—Ga containing film comprising: a) exposing a substrate comprising a β-Ga$_2$O$_3$, wherein the substrate has a (100) or (−201) orientation, to a vapor phase comprising an aluminum precursor and a gallium precursor; and b) forming a β-(Al$_x$Ga$_{1-x}$)$_2$O$_3$ thin film by a chemical vapor deposition at predetermined conditions and wherein x is 0.01≤x≤0.7.

Aspect 2: The method of Aspect 1, wherein the vapor phase further comprises an oxygen precursor.

Aspect 3: The method of Aspect 1 or 2, wherein the β-(Al$_x$Ga$_{1-x}$)$_2$O$_3$ thin film is epitaxially grown.

Aspect 4: The method of any one of Aspects 1-3, wherein the predetermined conditions comprise a temperature from about 750° C. to about 1,000° C.

Aspect 5: The method of any one of Aspects 1-4, wherein the predetermined conditions comprise a pressure from about 1 torr to about 600 torr.

Aspect 6: The method of any one of Aspects 1-5, wherein the predetermined conditions comprise a growth rate from about 2 nm/min to about 15 nm/min.

Aspect 7: The method of any one of Aspects 1-6, wherein a molar flow rate of the aluminum precursor is from about 2% to about 50% based on a total molar flow rate of aluminum and gallium precursors.

Aspect 8: The method of any one of Aspects 1-7, wherein the β-(Al$_x$Ga$_{1-x}$)$_2$O$_3$ thin film is substantially free of 2D island growth modes.

Aspect 9: The method of any one of Aspects 1-8, wherein the β-(Al$_x$Ga$_{1-x}$)$_2$O$_3$ thin film is formed by a step-flow growth.

Aspect 10: The method of any one of Aspects 1-9, wherein the β-(Al$_x$Ga$_{1-x}$)$_2$O$_3$ thin film comprises a substantially uniform Al composition distribution throughout a thin film thickness.

Aspect 11: The method of any one of Aspects 1-10, wherein the β-(Al$_x$Ga$_{1-x}$)$_2$O$_3$ thin film is a single phase (100) film or a single phase (−201) film, respectively.

Aspect 12: The method of any one of Aspects 1-11, wherein the β-(Al$_x$Ga$_{1-x}$)$_2$O$_3$ thin film exhibits an RMS roughness of from about 0.5 nm to about 15 nm.

Aspect 13: The method of any one of Aspects 1-12, wherein when 0.3≤x≤0.67, the β-(Al$_x$Ga$_{1-x}$)$_2$O$_3$ thin film exhibits an RMS roughness of less than about 1.5 nm.

Aspect 14: The method of any one of Aspects 1-13, wherein the β-(Al$_x$Ga$_{1-x}$)$_2$O$_3$ thin film comprises one or more impurities.

Aspect 15: The method of Aspect 14, wherein the one or more impurities comprise carbon and/or hydrogen.

Aspect 16: The method of Aspect 15, wherein when one or more impurities comprise carbon, carbon is present in an amount from about $10^{15}$ to about $10^{19}$/cm$^3$.

Aspect 17: The method of any one of Aspects 1-16, further comprising doping of the β-(Al$_x$Ga$_{1-x}$)$_2$O$_3$ thin film with one or more elements selected from Group IV.

Aspect 18: The method of Aspect 17, wherein the one or more elements comprises Si.

Aspect 19: The method of Aspect 18, wherein the β-(Al$_x$Ga$_{1-x}$)$_2$O$_3$ thin film comprises Si in an amount from about $10^{14}$ to less than about $10^{21}$/cm$^3$.

Aspect 20: The method of any one of Aspects 1-19, wherein the substrate is treated in O$_2$ atmosphere at a temperature from about 850° C. to about 1,000° C. prior to step a).

Aspect 21: The method of any one of Aspects 1-20, wherein the aluminum precursor comprises trimethylaluminum, triethylaluminium, or a combination thereof.

Aspect 22: The method of any one of Aspects 1-21, wherein the gallium precursor comprises triethylgallium, trimethylgallium, or a combination thereof.

Aspect 23: The method of any one of Aspects 1-22, wherein the chemical vapor deposition comprises a metalorganic vapor deposition, a hydride vapor phase epitaxy, a low-pressure chemical vapor deposition, or any combination thereof.

Aspect 24: A method of forming an Al—Ga containing semiconductor device comprising: forming a superlattice on a substrate, wherein the superlattice comprises a plurality of stacked groups of thin film layers, wherein each group of the plurality of stacked groups comprises a (100) β-(Al$_x$Ga$_{1-x}$)$_2$O$_3$ thin layer disposed on a (100) β-Ga$_2$O$_3$ thin film layer or a (−201) β-(Al$_x$Ga$_{1-x}$)$_2$O$_3$ thin layer disposed on a (−201) β-Ga$_2$O$_3$ thin film layer and wherein Al concentration in each group is the same or different and wherein x is 0.01≤x≤0.7; and wherein a first group of the plurality of stacked groups of the thin layers is formed by a sequential chemical vapor deposition on the substrate at predetermined conditions; and wherein each following group of the plurality of stacked groups is deposited by the chemical vapor deposition on the preceding group at the predetermined conditions.

Aspect 25: The method of Aspect 24, wherein the substrate is (100) β-Ga$_2$O$_3$ or (−201) β-Ga$_2$O$_3$ buffer layer, respectively.

Aspect 26: The method of Aspect 25, wherein the substrate is unintentionally doped.

Aspect 27: The method of any one of Aspects 24-26, wherein the (100) β-(Al$_x$Ga$_{1-x}$)$_2$O$_3$ thin layer or (−201) β-(Al$_x$Ga$_{1-x}$)$_2$O$_3$ thin film layer is a barrier layer.

Aspect 28: The method of any one of Aspects 24-27, wherein the (100) β-Ga$_2$O$_3$ thin film layer or (−201) β-Ga$_2$O$_3$ thin film layer is a well layer.

Aspect 29: The method of any one of Aspects 24-28, wherein the (100) β-(Al$_x$Ga$_{1-x}$)$_2$O$_3$ thin film layer or (−201) β-(Al$_x$Ga$_{1-x}$)$_2$O$_3$ thin film layer present in each group has a thickness from greater than 0 nm and to about 30 nm.

Aspect 30: The method of any one of Aspects 24-29, wherein the (100) β-Ga$_2$O$_3$ thin film layer or (−201) β-Ga$_2$O$_3$ thin film layer present in each group has a thickness from greater than 0 nm and to about 30 nm.

Aspect 31: The method of any one of Aspects 24-30, wherein the predetermined conditions comprise a vapor atmosphere comprising an aluminum and/or gallium precursor, a temperature from about 750° C. to about 1,000° C., and a pressure from about 1 torr to about 600 torr.

Aspect 32: The method of Aspect 31, wherein the vapor atmosphere further comprises an oxygen precursor.

Aspect 33: The method of any one of Aspects 31-32, wherein the predetermined conditions comprise a growth rate from about 1 nm/min to about 15 nm/min.

Aspect 34: The method of any one of Aspects 31-33, wherein when both the aluminum and gallium precursor are present, a molar flow rate of the aluminum precursor is from about 2% to about 50% based on a total molar flow rate of aluminum and gallium precursors.

Aspect 35: The method of any one of Aspects 24-34, wherein the (100) β-(Al$_x$Ga$_{1-x}$)$_2$O$_3$ thin film or (−201) β-(Al$_x$Ga$_{1-x}$)$_2$O$_3$ thin film is substantially free of 2D island growth modes.

Aspect 36: The method of any one of Aspects 24-35, wherein the (100) β-(Al$_x$Ga$_{1-x}$)$_2$O$_3$ thin film or (−201) β-(Al$_x$Ga$_{1-x}$)$_2$O$_3$ thin film is formed by a step-flow growth.

Aspect 37: The method of any one of Aspects 24-36, wherein the (100) β-(Al$_x$Ga$_{1-x}$)$_2$O$_3$ thin film or (−201) β-(Al$_x$Ga$_{1-x}$)$_2$O$_3$ thin film layer comprises a substantially uniform Al composition distribution throughout a thin film thickness.

Aspect 38: The method of any one of Aspects 24-37, wherein the (100) β-(Al$_x$Ga$_{1-x}$)$_2$O$_3$ thin film layer or (−201) β-(Al$_x$Ga$_{1-x}$)$_2$O$_3$ thin film layer is a single phase (100) or (−201) film, respectively.

Aspect 39: The method of any one of Aspects 24-38, wherein the (100) β-(Al$_x$Ga$_{1-x}$)$_2$O$_3$ thin film layer or (−201) β-(Al$_x$Ga$_{1-x}$)$_2$O$_3$ thin film layer exhibits an RMS roughness of from about 0.5 nm to about 15 nm.

Aspect 40: The method of any one of Aspects 24-39, wherein when 0.3≤x≤0.67, the (100) β-(Al$_x$Ga$_{1-x}$)$_2$O$_3$ thin film layer or (−201) β-(Al$_x$Ga$_{1-x}$)$_2$O$_3$ thin film layer exhibits an RMS roughness of less than about 1.5 nm.

Aspect 41: The method of any one of Aspects 24-40 wherein the (100) β-(Al$_x$Ga$_{1-x}$)$_2$O$_3$ thin film layer or (−201) β-(Al$_x$Ga$_{1-x}$)$_2$O$_3$ thin film layer comprises one or more impurities.

Aspect 42: The method of Aspect 41, wherein the one or more impurities comprise carbon and/or hydrogen.

Aspect 43: The method of Aspect 42, wherein when one or more impurities comprise carbon, carbon is present in an amount from about 10$^{15}$ to about 10$^{19}$/cm$^3$.

Aspect 44: The method of any one of Aspects 24-43, further comprising doping of the (100) β-(Al$_x$Ga$_{1-x}$)$_2$O$_3$ thin film or (−201) β-(Al$_x$Ga$_{1-x}$)$_2$O$_3$ thin film with one or more elements selected from Group IV.

Aspect 45: The method of Aspect 24, wherein the one or more elements comprises Si.

Aspect 46: The method of Aspect 25, wherein the (100) β-(Al$_x$Ga$_{1-x}$)$_2$O$_3$ thin film or (−201) β-(Al$_x$Ga$_{1-x}$)$_2$O$_3$ thin film comprises Si in an amount from about 10$^{14}$ to less than about 10$^{21}$/cm$^3$.

Aspect 47: The method of any one of Aspects 31-46, wherein the aluminum precursor comprises trimethylaluminum, triethylaluminium, or a combination thereof.

Aspect 48: The method of any one of Aspects 31-47, wherein the gallium precursor comprises triethylgallium, trimethylgallium, or a combination thereof.

Aspect 49: A thin film formed by the methods of any one of Aspects 1-25.

Aspect 50: A device comprising the thin film of Aspect 49.

Aspect 51: A superlattice formed by the methods of any one of Aspects 26-48.

Aspect 52: A device comprising the superlattice of Aspect 51.

Aspect 53: A thin film comprising (100) β-(Al$_x$Ga$_{1-x}$)$_2$O$_3$ or (−201) β-(Al$_x$Ga$_{1-x}$)$_2$O$_3$ wherein x is 0.0.1≤x≤0.7, and wherein the film comprises at least one impurity selected from hydrogen or carbon.

Aspect 54: The thin film of Aspect 53, wherein carbon is present in an amount from about 10$^{15}$ to about 10$^{19}$/cm$^3$.

Aspect 55: The thin film of any one of Aspects 53-54, wherein the (100) β-(Al$_x$Ga$_{1-x}$)$_2$O$_3$ thin film or (−201) β-(Al$_x$Ga$_{1-x}$)$_2$O$_3$ thin film is substantially free of 2D island growth modes.

Aspect 56: The thin film of any one of Aspects 53-55, wherein the (100) β-(Al$_x$Ga$_{1-x}$)$_2$O$_3$ thin film or (−201) β-(Al$_x$Ga$_{1-x}$)$_2$O$_3$ thin film comprises a substantially uniform Al composition distribution throughout a thin film thickness.

Aspect 57: The thin film of any one of Aspects 53-56, wherein the (100) β-(Al$_x$Ga$_{1-x}$)$_2$O$_3$ thin film or (−201) β-(Al$_x$Ga$_{1-x}$)$_2$O$_3$ thin film is a single phase (100) or (−201) film, respectively.

Aspect 58: The thin film of any one of Aspects 53-58, wherein the (100) β-(Al$_x$Ga$_{1-x}$)$_2$O$_3$ thin film or (−201) β-(Al$_x$Ga$_{1-x}$)$_2$O$_3$ thin film exhibits an RMS roughness of less than about 1.5 nm.

Aspect 59: The thin film of any one of Aspects 53-58, wherein the (100) β-(Al$_x$Ga$_{1-x}$)$_2$O$_3$ thin film or (−201) β-(Al$_x$Ga$_{1-x}$)$_2$O$_3$ thin film further comprises one or more elements selected from Group IV.

Aspect 60: The thin film of Aspect 59, wherein the one or more elements comprises Si.

Aspect 61: The thin film of Aspect 60, wherein the (100) β-(Al$_x$Ga$_{1-x}$)$_2$O$_3$ thin film or (−201) β-(Al$_x$Ga$_{1-x}$)$_2$O$_3$ thin film comprises Si in an amount from about 10$^{14}$ to less than about 10$^{21}$/cm$^3$.

Aspect 62: A device comprising a thin film of any one of Aspects 53-61.

Aspect 63: A device comprising: a) a substrate comprising (100) β-Ga$_2$O$_3$ or (−201) β-Ga$_2$O$_3$; and b) at least one layer comprising a (100) β-(Al$_x$Ga$_{1-x}$)$_2$O$_3$ thin film or a (−201) β-(Al$_x$Ga$_{1-x}$)$_2$O$_3$, wherein x is 0.01≤x≤0.7, and wherein the film comprises at least one impurity selected from hydrogen or carbon.

Aspect 64: The device of Aspect 63, wherein carbon is present in an amount from about 10$^{15}$ to about 10$^{19}$/cm$^3$.

Aspect 65: The device of any one of Aspects 63-64, further comprising at least one additional layer comprising a (100) β-(Al$_y$Ga$_{1-y}$)$_2$O$_3$ thin film or a (−201) β-(Al$_y$Ga$_{1-y}$)$_2$O$_3$, wherein y is 0.01≤y≤0.7.

Aspect 66: The device of Aspect 65, wherein the (100) β-(Al$_y$Ga$_{1-y}$)$_2$O$_3$ thin film or a (−201) β-(Al$_y$Ga$_{1-y}$)$_2$O$_3$ comprises carbon in an amount from about $10^{15}$ to about $10^{19}$/cm$^3$.

Aspect 67: The device of any one of Aspects 63-66, wherein the (100) β-(Al$_x$Ga$_{1-x}$)$_2$O$_3$ thin film, (−201) β-(Al$_x$Ga$_{1-x}$)$_2$O$_3$ thin film, 100) β-(Al$_y$Ga$_{1-y}$)$_2$O$_3$ thin film or a (−201) β-(Al$_y$Ga$_{1-y}$)$_2$O$_3$ thin film are substantially free of 2D island growth modes.

Aspect 68: The device of any one of Aspects 63-67, wherein the (100) β-(Al$_x$Ga$_{1-x}$)$_2$O$_3$ thin film, (−201) β-(Al$_x$Ga$_{1-x}$)$_2$O$_3$ thin film, 100) β-(Al$_y$Ga$_{1-y}$)$_2$O$_3$ thin film or a (−201) β-(Al$_y$Ga$_{1-y}$)$_2$O$_3$ thin film comprise a substantially uniform Al composition distribution throughout a thin film thickness.

Aspect 69: The device of any one of Aspects 63-68, wherein the (100) β-(Al$_x$Ga$_{1-x}$)$_2$O$_3$ thin film, (−201) β-(Al$_x$Ga$_{1-x}$)$_2$O$_3$ thin film, (100) β-(Al$_y$Ga$_{1-y}$)$_2$O$_3$ thin film or a (−201) β-(Al$_y$Ga$_{1-y}$)$_2$O$_3$ thin film are a single-phase (100) film.

Aspect 70: The device of any one of Aspects 63-69, wherein the (100) β-(Al$_x$Ga$_{1-x}$)$_2$O$_3$ thin film or (−201) β-(Al$_x$Ga$_{1-x}$)$_2$O$_3$ thin film exhibits an RMS roughness of less than about 1.5 nm.

Aspect 71: The device of any one of Aspects 63-70, wherein (100) β-(Al$_y$Ga$_{1-y}$)$_2$O$_3$ thin film or a (−201) β-(Al$_y$Ga$_{1-y}$)$_2$O$_3$ thin film exhibits an RMS roughness 0.5 nm to about 15 nm.

Aspect 72: The device of any one of Aspects 63-71, wherein the (100) β-(Al$_x$Ga$_{1-x}$)$_2$O$_3$ thin film, (−201) β-(Al$_x$Ga$_{1-x}$)$_2$O$_3$ thin film, 100) β-(Al$_y$Ga$_{1-y}$)$_2$O$_3$ thin film or a (−201) β-(Al$_y$Ga$_{1-y}$)$_2$O$_3$ thin film further comprise one or more elements selected from Group IV.

Aspect 73: The device of Aspect 72, wherein the one or more elements comprises Si.

Aspect 74: The device of Aspect 73, wherein the (100) β-(Al$_x$Ga$_{1-x}$)$_2$O$_3$ thin film, (−201) β-(Al$_x$Ga$_{1-x}$)$_2$O$_3$ thin film, (100) β-(Al$_y$Ga$_{1-y}$)$_2$O$_3$ thin film, or a (−201) β-(Al$_y$Ga$_{1-y}$)$_2$O$_3$ thin film comprise Si in an amount from about $10^{14}$ to less than about $10^{21}$/cm$^3$.

Aspect 75: The device of any one of Aspects 63-74, further comprising a (100) β-Ga$_2$O$_3$ thin film layer or (−201) β-Ga$_2$O$_3$ thin film layer disposed on the (100) β-(Al$_x$Ga$_{1-x}$)$_2$O$_3$ thin film or (−201) β-(Al$_x$Ga$_{1-x}$)$_2$O$_3$ thin film layers.

REFERENCES

1. M. Higashiwaki and G. H. Jessen, Appl. Phys. Lett. 112, 060401 (2018).
2. N. Ma, N. Tanen, A. Verma, Z. Guo, T. Luo, H. Xing, and D. Jena, Appl. Phys. Lett. 109(21), 212101 (2016).
3. A. Kuramata, K. Koshi, S. Watanabe, Y. Yamaoka, T. Masui, and S. Yamakoshi, Jpn. J. Appl. Phys., Part 1 55, 1202A2 (2016).
4. Z. Feng, A. F. M. Anhar Uddin Bhuiyan, M. R. Karim, and H. Zhao, Appl. Phys. Lett. 114, 250601 (2019).
5. F. Alema, Y. Zhang, A. Osinsky, N. Valente, A. Mauze, T. Itoh, and J. S. Speck, APL Mater. 7, 121110 (2019).
6. M. Baldini, M. Albrecht, A. Fiedler, K. Irmscher, R. Schewski, and G. Wagner, ECS J. Solid State Sci. Technol. 6, Q3040 (2017).
7. S. Rafique, L. Han, M. J. Tadjer, J. A. Freitas, Jr., N. A. Mahadik, and H. Zhao, Appl. Phys. Lett. 108, 182105 (2016).
8. H. Okumura, M. Kita, K. Sasaki, A. Kuramata, M. Higashiwaki, and J. S. Speck, Appl. Phys. Express 7, 095501 (2014).
9. Z. Feng, A. F. M. Anhar Uddin Bhuiyan, Z. Xia, W. Moore, Z. Chen, J. F. McGlone, D. R. Daughton, A. R. Arehart, S. A. Ringel, S. Rajan, H. Zhao, Phys. Status Solidi RPL, (2020). https://doi.org/10.1002/pssr.202000145
10. M. Higashiwaki, K. Sasaki, A. Kuramata, T. Masui, and S. Yamakoshi, Appl. Phys. Lett. 100, 013504 (2012).
11. M. Higashiwaki, K. Sasaki, T. Kamimura, M. H. Wong, D. Krishnamurthy, A. Kuramata, T. Masui, and S. Yamakoshi, Appl. Phys. Lett. 103, 123511 (2013).
12. Z. Xia, H. Xue, C. Joishi, J. McGlone, N. K. Kalarickal, S. H. Sohel, M. Brenner, A. Arehart, S. Ringel, S. Lodha, W. Lu, and S. Rajan, IEEE Electron Device Lett. 40, 1052 (2019).
13. J. Green, K. D. Chabak, E. R. Heller, R. C. Fitch, Jr., M. Baldini, A. Fiedler, K. Irmscher, G. Wagner, Z. Galazka, S. E. Tetlak, A. Crespo, K. Leedy, and G. H. Jessen, IEEE Electron Device Lett. 37, 902 (2016).
14. M. H. Wong, K. Goto, H. Murakami, Y. Kumagai, and M. Higashiwaki, IEEE Electron Device Lett. 40, 431 (2019).
15. Z. Hu, K. Nomoto, W. Li, N. Tanen, K. Sasaki, A. Kuramata, T. Nakamura, D. Jena, and H. G. Xing, IEEE Electron Device Lett. 39, 869 (2018).
16. K. Konishi, K. Goto, H. Murakami, Y. Kumagai, A. Kuramata, S. Yamakoshi, and M. Higashiwaki, Appl. Phys. Lett. 110, 103506 (2017).
17. W. Li, K. Nomoto, Z. Hu, D. Jena, and H. G. Xing, IEEE Electron Device Lett. 41, 107 (2020).
18. C. Joishi, S. Rafique, Z. Xia, L. Han, S. Krishnamoorthy, Y. Zhang, S. Lodha, H. Zhao, and S. Rajan, Appl. Phys. Express 11, 031101 (2018).
19. T. Oshima, T. Okuno, N. Arai, N. Suzuki, S. Ohira, and S. Fujita, Appl. Phys. Express 1, 011202 (2008).
20. A. Mauze, Y. Zhang, T. Itoh, F. Wu, and J. S. Speck, APL Mater. 8, 021104 (2020).
21. P. Mazzolini, A. Falkenstein, C. Wouters, R. Schewski, T. Markurt, Z. Galazka, M. Martin, M. Albrecht, and O. Bierwagen, APL Mater. 8, 011107 (2020).
22. T. S. Ngo, D. D. Le, J. Lee, S.-K. Hong, J.-S. Ha, W.-S. Lee, and Y.-B. Moon, J. Alloys Compd. 834, 155027 (2020).
23. R. Schewski, M. Baldini, K. Irmscher, A. Fiedler, T. Markurt, B. Neuschulz, T. Remmele, T. Schulz, G. Wagner, Z. Galazka, M. Albrecht, J. Appl. Phys. 120, 225308 (2016).
24. R. Schewski, K. Lion, A. Fiedler, C. Wouters, A. Popp, S. V. Levchenko, T. Schulz, M. Schmidbauer, S. Bin Anooz, R. Gruneberg, Z. Galazka, G. Wagner, K. Irmscher, M. Scheffler, C. Draxl, and M. Albrecht, APL Mater. 7, 022515 (2019).
25. S. Rafique, M. R. Karim, J. M. Johnson, J. Hwang, H. Zhao, Appl. Phys. Lett. 112, 052104 (2018).
26. H. Peelaers, J. B. Varley, J. S. Speck, and C. G. Van de Walle, Appl. Phys. Lett. 112, 242101 (2018).
27. S. Krishnamoorthy, Z. Xia, C. Joishi, Y. Zhang, J. McGlone, J. Johnson, M. Brenner, A. R. Arehart, J. Hwang, S. Lodha, and S. Rajan, Appl. Phys. Lett. 111, 023502 (2017).
28. Y. Zhang, A. Neal, Z. Xia, C. Joishi, J. M. Johnson, Y. Zheng, S. Bajaj, M. Brenner, D. Dorsey, K. Chabak, G. Jessen, J. Hwang, S. Mou, J. P. Heremans, and S. Rajan, Appl. Phys. Lett. 112, 173502 (2018).

29. K. Ghosh and U. Singisetti, J. Mater. Res. 32, 4142 (2017).
30. V. G. Hill, R. Roy, and E. F. Osborn, J. Am. Ceram. Soc. 35, 135 (1952).
31. A. F. M. A. U. Bhuiyan, Z. Feng, J. M. Johnson, H.-L. Huang, J. Sarker, M. Zhu, M. R. Karim, B. Mazumder, J. Hwang, and H. Zhao, APL Mater. 8, 031104 (2020).
32. P. Ranga, A. Rishinaramangalam, J. Varley, A. Bhattacharyya, D. Feezell, and S. Krishnamoorthy, Appl. Phys. Express 12, 111004 (2019).
33. A. F. M. A. U. Bhuiyan, Z. Feng, J. M. Johnson, Z. Chen, H.-L. Huang, J. Hwang, and H. Zhao, Appl. Phys. Lett. 115, 120602 (2019).
34. P. Vogt, A. Mauze, F. Wu, B. Bonef, and J. S. Speck, Appl. Phys. Express 11, 115503 (2018).
35. R. Wakabayashi, M. Hattori, K. Yoshimatsu, K. Horiba, H. Kumigashira, and A. Ohtomo, Appl. Phys. Lett. 112, 232103 (2018).
36. T. Oshima, T. Okuno, N. Arai, Y. Kobayashi, and S. Fujita, Jpn. J. Appl. Phys., Part 1 48, 070202 (2009).
37. Y. Oshima, E. Ahmadi, S. C. Badescu, F. Wu, and J. S. Speck, Appl. Phys. Express 9, 061102 (2016).
38. K. Kaneko, K. Suzuki, Y. Ito, and S. Fujita, J. Cryst. Growth 436, 150 (2016).
39. M. T. Nichols, W. Li, D. Pei, G. A. Antonelli, Q. Lin, S. Banna, Y. Nishi, and J. L. Shohet, Appl. Phys. 115, 094105 (2014).
40. F. Zhang, K. Saito, T. Tanaka, M. Nishio, M. Arita, and Q. Guo, Appl. Phys. Lett. 105, 162107 (2014).
41. C. Fares, F. Ren, E. Lambers, D. C. Hays, B. P. Gila, and S. J. Pearton, J. Vac. Sci. Technol. 36, 061207 (2018).
42. M. A. Khan, M. Shatalov, H. P. Maruska, H. M. Wang and E. Kuokstis, Jpn. J. Appl. Phys., Vol. 44, 7191 (2005).
43. Y. R. Luo, Bond Dissociation Energies in CRC Handbook of Chemistry and Physics, 90th ed., edited by D. R. Lide (CRC Press/Taylor and Francis, Boca Raton, 2009).
44. A. Fiedlera, R. Schewski, M. Baldini, Z. Galazka, G. Wagner, M. Albrecht, and K. Irmscher, J. Appl. Phys. 122, 165701 (2017).
45. S. Gao, Y. Wu, R. Kanga, and H. Huang, Mater Sci Semicond Process 79, 165 (2018).
46. O. Ueda, N. Ikenaga, K. Koshi, K. Iizuka, A. Kuramata, K. Hanada, T. Moribayashi, S. Yamakoshi and M. Kasu, Jpn. J. Appl. Phys. 55 1202BD (2016).
47. T.-C. Wen and W.-I. Lee, Jpn. J. Appl. Phys., Part 1 40, 5302 (2001).
48. X. Chen, N. Lin, and D. Cai, J. Mater. Res. 28(5), 716 (2013).
49. S. J. Pearton, J. Yang, P. H. Cary IV, F. Ren, J. Kim, M. J. Tadjer and M. A. Mastro, Appl. Phys. Rev. 5, 011301 (2018).
50. J. B. Varley, A. Perron, V. Lordi, D. Wickramaratne, and J. L. Lyons, Appl. Phys. Lett. 116, 172104 (2020).
51. K. D. Chabak, K. D Leedy, A. J. Green, S. Mou, A. T. Neal, T. Asel, E. R. Heller, N. S. Hendricks, K. Liddy, A. Crespo, N. C. Miller, M. T. Lindquist, N. A. Moser, R. C. Fitch Jr, D. E. Walker Jr, D. L. Dorsey and G. H. Jessen, Semicond. Sci. Technol. 35, 013002 (2020).

What is claimed is:

1. A method of forming an Al-Ga containing film comprising:
a) exposing a substrate comprising a β-Ga$_2$O$_3$, wherein the substrate has a (100) or (−201) orientation to a vapor phase comprising an aluminum precursor, a gallium precursor, and/or oxygen precursor; wherein a molar flow rate of the aluminum precursor is from about 2% to about 50% based on a total molar flow rate of aluminum and gallium precursors; and
b) forming a single phase (100) or (−201) β-(Al$_x$Ga$_{1-x}$)$_2$O$_3$ thin film by a chemical vapor deposition at predetermined conditions, wherein x is 0.28≤x≤0.7; and wherein the β-(Al$_x$Ga$_{1-x}$)$_2$O$_3$ thin film is an epitaxial film.

2. The method of claim 1, wherein the predetermined conditions comprise a temperature from about 750° C. to about 1,000° C.

3. The method of claim 1, wherein the predetermined conditions comprise a pressure from about 1 torr to about 600 torr.

4. The method of claim 1, wherein the predetermined conditions comprise a growth rate from about 2 nm/min to about 15 nm/min.

5. The method claim 1, wherein the single phase (100) or (−201) β-(Al$_x$Ga$_{1-x}$)$_2$O$_3$ thin film comprises a substantially uniform Al composition distribution throughout a thin film thickness.

6. The method of claim 1, wherein the single phase (100) or (−201) β-(Al$_x$Ga$_{1-x}$)$_2$O$_3$ thin film exhibits an RMS roughness of about 0.5 nm to less than about 15 nm, and wherein the RMS roughness decreases with an increase in x.

7. The method of claim 1, wherein the single phase (100) or (−201) β-(Al$_x$Ga$_{1-x}$)$_2$O$_3$ thin film comprises one or more impurities comprising carbon in an amount from about $10^{15}$ to about $10^{19}$/cm$^3$ and/or hydrogen.

8. The method of claim 1, further comprising doping the single phase (100) or (−201) β-(Al$_x$Ga$_{1-x}$)$_2$O$_3$ thin film with one or more elements selected from Group IV.

9. The method of claim 8, wherein the one or more elements comprises Si in an amount from about $10^{14}$ to less than about $10^{21}$/cm$^3$.

10. The method of claim 1, wherein the aluminum precursor comprises trimethylaluminum, triethylaluminium, or a combination thereof; and/or the gallium precursor comprises triethylgallium, trimethylgallium, or a combination thereof.

11. The method of claim 1, wherein the chemical vapor deposition comprises a metalorganic vapor deposition, a hydride vapor phase epitaxy, a low-pressure chemical vapor deposition, or any combination thereof.

12. A method of forming an Al—Ga containing semiconductor device comprising:
forming a superlattice on a substrate, wherein the superlattice comprises a plurality of stacked groups of thin film layers,
wherein each group of the plurality of stacked groups comprises a (100) single phase β-(Al$_x$Ga$_{1-x}$)$_2$O$_3$ thin layer disposed on a (100) β-Ga$_2$O$_3$ thin film layer or a (−201) single phase β-(Al$_x$Ga$_{1-x}$)$_2$O$_3$ thin layer disposed on a (−201) β-Ga$_2$O$_3$ thin film layer and wherein Al concentration in each group is the same or different and wherein x is 0.28≤x≤0.7;
wherein the (100) single phase β-(Al$_x$Ga$_{1-x}$)$_2$O$_3$ thin film layer or (−201) single phase β-(Al$_x$Ga$_{1-x}$)$_2$O$_3$ thin film layer present in each group has a thickness from greater than 0 nm and to about 30 nm;
wherein the (100) β-Ga$_2$O$_3$ thin film layer or (−201) β-Ga$_2$O$_3$ thin film layer present in each group has a thickness from greater than 0 nm and to about 30 nm; and
wherein a first group of the plurality of stacked groups of the thin layers is formed by a sequential chemical vapor deposition on the substrate at predetermined conditions; and wherein each following group of the plurality of stacked groups is deposited by a chemical vapor deposition on the preceding group at the predetermined conditions.

13. The method of claim 12, wherein the substrate is (100) β-$Ga_2O_3$ or (−201) β-$Ga_2O_3$ buffer layer, respectively.

14. The method of claim 12, wherein the (100) single phase β-$(Al_xGa_{1-x})_2O_3$ thin layer or (−201) single phase β-$(Al_xGa_{1-x})_2O_3$ thin film layer, respectively, is a barrier layer and wherein the (100) β-$Ga_2O_3$ thin film layer or (−201) β-$Ga_2O_3$ thin film layer, respectively, is a well layer.

15. The method of claim 12, wherein the predetermined conditions comprise a vapor atmosphere comprising an aluminum, gallium precursor and/or oxygen precursor, a temperature from about 750° C. to about 1,000° C., and a pressure from about 1 torr to about 600 torr, and wherein the predetermined conditions comprise a growth rate from about 1 nm/min to about 15 nm/min.

16. The method of claim 15, wherein when both the aluminum and gallium precursor are present, a molar flow rate of the aluminum precursor is from about 2% to about 50% based on a total molar flow rate of aluminum and gallium precursors; wherein the aluminum precursor comprises trimethylaluminum, triethylaluminium, or a combination thereof and wherein the gallium precursor comprises triethylgallium, trimethylgallium, or a combination thereof.

17. The method of claim 12, wherein the (100) single phase β-$(Al_xGa_{1-x})_2O_3$ thin film or (−201) single phase β-$(Al_xGa_{1-x})_2O_3$ thin film layer comprises a substantially uniform Al composition distribution throughout a thin film thickness and wherein (100) single phase β-$(Al_xGa_{1-x})_2O_3$ thin film layer or (−201) single phase β-$(Al_xGa_{1-x})_2O_3$ thin film layer is a single phase (100) or (−201) film, respectively.

18. The method of claim 12, wherein the (100) single phase β-$(Al_xGa_{1-x})_2O_3$ thin film layer or (−201) single phase β-$(Al_xGa_{1-x})_2O_3$ thin film layer exhibits an RMS roughness of from about 0.5 nm to about 15 nm, and wherein the RMS roughness decreases with an increase in x.

19. The method of claim 12, wherein the (100) single phase β-$(Al_xGa_{1-x})_2O_3$ thin film layer or (−201) single phase β-$(Al_xGa_{1-x})_2O_3$ thin film layer comprises one or more impurities comprising carbon present in an amount from about $10^{15}$ to about $10^{19}$/cm$^3$ and/or hydrogen.

20. The method of claim 12, further comprising doping the (100) single phase β-$(Al_xGa_{1-x})_2O_3$ thin film or (−201) single phase β-$(Al_xGa_{1-x})_2O_3$ thin film with one or more elements selected from Group IV.

21. The method of claim 20, wherein the one or more elements comprises Si in an amount from about $10^{14}$ to less than about $10^{21}$/cm$^3$.

* * * * *

UNITED STATES PATENT AND TRADEMARK OFFICE
CERTIFICATE OF CORRECTION

PATENT NO.         : 11,624,126 B2
APPLICATION NO.    : 17/231382
DATED              : April 11, 2023
INVENTOR(S)        : Hongping Zhao et al.

It is certified that error appears in the above-identified patent and that said Letters Patent is hereby corrected as shown below:

On the Title Page

Item (54), delete "DEPOSITION OF SINGLE PHASE BETA-(ALXGA1-X)2O3 THIN FILMS WITH 0.28< =X<=0.7 ON BETA GA2O3(100) OR (–201) SUBSTRATES BY CHEMICAL VAPOR DEPOSITION" and insert -- DEPOSITION OF SINGLE PHASE BETA-$(Al_xGa_{1-x})_2O_3$ THIN FILMS WITH $0.28 \leq x \leq 0.7$ ON BETA $Ga_2O_3$(100) OR (–201) SUBSTRATES BY CHEMICAL VAPOR DEPOSITION --.

In the Specification

In Column 1, Lines 1-5, delete "DEPOSITION OF SINGLE PHASE BETA-(ALXGA1-X)2O3 THIN FILMS WITH 0.28< =X<=0.7 ON BETA GA2O3(100) OR (–201) SUBSTRATES BY CHEMICAL VAPOR DEPOSITION" and insert -- DEPOSITION OF SINGLE PHASE BETA-$(Al_xGa_{1-x})_2O_3$ THIN FILMS WITH $0.28 \leq x \leq 0.7$ ON BETA $Ga_2O_3$(100) OR (–201) SUBSTRATES BY CHEMICAL VAPOR DEPOSITION --.

In the Claims

In Claim 5, Column 38, Line 17, delete "method" and insert -- method of --.

Signed and Sealed this
Twenty-fourth Day of October, 2023

Katherine Kelly Vidal
*Director of the United States Patent and Trademark Office*